United States Patent
Oshima et al.

(10) Patent No.: US 10,377,163 B2
(45) Date of Patent: Aug. 13, 2019

(54) PLANOGRAPHIC PRINTING PLATE PRECURSOR, LAMINATE THEREOF, AND METHOD OF PRODUCING PLANOGRAPHIC PRINTING PLATE PRECURSOR

(71) Applicant: FUJIFILM Corporation, Tokyo (JP)

(72) Inventors: Atsushi Oshima, Haibara-gun (JP); Yusuke Ikeyama, Haibara-gun (JP); Shunpei Watanabe, Haibara-gun (JP); Nobuyuki Sone, Haibara-gun (JP); Shuji Shimanaka, Haibara-gun (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 0 days.

(21) Appl. No.: 16/144,043

(22) Filed: Sep. 27, 2018

(65) Prior Publication Data

US 2019/0023052 A1    Jan. 24, 2019

Related U.S. Application Data

(63) Continuation of application No. PCT/JP2017/012374, filed on Mar. 27, 2017.

(30) Foreign Application Priority Data

Mar. 30, 2016 (JP) ................................. 2016-068200
May 31, 2016 (JP) ................................. 2016-108459

(51) Int. Cl.
*B41N 1/14* (2006.01)
*B41C 1/10* (2006.01)
(Continued)

(52) U.S. Cl.
CPC .................. *B41N 1/14* (2013.01); *B41C 1/10* (2013.01); *B41C 1/1016* (2013.01); *B41N 1/086* (2013.01);
(Continued)

(58) Field of Classification Search
None
See application file for complete search history.

(56) References Cited

U.S. PATENT DOCUMENTS

2003/0233955 A1    12/2003    Mori
2005/0058942 A1    3/2005    Maehashi
(Continued)

FOREIGN PATENT DOCUMENTS

EP    1 859 954 A1    11/2007
JP    2004-17303 A    1/2004
(Continued)

OTHER PUBLICATIONS

International Search Report dated Jun. 6, 2017 by the International Searching Authority in International Patent Application No. PCT/JP2017/012374.
(Continued)

*Primary Examiner* — Joshua D Zimmerman
(74) *Attorney, Agent, or Firm* — Sughrue Mion, PLLC

(57) ABSTRACT

Provided are a planographic printing plate precursor, a laminate thereof, and a method of producing a planographic printing plate precursor capable of satisfying all purposes for eliminating interleaving paper used for preventing scraping and peeling, preventing adhesion, imparting a plate-separating property for preventing multiple-plate feeding, and preventing scratches. The planographic printing plate precursor which includes a polymer layer on a surface of a belt-like support 12 includes a back coat layer 70 having an arithmetic average surface roughness Ra of 0.5 μm or greater due to a surface roughness structure in which thin film portions 60 and thick film portions 62 are continuously formed on a rear surface of the belt-like support 12.

24 Claims, 26 Drawing Sheets

(51) Int. Cl.
*B41N 3/00* (2006.01)
*G03F 7/00* (2006.01)
*B41N 1/08* (2006.01)

(52) U.S. Cl.
CPC ............ *G03F 7/00* (2013.01); *B41C 2201/06* (2013.01); *B41N 1/083* (2013.01); *B41N 3/00* (2013.01)

(56) References Cited

U.S. PATENT DOCUMENTS

| | | |
|---|---|---|
| 2007/0026344 A1 | 2/2007 | Watanabe |
| 2007/0077518 A1 | 4/2007 | Kawauchi |
| 2011/0287365 A1 | 11/2011 | Piestert et al. |
| 2013/0052582 A1 | 2/2013 | Hayashi |

FOREIGN PATENT DOCUMENTS

| | | |
|---|---|---|
| JP | 2005-081800 A | 3/2005 |
| JP | 2007-122003 A | 5/2007 |
| JP | 2007-148040 A | 6/2007 |
| JP | 2007-168245 A | 7/2007 |
| JP | 2008-015503 A | 1/2008 |
| JP | 2008-064778 A | 3/2008 |
| JP | 2008-249851 A | 10/2008 |
| WO | 2013/032776 A1 | 3/2013 |
| WO | 2014/202519 A1 | 12/2014 |

OTHER PUBLICATIONS

Written Opinion dated Jun. 6, 2017 by the International Searching Authority in International Patent Application No. PCT/JP2017/012374.

International Preliminary Report on Patentability with translation of Written Opinion dated Oct. 2, 2018, from the International Bureau in counterpart International Application No. PCT/JP2017/012374.

Extended European Search Report dated Mar. 8, 2019 issued by the European Patent Office in counterpart European Application No. 17774928.0.

FIG. 18A

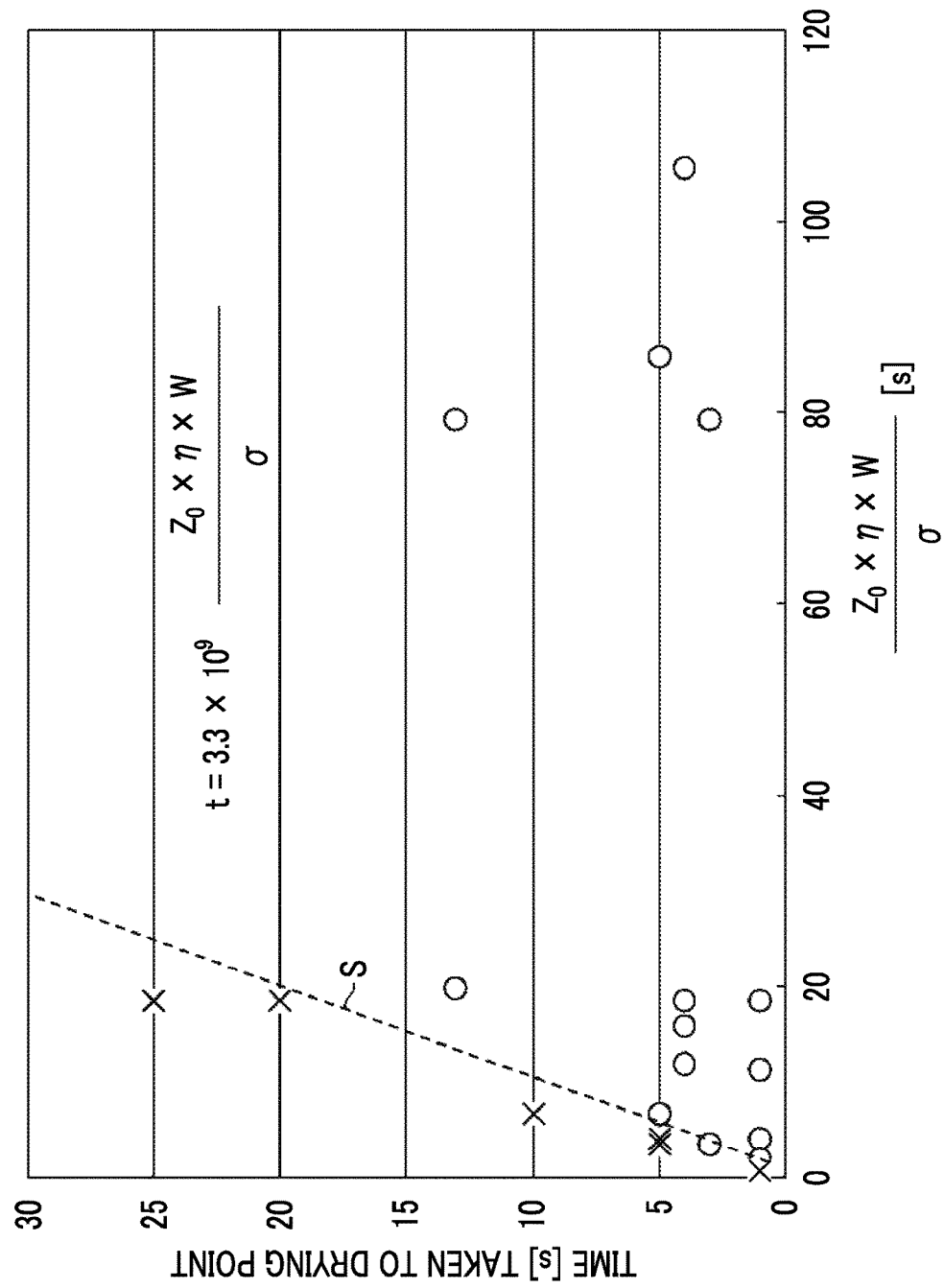

FIG. 23

| | TEST No. | SHAPE OF COATED FILM | STATE OF COATED FILM | DAMAGE TO PLATE |
|---|---|---|---|---|
| EXAMPLE | 23 | STRIPE | ENTIRE SURFACE IS COATED AND DIFFERENCE IN UNEVENNESS IS PARTIALLY FOUND | A |
| COMPARATIVE EXAMPLE | 9 | STRIPE | UNCOATED PORTIONS ARE PARTIALLY FOUND | B |
| COMPARATIVE EXAMPLE | 10 | DOT | UNCOATED PORTIONS ARE PARTIALLY FOUND | B |
| COMPARATIVE EXAMPLE | 11 | STRIPE | SUCTIONING IS PERFORMED AFTER COATING TO FORM PARTIALLY UNCOATED PORTIONS | B |

FIG. 24

| | TEST No. | THICK FILM PORTION AREA RATIO (%) | THICK FILM PORTION WIDTH | DISTANCE BETWEEN THICK FILM PORTIONS | SCRATCHES ON PLATE | HORN | ADSORPTION OF PLATE | ANOTHER EVALUATION |
|---|---|---|---|---|---|---|---|---|
| EXAMPLE | 24 | 75 | 1.5 | 2 | A | A | A | A |
| EXAMPLE | 25 | 5 | 0.25 | 5 | A | A | A | B, SMALL AMOUNT OF STAIN IS PARTIALLY FOUND ON SURFACE OF PLATE |
| EXAMPLE | 26 | 90 | 10 | 11 | A | A | B, SLIGHTLY ADHESIVE | A |
| EXAMPLE | 27 | 50 | 0.25 | 0.5 | A | A | A | A |
| EXAMPLE | 28 | 10 | 3 | 30 | A | A | A | B, SMALL AMOUNT OF STAIN IS PARTIALLY FOUND ON SURFACE OF PLATE |
| EXAMPLE | 29 | 95 | 4.75 | 5 | A | A | B, ADHESIVE | A |
| EXAMPLE | 30 | 3 | 0.3 | 10 | A | A | A | B, SMALL AMOUNT OF STAIN IS FOUND ON SURFACE OF PLATE |
| EXAMPLE | 31 | 50 | 15 | 30 | A | A | B, DEVIATED FROM LOWER PLATE IN SOME CASES | A |
| EXAMPLE | 32 | 40 | 0.2 | 0.5 | A | A | A | B, SMALL AMOUNT OF STAIN IS FOUND ON SURFACE OF PLATE |
| EXAMPLE | 33 | 75 | 0.3 | 0.4 | A | A | B, ADHESIVE | A |
| EXAMPLE | 34 | 10 | 5 | 50 | A | A | A | B, SMALL AMOUNT OF STAIN IS FOUND ON SURFACE OF PLATE |

FIG. 25

| EXAMPLE | SUPPORT | BACK COAT LAYER ON REAR SURFACE | | | | | PHYSICAL PROPERTY | | EVALUATION RESULT | | | |
|---|---|---|---|---|---|---|---|---|---|---|---|---|
| | | POLYMER LAYER ON SURFACE (TYPE) | TYPE OF RESIN | CONTINUITY OR DISCONTINUITY OF LAYER | SHAPE OF SURFACE ROUGHNESS STRUCTURE | MATTING AGENT (ADDITION OF PARTICLES) | Sa (μm) | BEKK SECOND (SEC) | SCRAPING AND PEELING | ADHESIVENESS | SCRATCHES | IMPARTING OF PLATE-SEPARATING PROPERTY |
| EXAMPLE 35 | ALUMINUM | UNTREATED | EPOXY RESIN | CONTINUOUS | STRIPE | — | 0.5 | 200 | 5 | 4 | 5 | 3 |
| EXAMPLE 36 | ALUMINUM | UNTREATED | EPOXY RESIN | CONTINUOUS | STRIPE | — | 1.5 | 31 | 5 | 5 | 5 | 5 |
| EXAMPLE 37 | ALUMINUM | UNTREATED | EPOXY RESIN | CONTINUOUS | STRIPE | — | 2.0 | 14 | 5 | 5 | 5 | 5 |
| EXAMPLE 38 | ALUMINUM | UNTREATED | EPOXY RESIN | CONTINUOUS | STRIPE | — | 4.0 | 7 | 5 | 5 | 5 | 5 |
| EXAMPLE 39 | ALUMINUM | UNTREATED | EPOXY RESIN | CONTINUOUS | STRIPE | — | 5.0 | 5 | 5 | 5 | 5 | 5 |
| EXAMPLE 40 | ALUMINUM | UNTREATED | EPOXY RESIN | CONTINUOUS | STRIPE | — | 6.1 | 4 | 5 | 5 | 4 | 5 |
| EXAMPLE 41 | ALUMINUM | UNTREATED | EPOXY RESIN | CONTINUOUS | STRIPE | — | 8.0 | 2 | 5 | 5 | 3 | 5 |
| EXAMPLE 42 | ALUMINUM | UNTREATED | EPOXY RESIN | CONTINUOUS | STRIPE | — | 24.0 | 2 | 3 | 4 | 3 | 4 |
| EXAMPLE 43 | ALUMINUM | UNTREATED | POLYVINYL ACETAL RESIN | CONTINUOUS | STRIPE | — | 1.5 | 61 | 5 | 5 | 5 | 5 |
| EXAMPLE 44 | ALUMINUM | UNTREATED | POLYVINYL ACETAL RESIN | CONTINUOUS | STRIPE | — | 4.5 | 24 | 5 | 5 | 5 | 4 |
| EXAMPLE 45 | ALUMINUM | UNTREATED | POLYVINYL ACETAL RESIN | CONTINUOUS | STRIPE | — | 6.0 | 10 | 5 | 5 | 4 | 5 |
| EXAMPLE 46 | ALUMINUM | UNTREATED | POLYESTER | CONTINUOUS | STRIPE | — | 1.5 | 48 | 5 | 3 | 4 | 4 |
| EXAMPLE 47 | ALUMINUM | UNTREATED | POLYESTER | CONTINUOUS | STRIPE | — | 4.5 | 19 | 5 | 3 | 4 | 5 |
| EXAMPLE 48 | ALUMINUM | UNTREATED | POLYESTER | CONTINUOUS | STRIPE | — | 6.0 | 7 | 5 | 3 | 4 | 5 |
| EXAMPLE 49 | ALUMINUM | NEGATIVE | EPOXY RESIN | CONTINUOUS | STRIPE | — | 4.5 | 7 | 5 | 5 | 5 | 5 |
| EXAMPLE 50 | ALUMINUM | POSITIVE | EPOXY RESIN | CONTINUOUS | STRIPE | — | 4.5 | 10 | 5 | 5 | 5 | 5 |
| EXAMPLE 51 | ALUMINUM | TREATED KEY PLATE | EPOXY RESIN | CONTINUOUS | STRIPE | — | 4.5 | 8 | 5 | 5 | 5 | 5 |
| EXAMPLE 52 | ALUMINUM | UNTREATED KEY PLATE | EPOXY RESIN | CONTINUOUS | STRIPE | — | 4.5 | 10 | 5 | 5 | 5 | 5 |
| EXAMPLE 53 | ALUMINUM | UNTREATED | EPOXY RESIN | CONTINUOUS | DASHED LINE | — | 5.0 | 5 | 5 | 5 | 4 | 5 |
| EXAMPLE 54 | ALUMINUM | UNTREATED | EPOXY RESIN | CONTINUOUS | DOT | — | 5.0 | 4 | 4 | 5 | 4 | 5 |
| EXAMPLE 55 | ALUMINUM | UNTREATED | ACRYLIC COPOLYMER | CONTINUOUS | IRREGULAR UNEVENNESS | — | 3.0 | 17 | 4 | 4 | 4 | 5 |
| COMPARATIVE EXAMPLE 12 | ALUMINUM | UNTREATED | — | CONTINUOUS | FLAT | — | 0.2 | 415 | 5 | 2 | 1 | 1 |
| COMPARATIVE EXAMPLE 13 | ALUMINUM | UNTREATED | EPOXY RESIN | CONTINUOUS | FLAT | — | 0.1 | 415 | 5 | 1 | 4 | 1 |
| COMPARATIVE EXAMPLE 14 | ALUMINUM | UNTREATED | EPOXY RESIN | CONTINUOUS | STRIPE | — | 0.4 | 250 | 5 | 3 | 4 | 2 |
| COMPARATIVE EXAMPLE 15 | ALUMINUM | UNTREATED | UV CURABLE ACRYLIC RESIN | DISCONTINUOUS | STRIPE | — | 4.5 | 10 | 2 | 5 | 1 | 5 |
| COMPARATIVE EXAMPLE 16 | ALUMINUM | POSITIVE | POLYSTYRENE | CONTINUOUS | FLAT | — | 0.3 | 300 | 4 | 3 | 4 | 1 |
| COMPARATIVE EXAMPLE 17 | ALUMINUM | POSITIVE | POLYSTYRENE | DISCONTINUOUS | STRIPE | — | 5.0 | 11 | 2 | 5 | 4 | 4 |
| COMPARATIVE EXAMPLE 18 | ALUMINUM | NEGATIVE | NOVOLAK RESIN | CONTINUOUS | FLAT | — | 6.2 | 352 | 5 | 2 | 4 | 1 |
| COMPARATIVE EXAMPLE 19 | ALUMINUM | UNTREATED | EPOXY RESIN | CONTINUOUS | MAT | ARX-30* | 13.0 | 2 | 2 | 5 | 3 | 4 |

PLANOGRAPHIC PRINTING PLATE PRECURSOR, LAMINATE THEREOF, AND METHOD OF PRODUCING PLANOGRAPHIC PRINTING PLATE PRECURSOR

CROSS-REFERENCE TO RELATED APPLICATIONS

The present application is a Continuation of PCT International Application No. PCT/JP2017/012374 filed on Mar. 27, 2017 claiming priorities under 35 U.S.C § 119(a) to Japanese Patent Application No. 2016-068200 filed on Mar. 30, 2016 and Japanese Patent Application No. 2016-108459 filed on May 31, 2016. Each of the above applications is hereby expressly incorporated by reference, in their entirety, into the present application.

BACKGROUND OF THE INVENTION

1. Field of the Invention

The present invention relates to a planographic printing plate precursor, a laminate thereof, and a method of producing a planographic printing plate precursor and particularly relates to a technique used for eliminating interleaving paper between planographic printing plate precursors.

2. Description of the Related Art

A planographic printing plate precursor is frequently stored and transported as a laminate formed by laminating a plurality of sheets thereof.

In the laminate of planographic printing plate precursors, interleaving paper is typically inserted into the space between laminated planographic printing plate precursors for the purpose of 1) preventing scraping and peeling between planographic printing plate precursors, 2) preventing adhesion between planographic printing plate precursors, 3) imparting a plate-separating property for preventing multiple-plate feeding in a plate-making step of taking out planographic printing plate precursors from the laminate one by one, and 4) preventing scratches on a surface of a planographic printing plate precursor on a recording layer side.

However, in a case where interleaving paper is used, problems of an increase in cost, a disposal treatment, and the like may occur, and thus the interleaving paper needs to be removed before an exposure step. Therefore, this may also result in risk of occurrence of a load on a plate-making step and occurrence of interleaving paper peeling failure.

Further, at the time of removing the interleaving paper, it is necessary to give consideration so that the surface of the planographic printing plate precursor on the recording layer side is not damaged. Particularly in recent years, along with the spread of a computer to plate (CTP) system, there is an increasing number of cases of an automatic supply device (autoloader) of a planographic printing plate being attached to an exposure device. In order to avoid complication for manually removing interleaving paper deliberately in advance, a demand for eliminating interleaving paper has been increasing. Automatic removal of interleaving paper using a machine has been examined, but occurrence of removal mistakes results in printing troubles.

Therefore, "elimination of interleaving paper" has been required. For this, a planographic printing plate precursor needs to be capable of being formed into a laminate that satisfies all purposes of the above-described items 1) to 4).

As a method of the related art for "eliminating interleaving paper", for example, a planographic printing plate precursor which includes an organic polymer layer containing cross-linked polymer particles having a number average particle diameter of 1 to 100 µm on a surface of a support opposite to a surface where a recording layer is formed has been known (JP2007-148040A). Further, a planographic printing plate precursor (JP2008-249851A) which includes a photosensitive layer containing polymer fine particles and the like in one surface of a support and a back coat layer containing an organic polymer compound in a surface on the opposite side thereof has been known. In addition, a planographic printing plate precursor (JP2008-15503A) which includes a protective layer containing an organic resin fine particle whose surface is coated with a hydrophilic polymer and silica as an uppermost layer of a support on a recording layer side and a back coat layer formed of an organic resin on the opposite side thereof has been known.

Further, WO2014/202519A1, JP2008-64778A, JP2007-122003A, and US2011/0287365A1 suggest elimination of interleaving paper between planographic printing plate precursors using methods other than the methods described in JP2007-148040A, JP2008-249851A, and JP2008-15503A.

WO2014/202519A1 suggests that elimination of interleaving paper is realized by forming a convex discontinuous pattern in a dot shape or a line shape on a rear surface of a support for a planographic printing plate using ink jet, screen printing, gravure printing, or the like.

JP2008-64778A suggests formation of a plurality of rows of linear polymer layers arranged to be spaced from one another in a width direction, on a surface of a support opposite to a side where a recording layer is provided.

JP2007-122003A describes that one surface of a support contains a water-insoluble and alkali-soluble resin and an infrared absorbing agent and is provided with a recording layer capable of forming an image by performing irradiation with infrared rays and a surface of the support opposite to the surface where the recording layer is formed is provided with an organic polymer layer with an arithmetic average surface roughness Ra of 0.05 to 0.40 µm. Further, as a method of forming an organic polymer layer with an arithmetic average surface roughness Ra of 0.05 to 0.40 µm, a method of adding a matting agent onto or into the organic polymer layer (hereinafter, referred to as a "method of adding a matting agent") is described.

US2011/0287365A1 discloses a planographic printing plate which includes a back coat layer on which surface roughness is formed by setting the arithmetic average roughness of the surface of the support having a non-radiation photosensitive back coat layer to at least 0.1 µm (typically in a range of 0.1 µm to 0.4 µm) or allowing the surface to contain a matting agent.

SUMMARY OF THE INVENTION

However, in the techniques described in JP2007-148040A and JP2008-249851A, occurrence of scratches cannot be sufficiently prevented in some cases in a case where the glass transition temperature Tg of the layer containing cross-linked polymer particles and an organic polymer is extremely high. Further, in the technique described in JP2008-249851A, the photosensitive layer contains polymer fine particles, but the photosensitive layer greatly affects the performance of a planographic printing plate to be prepared from the planographic printing plate precursor. Therefore, it is essentially required that the performance of the planographic printing plate precursor, particularly, the image formability, is not affected by the photosensitive layer and that the fine particles do not fall off. Accordingly, the above-described performance needs to be sufficiently considered and the range of design of the photosensitive layer is extremely limited in order for the photosensitive layer to contain polymer fine particles.

Further, effects cannot be sufficiently obtained in a case where the technique described in JP2008-15503A is applied to an on-press development type planographic printing plate precursor or the like which includes a protective layer having a thickness that is much smaller than that of a protective layer of a wet development type planographic printing plate precursor of the related art. The reason for this is considered to be falling of organic resin fine particles from the protective layer because the organic resin fine particles are not sufficiently held. In addition, the falling of the fine particles results in damage to another planographic printing plate precursor.

In the methods of allowing a layer to contain particles as described in JP2007-148040A, JP2008-249851A, and JP2008-15503A, there is a risk of contaminating an exposure device or a printing press of a user or a production or processing line due to falling of particles because the layer cannot hold the particles depending on the combination of materials.

In cases of WO2014/202519A1 and JP2008-64778A, since a convex discontinuous pattern in a dot shape or a line shape (linear) is formed on the rear surface of the support in the planographic printing plate precursor, there is a problem in that the rear surface of the support in an uncoated portion in the discontinuous pattern is rubbed against the photosensitive layer on the surface of the support and thus the planographic printing plate precursor is likely to be damaged at the time of lamination of a planographic printing plate.

In cases of JP2007-122003A and US2011/0287365A1, since the rear surface of the support in the planographic printing plate precursor is continuously coated with a resin composition and the pattern thereof is different from the discontinuous pattern as in WO2014/202519A1 and JP2008-64778A, the problem of the rear surface of the support in an uncoated portion rubbing against the photosensitive layer on the surface of the support and thus the planographic printing plate precursor likely becoming damaged is solved.

However, even in a case where a resin composition is formed in the continuous pattern on the rear surface of the support in the planographic printing plate precursor as described in JP2007-122003A and US2011/0287365A1, there is a risk of damaging other planographic printing plate precursors or contaminating an exposure device or a printing press of a user or a production or processing line due to falling of fine particles as described above in a case where the back coat layer is allowed to contain a matting agent so that the surface roughness is formed on the back coat layer.

Further, a method of roughening a surface of the back coat layer by, for example, performing brushing has a disadvantage that the surface of the back coat layer is likely to be contaminated.

Further, a method of adjusting the surface roughness of the support and reflecting the roughness on the surface of the back coat layer can be employed in a case where the degree of the surface roughness required for the back coat layer is low, but the method is difficult to employ in a case where the degree thereof is high.

As described above, each back coat layer having a surface roughness structure of the related art described in JP2007-148040A, JP2008-249851A, JP2008-15503A, WO2014/202519A1, JP2008-64778A, JP2007-122003A, and US2011/0287365A1 has problems, and thus a planographic printing plate precursor satisfying all purposes 1) to 4) described above, which are necessary for eliminating interleaving paper, cannot be obtained.

Therefore, it is necessary to obtain a planographic printing plate precursor satisfying all purposes 1) to 4) described above by forming a new surface roughness structure on a back coat layer.

The present invention has been made in consideration of the above-described circumstances, and an object thereof is to provide a planographic printing plate precursor, a laminate thereof, and a method of producing a planographic printing plate precursor which satisfy all purposes for eliminating interleaving paper used for preventing scraping and peeling between planographic printing plate precursors, preventing adhesion between planographic printing plate precursors, imparting a plate-separating property for preventing multiple-plate feeding in a plate-making step of taking out planographic printing plate precursors from a laminate one by one, and preventing scratches on a surface of a planographic printing plate precursor on a recording layer side by forming a new surface roughness structure on a back coat layer.

According to the present invention, there is provided a planographic printing plate precursor which includes a polymer layer on a surface of a support, comprising: a back coat layer having an arithmetic average height Sa of 0.5 μm or greater due to a surface roughness structure in which thin film portions and thick film portions are continuously formed on a rear surface of the support.

In the present invention, it is preferable that the arithmetic average height Sa of the back coat layer is in a range of 0.5 μm to 24 μm. It is more preferable that the arithmetic average height Sa thereof is in a range of 1.5 μm to 8.0 μm.

In the present invention, it is preferable that the arithmetic average height Sa of the rear surface of the support is 0.3 μm or less.

In the present invention, it is preferable that a Bekk smoothness (Bekk second) of the back coat layer is 200 seconds or shorter.

In the present invention, it is preferable that the back coat layer contains at least one non-alkali-soluble resin.

In the present invention, it is preferable that the surface roughness structure is a stripe coated film in which belt-like thick film portions are arranged on planar thin film portions.

In the present invention, it is preferable that the surface roughness structure is a dot coated film in which dot-like thick film portions are scattered on planar thin film portions.

In the present invention, it is preferable that the surface roughness structure is a dashed line coated film in which dashed line thick film portions are arranged on planar thin film portions.

In the present invention, it is preferable that a width W of the thick film portion is in a range of 0.5 mm to 50 mm.

In the present invention, it is preferable that a pitch λ between the thick film portions is in a range of 0.5 mm to 50 mm.

In the present invention, it is preferable that a ratio $Z_t/\lambda$ of a difference $Z_t$ in thickness to the pitch λ is 0.10 or less.

In the present invention, it is preferable that a ratio $Z_t/W$ of the difference $Z_t$ in thickness to the width W of the thick film portion is 0.10 or less.

In the present invention, it is preferable that the back coat layer contains at least one non-photocurable resin having a weight-average molecular weight of 3000 or less.

In the present invention, it is preferable that the back coat layer contains at least one selected from the group consisting of a novolak resin such as a phenol formaldehyde resin, an m-cresol formaldehyde resin, a p-cresol formaldehyde resin, an m-/p-mixed cresol formaldehyde resin, or a phenol/cresol (any of m-, p-, and m-/p-mixed)-mixed formaldehyde resin, a resol resin, pyrogallol, an acetone resin, an epoxy resin, a saturated copolymer polyester resin, a phenoxy resin, a polyvinyl acetal resin, a vinylidene chloride copolymer resin, polybutene, polybutadiene, polyamide, an unsaturated copolymer polyester resin, polyurethane, polyurea, polyimide, polysiloxane, polycarbonate, chlorinated polyethylene, an aldehyde condensation resin of alkyl phenol, polyvinyl chloride, polyvinylidene chloride, polystyrene, an acrylic resin copolymer resin, hydroxy cellulose, polyvinyl alcohol, cellulose acetate, and carboxymethyl cellulose.

In the present invention, it is preferable that the polymer layer is a positive type image recording layer containing an infrared absorbing agent.

In the present invention, it is preferable that the polymer layer is a negative type image recording layer containing an infrared absorbing agent, a polymerization initiator, or a polymerizable compound.

In the planographic printing plate precursor of the present invention, it is preferable that the polymer layer is used for a treated key plate formed of a non-photosensitive layer.

In the planographic printing plate precursor of the present invention, it is preferable that the polymer layer is used for an untreated plate formed of any of a water-soluble layer or a water-dispersible layer.

In the planographic printing plate precursor of the present invention, it is preferable that the polymer layer is used for an untreated key plate formed of any of a water-soluble layer or a water-dispersible layer.

In the present invention, it is preferable that the water-dispersible layer contains polymer fine particles.

According to the present invention, there is provided a laminate which is formed by laminating a plurality of planographic printing plate precursors respectively including a polymer layer on a surface of a support and a back coat layer with an arithmetic average height Sa of 0.5 μm or greater due to a surface roughness structure in which thin film portions and thick film portions are continuously formed on a rear surface of the support.

According to the present invention, there is provided a method of producing a planographic printing plate precursor which includes a polymer layer on a surface of a support, the method comprising: a coating step of performing coating of a rear surface of the support to form a coated film having a surface roughness structure in which thin film portions and thick film portions are continuously formed; and a drying step of drying the coated film to form a back coat layer having an arithmetic average height Sa of 0.5 μm or greater due to the surface roughness structure.

In the production method of the present invention, it is preferable that a difference in thickness between the thin film portion and the thick film portion, which are adjacent to each other in the coating step, is in a range of 1 μm to 50 μm.

In the production method of the present invention, it is preferable that the support is coated with a coating solution under coating conditions in which a viscosity of the coating solution is in a range of 0.3 mPa·s to 10) mPa·s, a surface tension is 20 mN/m to 40 mN/m, and a contact angle between the coating solution and the support is in a range of 10° to 90° to form the coated film having the surface roughness structure in a wet state in the coating step, and the formed coated film in the wet state is dried under drying conditions in which a drying point t satisfies inequalities of Formula 1 and Formula 2 in the drying step.

$$t < \frac{0.033 \times \lambda^4 \times \eta}{\sigma \times X^3} \log \frac{Z_0}{Z_t} \quad \text{(Formula 1)}$$

$$t < 3.3 \times 10^9 \frac{Z_0 \times \eta \times W}{\sigma} < \frac{X \times \eta}{Pe} \quad \text{(Formula 2)}$$

Here, t represents a time from the start of drying to the drying point and the unit thereof is s, X represents an initial average film thickness and the unit thereof is m, η represents a viscosity of a coating solution for a stripe coated film and the unit thereof is Pa·s, λ represents a pitch of a stripe coated film and the unit thereof is m, $Z_0$ represents a difference in initial film thickness and the unit thereof is m, $Z_t$ represents a difference in film thickness between dry films and the unit thereof is m, σ represents a surface tension of a coating solution for a stripe coated film and the unit thereof is N/m, Pe represents a Peclet number and is a constant of $1.5 \times 10^{-6}$, and W represents a width of a stripe and the unit thereof is m.

In the production method of the present invention, it is preferable that the coated film is formed by coating the support using any of a bar coating system, an ink jet printing system, a gravure printing system, a screen printing system, and a spray coating system in the coating step.

In the production method of the present invention, it is preferable that the coated film having the surface roughness structure is a stripe coated film in which belt-like thin film portions and belt-like thick film portions are alternately and continuously arranged.

In the production method of the present invention, it is preferable that the coated film having the surface roughness structure is a dot coated film in which dot-like thick film portions are scattered on the surface of flat thin film portions.

In the production method of the present invention, it is preferable that the coated film having the surface roughness structure is a dashed line coated film in which dashed line thick film portions are continuously arranged on the surface of flat thin film portions.

In the production method of the present invention, it is preferable that, in a case of the stripe coated film, the coating solution is applied using a coating bar of a bar coating device in the coating step, and the coating bar is formed such that grooved portions where grooves are formed and groove-free portions where grooves are not formed are alternately formed in an axial core direction.

In the production method of the present invention, it is preferable that, in depressions and projections constituting the grooves of the grooved portions in the coating bar, in a case where a pitch length between depressions or projections adjacent to each other is set as P, a depth of a depression is set as h, and an opening width of a depression is set as D, P satisfies 0.25 mm or greater, D/P satisfies 0.49 or less, and h/D satisfies in a range of 0.01 to 0.55.

In the present invention, it is preferable that the production method is a method of continuously coating the support that travels and has a belt shape using the coating bar that coats the support with the coating solution, and in a case where a diameter of the coating bar is in a range of 6 mm to 50 mm, a rotation speed of the coating bar is set as r and the unit thereof is rpm and the viscosity of the coating solution is set as η and the unit thereof is mPa·s, a relationship of Formula 3 is satisfied.

$$r < 65714 \times \eta^{-1.122} \quad \text{Formula 3}$$

In the production method of the present invention, it is preferable that dry wind is blown to the surface of the coated film in the drying step, and a parallel wind component of the dry wind blown to the coated film surface has a relative wind speed of 30 m/s or less.

In the production method of the present invention, it is preferable that, in a case of the dot coated film, the coating step includes a first coating step of solid-coating the support with a coating solution to form the flat thin film portions and a second coating step of coating the flat thin film portions with the coating solution in a dot shape using a screen printing device to form the thick film portions.

In the production method of the present invention, it is preferable that, in a case of the dashed line coated film, the coating step includes a first coating step of solid-coating the support with a coating solution to form the flat thin film portions and a second coating step of coating the flat thin film portions with the coating solution in a dashed line shape using a screen printing device to form the thick film portions.

According to the present invention, it is possible to satisfy all purposes for eliminating interleaving paper used for preventing scraping and peeling between planographic printing plate precursors, preventing adhesion between planographic printing plate precursors, imparting a plate-separating property for preventing multiple-plate feeding in a plate-making step of taking out planographic printing plate precursors from a laminate one by one, and preventing scratches on a surface of a planographic printing plate precursor on a recording layer side, by forming a back coat layer with a surface roughness structure different from a structure of the related art.

In this manner, it is possible to obtain a planographic printing plate precursor that enables elimination of interleaving paper.

BRIEF DESCRIPTION OF THE DRAWINGS

FIG. 18A is a table for describing a first example.

FIG. 18B is a graph for describing the basis of a constant in Formula 1.

FIG. 23 is a table for describing a second example.

FIG. 24 is a table for describing a third example.

FIG. 25 is a table for describing a fourth example.

DESCRIPTION OF THE PREFERRED EMBODIMENTS

Figure 1:
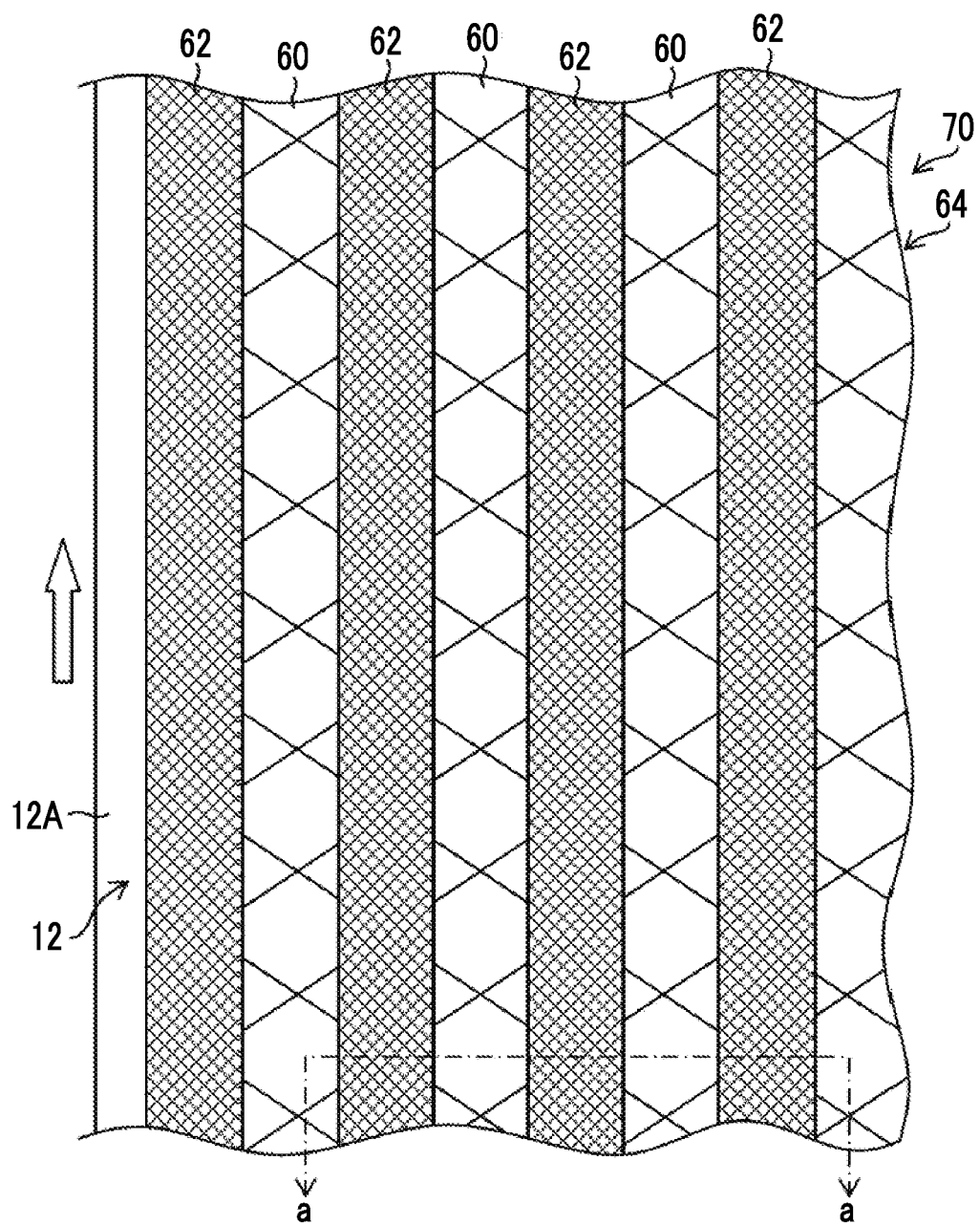
FIG. 1 is a view for describing a back coat layer having a surface roughness structure of a stripe coated film.

Hereinafter, preferred embodiments of the present invention will be described with reference to the accompanied drawings. The present invention will be described based on the following preferred embodiments. Modifications can be made according to a plurality of methods without departing from the scope of the present invention, and embodiments other than the present embodiment can be used. Therefore, all modifications in the scope of the present invention are included in the scope of the appended claims.

Here, in the drawings, portions denoted by the same reference numerals are the same elements having the same functions. Further, in the present specification, the numerical ranges shown using "to" indicate ranges including the numerical values described before and after "to" as the lower limit values and the upper limit values.

[Planographic Printing Plate Precursor]

A planographic printing plate precursor according to an embodiment of the present invention includes a polymer layer on a surface of a support and a back coat layer having an arithmetic average height Sa of 0.5 μm or greater due to a surface roughness structure in which thin film portions and thick film portions are continuously formed on a rear surface of the belt-like support.

Here, the surface roughness structure in which thin film portions and thick film portions are continuously formed indicates a structure having a surface roughness on a surface of a coated film by forming thinly coated portions and thickly coated portions in a continued state. In other words, this means that the surface roughness structure is not formed by using a matting agent as in the related art.

In a case where a planographic printing plate precursor is mentioned in the present invention, the concept thereof includes a belt-like planographic printing plate precursor before being cut into a predetermined size and a sheet-like planographic printing plate precursor cut to have a predetermined size.

Examples of the polymer layer according to the present embodiment include a photosensitive layer formed of a positive type image recording layer containing an infrared absorbing agent; a photosensitive layer formed of a negative type image recording layer containing an infrared absorbing agent, a polymerization initiator, and a polymerizable compound; a key plate of a non-photosensitive layer; an untreated plate (a non-development type planographic printing plate precursor) of a water-soluble layer or a water-dispersible layer; and an untreated key plate of a water-soluble layer or a water-dispersible layer.

Here, the key plate indicates a planographic printing plate precursor used by being attached to an unused plate cylinder in a case where a part of the paper surface is printed with one color or two colors in color newspaper printing. Further, a water-soluble compound that forms a water-soluble layer is not particularly limited as long as 0.5 g or greater of the compound is dissolved in 100 g of water at 20° C. Further, a water-dispersible compound that forms a water-dispersible layer is not particularly limited as long as the compound is uniformly dispersed in water. Further, the water-dispersible layer may contain polymer fine particles.

The back coat layer according to the present embodiment is formed such that the arithmetic average height Sa due to the surface roughness structure in which thin film portions and thick film portions are continuously formed is set to 0.5 μm or greater. The arithmetic average height Sa is preferably in a range of 1 μm to 24 μm and more preferably in a range of 1.5 μm to 8 μm. Further, the Bekk smoothness (Bekk second) of the back coat layer is preferably 200 seconds or shorter.

Examples of preferable forms of the surface roughness structure, in which thin film portions and thick film portions constituting the back coat layer having an arithmetic average height Sa of 0.5 μm or greater are continuously formed, include a stripe coated film, a dot coated film, and a dashed line coated film. However, the present invention is not limited to these forms. Further, the arithmetic average height Sa is in conformity with ISO 25178 (ISO: international organization for standardization).

(Stripe Coated Film)

Figure 2:
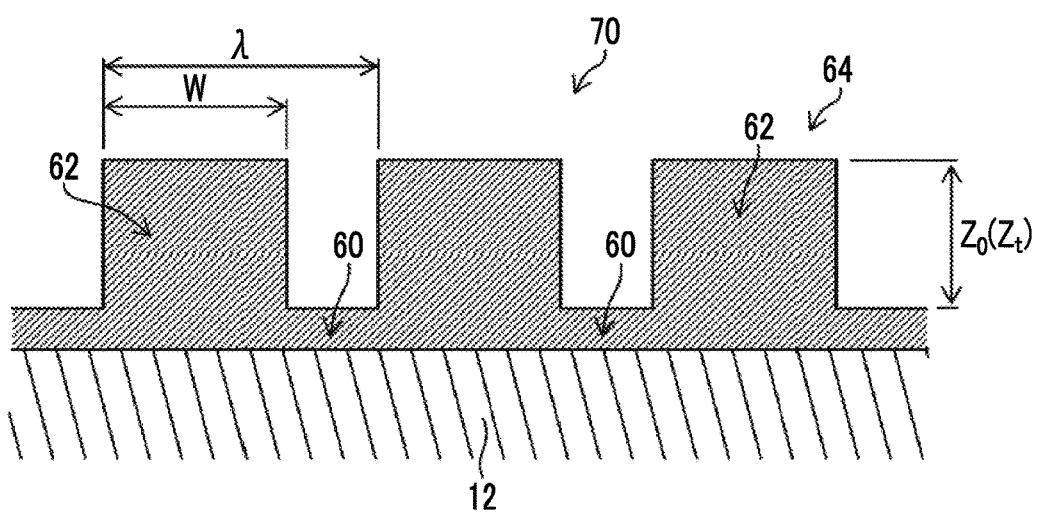
FIG. 2 is a longitudinal cross-sectional view taken along line a-a of FIG. 1 for describing thick film portions and thin film portions of the stripe coated film.

FIG. 1 is a view illustrating a stripe coated film 64 when viewed from the above as an example of the surface roughness structure of a back coat layer 70, and FIG. 2 is a longitudinal cross-sectional view taken along line a-a of FIG. 1. As illustrated in FIGS. 1 and 2, the stripe coated film 64 is formed by arranging belt-like thick film portions 62 on planar thin film portions 60 on the rear surface of a belt-like support 12. In this manner, a surface roughness structure in which the belt-like thin film portions 60 and the belt-like thick film portions 62 are alternately arranged in parallel with a longitudinal direction (the same as the traveling direction of the support in the production method) of the belt-like support 12 is formed. In other words, the stripe coated film 64 is formed on the entire rear surface of the belt-like support 12 such that the surface does not have uncoated portions. Here, ear portions 12A which are both end portions of the belt-like support 12 may remain uncoated.

The contact area ratio of the thick film portions 62 to the thin film portions 60 and the thick film portions 62 is preferably in a range of 5% to 90%, more preferably in a range of 30% to 80%, and particularly preferably in a range of 50% to 75% (hereinafter, referred to as a "thick film portion contact area ratio"). In a case where the thick film portion contact area ratio is 5% or greater in the planographic printing plate precursor, printing stain is unlikely to occur. Further, in a case where the thick film portion contact area ratio is 90% or less, an air release property at the time of lamination of planographic printing plate precursors becomes excellent, and adhesion between plates does not occur.

The thick film portion contact area ratio is an area ratio specified using a prescale (manufactured by Fujifilm Corporation) which is a film capable of measuring the pressure and the pressure distribution. In other words, a prescale is placed by being interposed between a smooth plate and a prepared stripe coated film whose area is to be measured. Both entire surfaces are pressurized from the upper and lower sides at 0.59 MPa (6 kgf/cm$^2$) for 2 minutes, and the area ratio of sites where a coloration of 0.59 MPa or greater is seen with the prescale to the target area to be measured is defined as the contact area ratio.

As illustrated in FIG. 2, in the stripe coated film 64, a difference $Z_t$ in thickness between the thick film portion 62 and the thin film portion 60 which are adjacent to each other is preferably in a range of 1 μm to 50 μm (hereinafter, referred to as a "thickness difference $Z_t$").

The thickness difference $Z_t$ is more preferably in a range of 1 μm to 20 μm and particularly preferably in a range of 2 μm to 10 μm. In FIG. 2, a thickness difference $Z_0$ indicates a thickness difference in a wet state immediately after the rear surface of the belt-like support 12 is coated with the coating solution forming the stripe coated film 64.

A width W of the thick film portion 62 is preferably in a range of 0.5 mm to 50 mm (hereinafter, referred to as a "thick film portion width W"). In a case where the width W of the thick film portion 62 in the planographic printing plate precursor is 0.5 mm or greater, plates are unlikely to be damaged because the plates are deviated from each other at the time of lamination. Further, in a case where the width W thereof is 50 mm or less, the air release property becomes excellent.

Further, a pitch λ between the thick film portions 62 is preferably in a range of 0.5 mm to 50 mm (hereinafter, referred to as a distance λ between thick film portions"). In planographic printing plates, in a case where the pitch λ between the thick film portions 62 is 0.5 mm or greater, the air release property at the time of lamination becomes excellent, and adhesion between plates does not occur. Further, in a case where the pitch λ between the thick film portions 62 is 50 mm or less, printing stain does not occur.

Further, a ratio $Z_t/\lambda$ of the thickness difference $Z_t$ between the thin film portion 60 and the thick film portion 62 which are adjacent to each other to the pitch λ is preferably 0.10 or less. Further, a ratio $Z_t/\lambda$ of the thickness difference Z to the width W of the thick film portion 62 is preferably 0.10 or less.

(Dot Coated Film)

Figure 3:
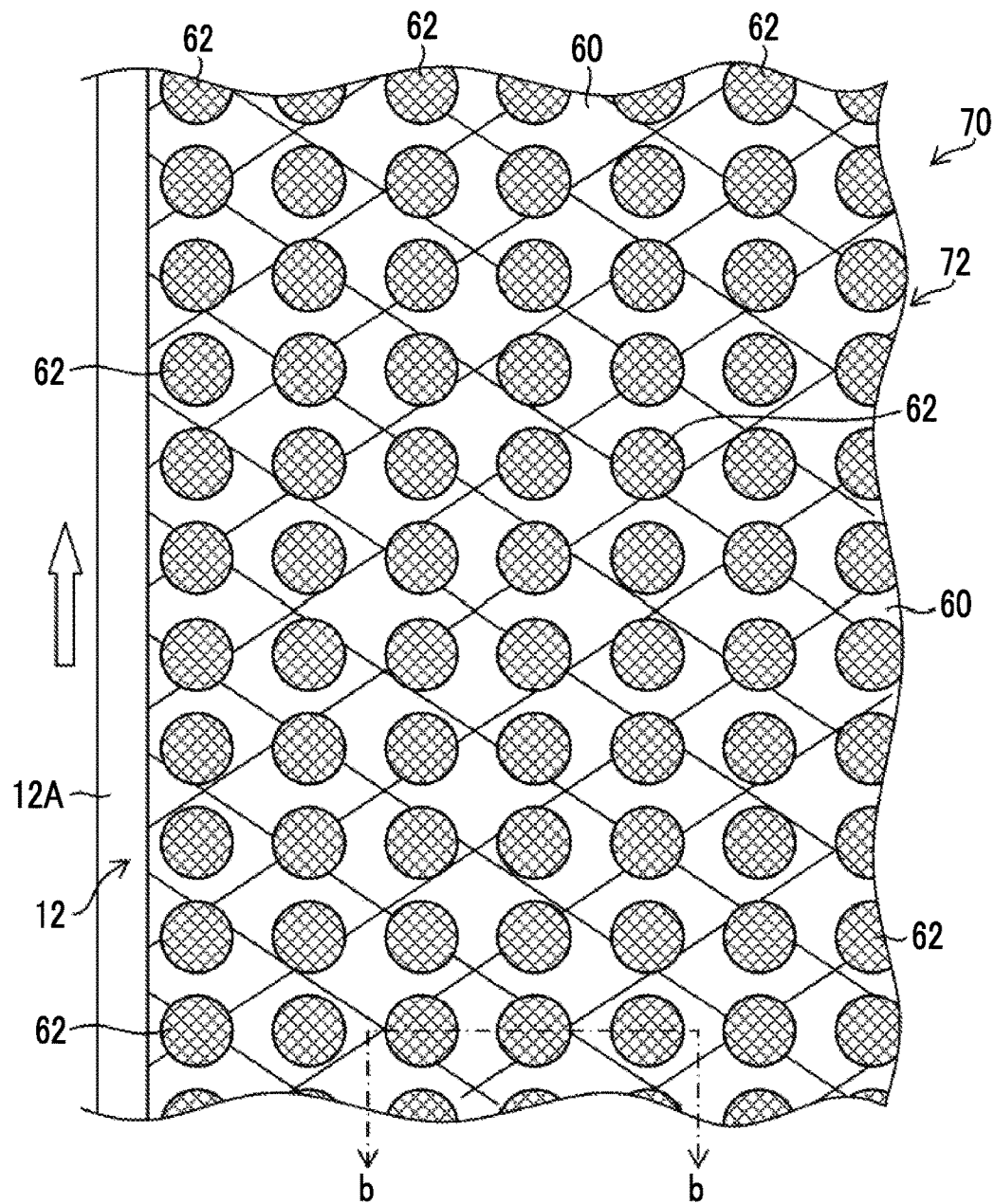
FIG. 3 is a view for describing a back coat layer having a surface roughness structure of a dot coated film.
Figure 4:
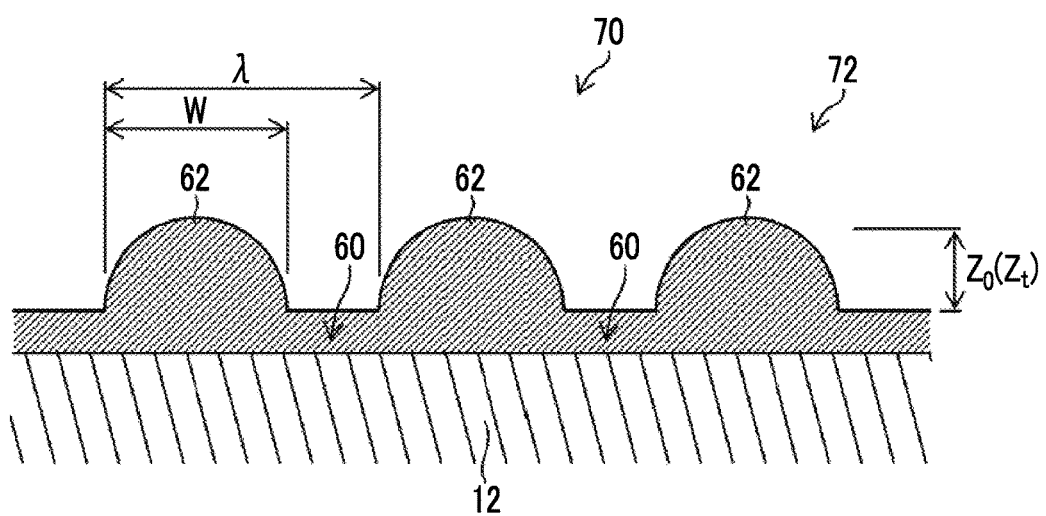
FIG. 4 is a longitudinal cross-sectional view taken along line b-b of FIG. 3 for describing thick film portions and thin film portions of the dot coated film.

FIG. 3 is a view illustrating a dot coated film 72 when viewed from the above as an example of the surface roughness structure of the back coat layer 70, and FIG. 4 is a longitudinal cross-sectional view taken along line b-b of FIG. 3. As illustrated in FIGS. 3 and 4, the dot coated film 72 is a surface roughness structure in which dot-like thick film portions 62 are scattered on planar thin film portions 60 on the rear surface of the belt-like support 12.

FIGS. 3 and 4 illustrate the case in which the dot-like thick film portions 62 are regularly scattered, but the dot-like thick film portions 62 may be irregularly (randomly) scattered. In other words, the planar thin film portions 60 are formed on the entire rear surface of the belt-like support 12 such that the surface does not have uncoated portions, and the dot-like thick film portions 62 are scattered on the thin film portions 60. Here, ear portions 12A which are both end portions of the belt-like support 12 may remain uncoated.

Even in a case of the dot coated film 72, the "thick film portion contact area ratio", the "thickness difference $Z_t$" of FIG. 4, the "thick film portion width W", and the "distance λ between thick film portions" described above are the same as those for the stripe coated film 64.

(Dashed Line Coated Film)

Figure 5:
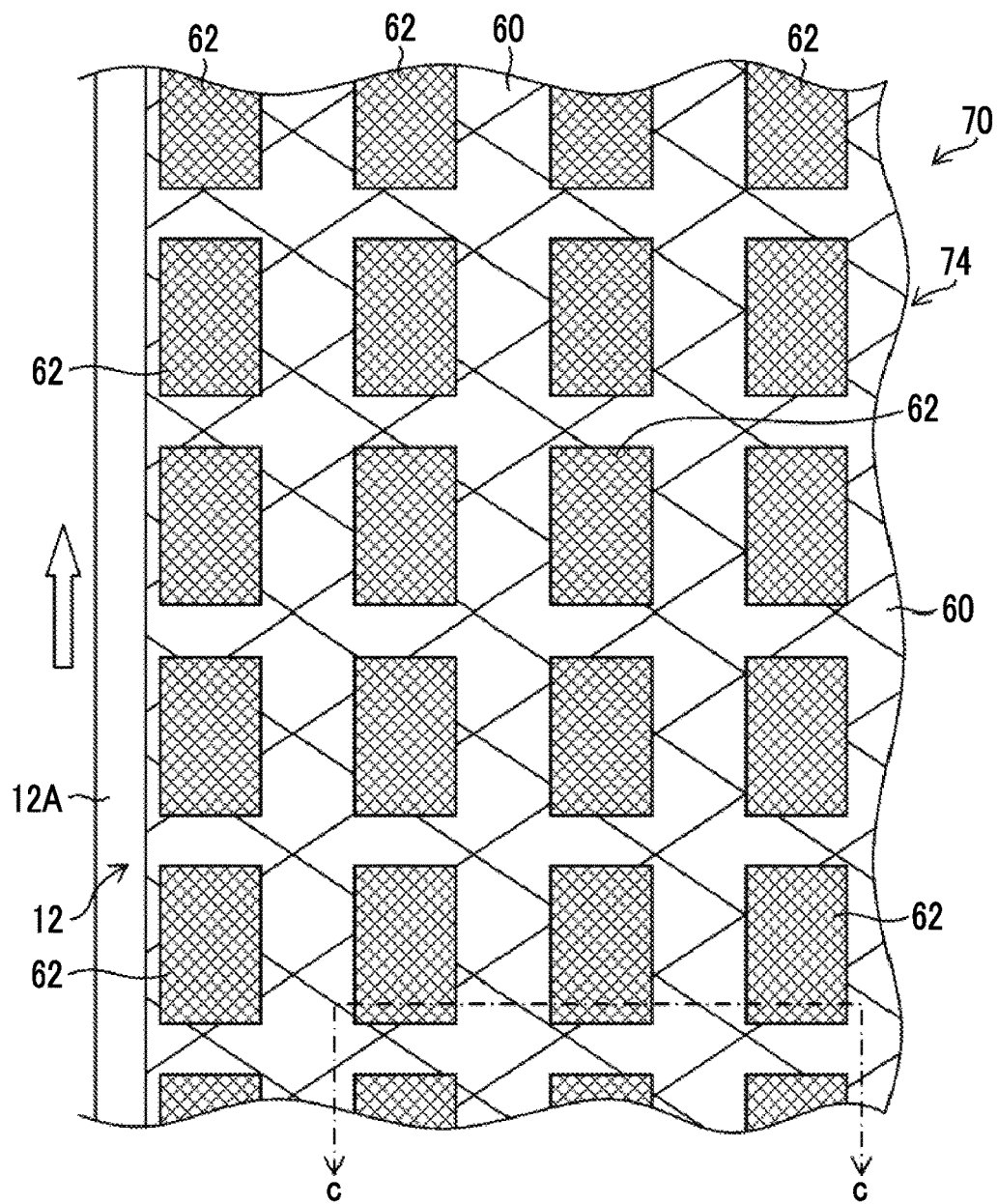
FIG. 5 is a view for describing a back coat layer having a surface roughness structure of a dashed line coated film.
Figure 6:
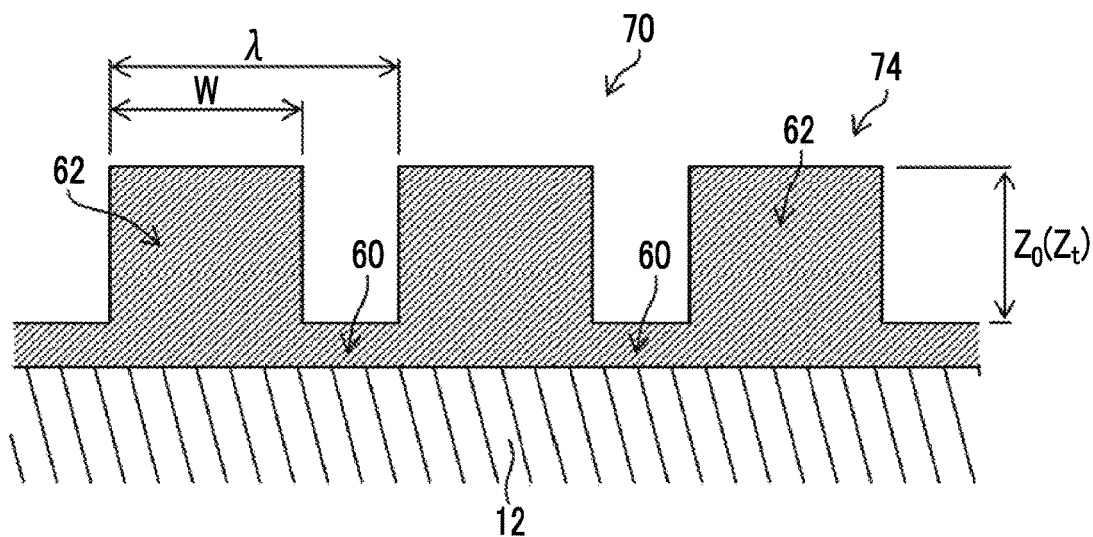
FIG. 6 is a longitudinal cross-sectional view taken along line c-c of FIG. 5 for describing thick film portions and thin film portions of the dashed line coated film.

FIG. 5 is a view illustrating a dashed line coated film when viewed from the above as an example of the surface roughness structure of the back coat layer 70, and FIG. 6 is a longitudinal cross-sectional view taken along line c-c of FIG. 5. As illustrated in FIGS. 5 and 6, a dashed line coated film 74 is a surface roughness structure in which dashed line thick film portions 62 are formed on planar thin film portions 60 on the rear surface of the belt-like support 12.

FIGS. 5 and 6 illustrate the case in which the dashed line thick film portions 62 are regularly formed, but the dashed line thick film portions 62 may be irregularly (randomly) formed. In other words, the planar thin film portions 60 are formed on the entire rear surface of the belt-like support 12 such that the surface does not have uncoated portions, and the dashed line thick film portions 62 are formed on the thin film portions 60. Here, ear portions 12A which are both end portions of the belt-like support 12 in the width direction may remain uncoated.

Figure 7:
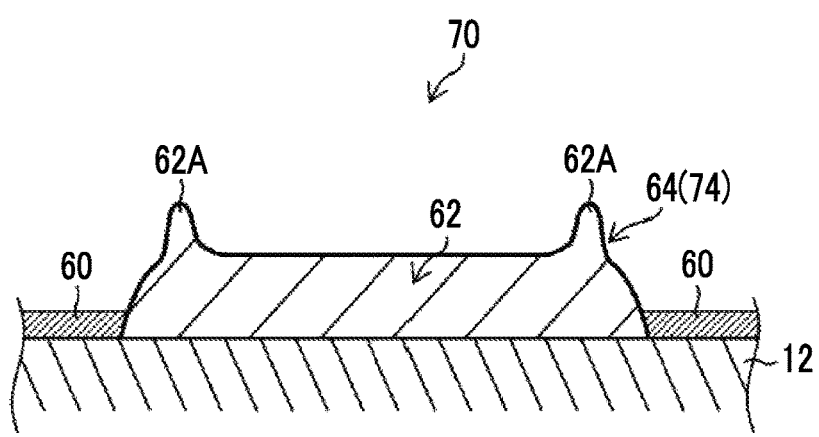
FIG. 7 is a view for describing horn-like protrusions in the stripe coated film or the dashed line coated film.

Even in a case of the dashed line coated film 74, the "thick film portion contact area ratio", the "thickness difference $Z_t$" of FIG. 7, the "thick film portion width W", and the "distance λ between thick film portions" described above are the same as those for the stripe coated film 64.

As described above, a new surface roughness structure different from a structure of the related art is formed on the back coat layer 70 of the planographic printing plate precursor according to the embodiment of the present invention.

Figure 8:
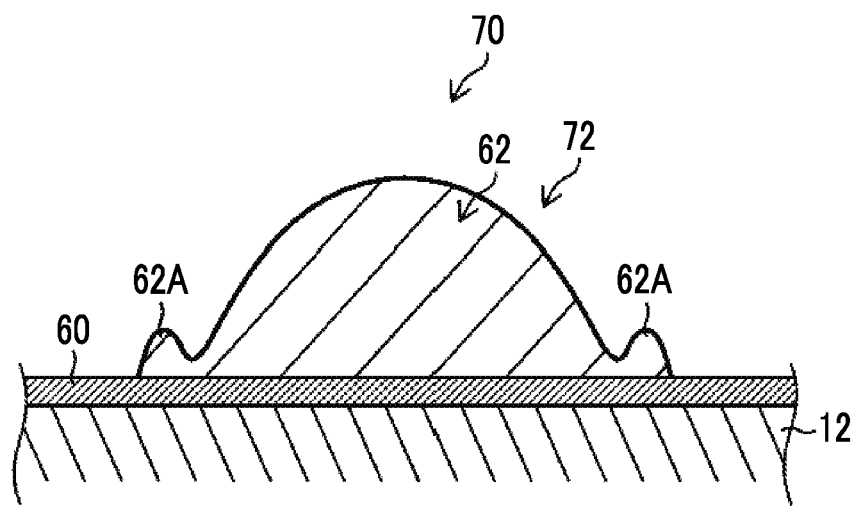
FIG. 8 is a view for describing horn-like protrusions in the dot coated film.

However, in a case where the back coat layer 70 having a new surface roughness structure such as a stripe coated film in which the thin film portions 60 and the thick film portions 62 are continuously formed on the rear surface of the belt-like support 12 is formed, there is a tendency that horn-like protrusions 62A are formed on the thick film portions 62 as illustrated in FIGS. 7 and 8.

FIG. 7 illustrates a case where the stripe coated film 64 or the dashed line coated film 74 is formed using the thin film portion 60 and the thick film portion 62, and horn-like protrusions 62A are likely to be formed on both end portions of the thick film portion 62 in the width direction (short width direction). Further, FIG. 8 illustrates the dot coated film 72, and horn-like protrusions 62A are likely to be formed on the peripheral portion of the dot-like thick film portion 62. In addition, the formation of horn-like protrusions 62A may result in printing stain.

Accordingly, in order to achieve elimination of interleaving paper between the planographic printing plate precursors using the planographic printing plate precursor according to the embodiment of the present invention, it is necessary to form the back coat layer 70 having an arithmetic average height Sa of 0.5 μm or greater using the surface roughness structure in which the thin film portions 60 and the thick film portions 62 are continuously formed and prevent formation of horn-like protrusions 62A.

Next, a method of producing the planographic printing plate precursor of the present invention which is capable of forming the back coat layer 70 having an arithmetic average height Sa of 0.5 μm or greater using the surface roughness structure in which the thin film portions 60 and the thick film portions 62 are continuously formed and capable of preventing formation of horn-like protrusions 62A will be described.

[Method of Producing Planographic Printing Plate Precursor]

The method of producing a planographic printing plate precursor according to the present embodiment of the present invention will be described in detail using an example of the back coat layer 70 having the surface roughness structure of the stripe coated film 64 from among the stripe coated film 64, the dot coated film 72, and the dashed line coated film 74 described above.

Further, the present invention can be applied to a case where the planographic printing plate precursor is produced using a sheet-like support (substrate) and a case where the planographic printing plate precursor is produced using a belt-like support, and the case of the belt-like support 12 will be described in the present embodiment.

Figure 9:
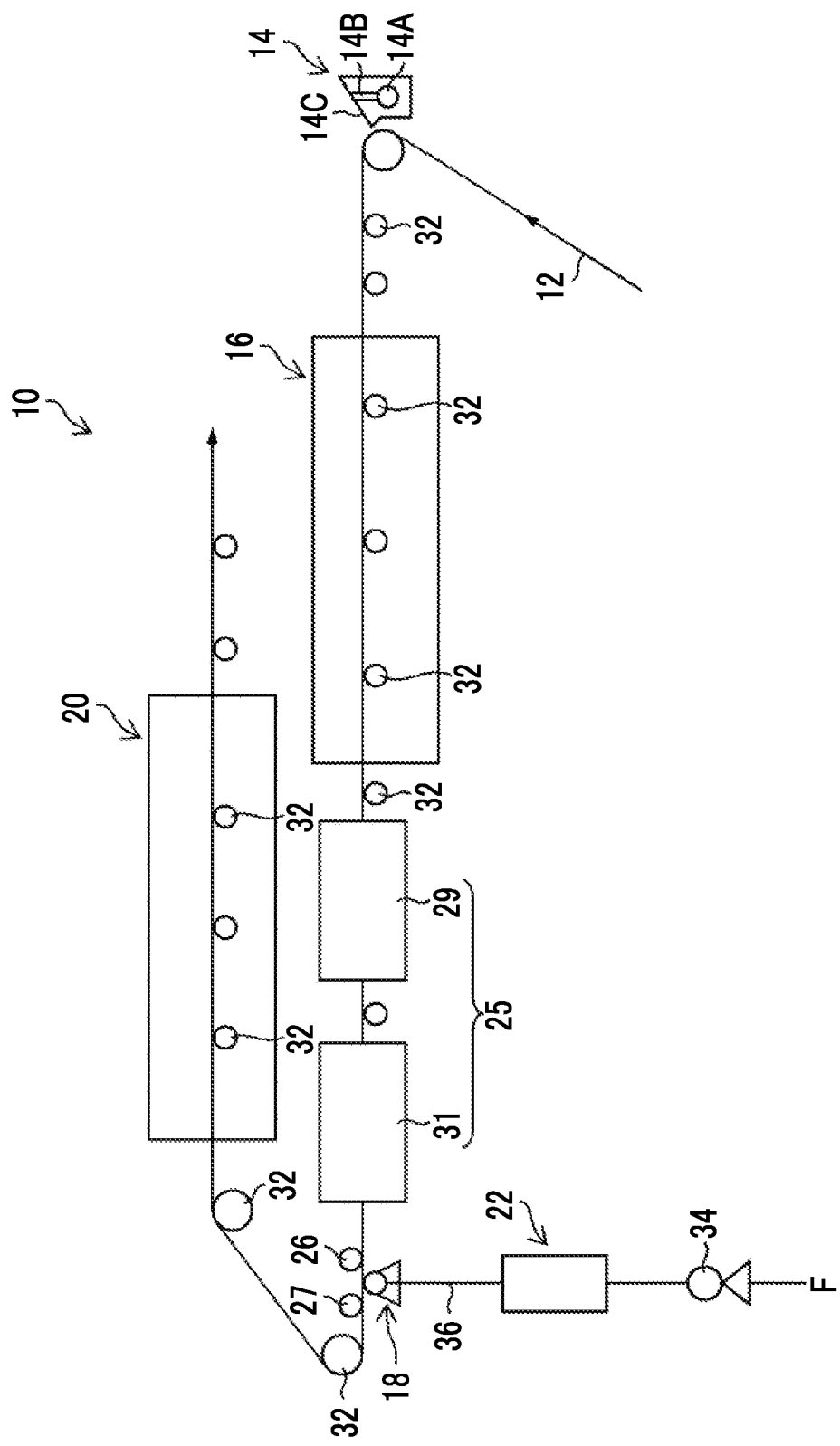
FIG. 9 is an overall configuration view illustrating an example of a producing device of a planographic printing plate precursor.

FIG. 9 is a view schematically illustrating the overall configuration of a producing device that produces a planographic printing plate precursor.

As illustrated in FIG. 9, a producing device 10 of the planographic printing plate precursor includes a coater 14 for a polymer layer that continuously coats the surface of the belt-like support 12 with a coating solution for a polymer layer; a dryer 16 for a polymer layer that dries the applied polymer layer in a wet state; support cooling means 25 for cooling the belt-like support 12 before the surface thereof is coated with the coating solution for a stripe coated film; a coater 18 for a stripe coated film that coats the rear surface of the belt-like support 12 with a coating solution for a stripe coated film; and a dryer 20 for a stripe coated film that dries the applied stripe coated film in a wet state.

Examples of the belt-like support 12 according to the embodiment of the present invention includes paper, a polyester film, and an aluminum plate. Among these, an aluminum plate subjected to a roughening treatment and an anodizing treatment according to a known method is preferable. An aluminum plate has excellent dimensional stability, is relatively inexpensive, and can be provided with a surface having excellent hydrophilicity or strength by performing a surface treatment as necessary. Further, a composite sheet obtained by bonding an aluminum sheet to a polyethylene terephthalate film is also preferable.

The aluminum plate can be subjected to a treatment appropriately selected from an expansion treatment or a sealing treatment of micropores of an anodized film described in JP2001-253181A or JP2001-322365A or a surface hydrophilization treatment using alkali metal silicate described in U.S. Pat. No. 2,714,066A, U.S. Pat. No. 3,181,461A, U.S. Pat. No. 3,280,734A, and U.S. Pat. No. 3,902,734A or polyvinyl phosphonic acid described in U.S. Pat. No. 3,276,868A, U.S. Pat. No. 4,153,461A, and U.S. Pat. No. 4,689,272A as necessary.

It is preferable that the rear surface of the belt-like support 12 which includes the back coat layer 70 and has not been subjected to a roughening treatment has an arithmetic average height Sa of 0.30 μm or less. This clarifies that the arithmetic average height Sa of the back coat layer does not go beyond 0.5 μm due to the surface roughness of the rear surface of the belt-like support 12, in the method of producing the planographic printing plate precursor according to the present embodiment.

Next, a step of producing the planographic printing plate precursor using the producing device 10 having the above-described configuration will be described.

(Step of Coating Surface with Coating Solution for Polymer Layer)

First, the surface of the belt-like support 12 onto which a roughening treatment or an undercoat layer has been applied as necessary is coated with a coating solution for a polymer layer by the coater 14 for a polymer layer.

Each component constituting various polymer layers described above is dispersed or dissolved in a known volatile solvent to prepare a coating solution for a polymer layer, and the belt-like support 12 to be continuously transported is coated with this coating solution.

As the coater 14 for a polymer layer, a slide bead type coater illustrated in FIG. 9 can be used. In addition to this coater, a known coater such as a bar coater or an extrusion type coater can be used. In the slide bead type coater illustrated in FIG. 9, the coating solution supplied to a pocket portion 14A of the coater main body flows through a slit 14B, is jetted to a slide surface 14C, flows through the slide surface 14C, and is applied to the belt-like support 12 through a bead (coating solution reservoir) from the tip of the slide surface. Further, the reference numeral 32 is a pass roller that transports the belt-like support 12.

(Step of Drying Polymer Layer)

Next, the polymer layer in a wet state which is formed by coating the belt-like support 12 with the coating solution for a polymer layer is dried by the dryer 16 for a polymer layer. The dryer 16 for a polymer layer can be operated according to various drying systems such as a hot air system of blowing hot air to a polymer layer, a heater heating system of performing drying using a heater of infrared rays or the like, and a heating roll system of bringing a heating roll into contact with a belt-like support. Among these, a hot air system is particularly preferable. In a case of the hot air system, it is preferable that the polymer layer is dried in heated air, for example, at a temperature of 100° C. or higher and a dew point of 5° C. to 20° C.

(Step of Cooling Belt-Like Support)

Next, in the belt-like support 12 on which a polymer layer is formed, the temperature of the belt-like support 12 which is increased by dry heat of the dryer 16 for a polymer layer is cooled by the support cooling means 25. In this case, one cooling means may be used, but it is preferable that two cooling means of first cooling means 29 and second cooling means 31 are used from the viewpoints of the purpose and the cooling efficiency. The first cooling means 29 rapidly decreases the temperature of the belt-like support 12 until the temperature thereof becomes 30° C. to 40° C. for the purpose of preventing transfer of the polymer layer to transport pass rollers 32, 32, . . . due to stickiness and preventing damage or distortion of the belt-like support 12.

Further, the second cooling means 31 decreases the temperature of the belt-like support to be in a range as the temperature range of the coating solution for a stripe coated film described below such that the viscosity of the coating solution for a stripe coated film to be applied to the rear surface of the belt-like support 12 in the subsequent step is not changed. The belt-like support is typically cooled to room temperature.

Next, the belt-like thick film portions 62 and the belt-like thin film portions 60 are continuously and alternately arranged in parallel with the traveling direction of the belt-like support 12 as illustrated in FIG. 1, on the rear surface of the belt-like support 12 whose surface is provided with a polymer layer, and the stripe coated film 64 in which the difference in thickness between the thick film portion 62 and the thin film portion 60 which are adjacent to each other is in a range of 1 μm to 50 μm is formed as follows. In other words, a coated film is formed on the entire rear surface of the belt-like support 12 which does not have uncoated portions. Here, the ear portions 12A which are both end portions of the belt-like support 12 may remain uncoated.

(Step of Coating Surface with Coating Solution for Stripe Coated Film)

A coating solution F for a stripe coated film can be prepared by dispersing or dissolving each component such as a resin component constituting the composition of the stripe coated film 64 in a known volatile solvent.

As the resin component and the solvent of the stripe coated film 64, a resin component and a solvent for forming a back coat layer of a planographic printing plate can be preferably used. For example, the resin component contains an organic polymer as a base polymer constituting the back coat layer 70 according to the embodiment of the present invention.

The organic polymer can be selected from the group consisting of a novolak resin such as a phenol formaldehyde resin, an m-cresol formaldehyde resin, a p-cresol formaldehyde resin, an m-/p-mixed cresol formaldehyde resin, or a phenol/cresol (any of m-, p-, and m-/p-mixed)-mixed formaldehyde resin, a resol resin, pyrogallol, an acetone resin, and an epoxy resin.

Further, a saturated copolymer polyester resin, a phenoxy resin, a polyvinyl acetal resin, a vinylidene chloride copolymer resin, or the like can also be used.

Further, in addition to the above-described resins, hydrophobic polymer compounds such as polybutene, polybutadiene, polyamide, an unsaturated copolymer polyester resin, polyurethane, polyurea, polyimide, polysiloxane, polycarbonate, an epoxy resin, chlorinated polyethylene, an aldehyde condensation resin of alkyl phenol, polyvinyl chloride, polyvinylidene chloride, polystyrene, an acrylic resin, and copolymer resins of these, hydroxy cellulose, polyvinyl alcohol, cellulose acetate, and carboxymethyl cellulose may be used.

In a case where an epoxy resin or a resol resin is used for the back coat layer 70, it is preferable to use a crosslinking agent in combination.

Among various organic polymers described above, a novolak resin, a resol resin, a pyrogallol acetone resin, an epoxy resin, or a polystyrene resin is preferably used from the viewpoints of the heat resistance, the chemical resistance, and the cost.

The content of the organic polymer contained in the total solid content of the back coat layer 70 is preferably in a range of 99.7% to 40% by mass, more preferably in a range of 99% to 60% by mass, and particularly preferably in a range of 98% to 80% by mass.

As described above, in a case where an epoxy resin or a resol resin is used, the content of the crosslinking agent in the organic polymer layer which is to be used in combination is preferably in a range of 0.3% to 30% by mass and more preferably in a range of 1% to 20% by mass expressed in terms of solid contents.

It is preferable that the back coat layer 70 contains at least one non-alkali-soluble resin. Further, it is preferable that the back coat layer 70 contains at least one non-photocurable resin having a weight-average molecular weight of 3000 or less.

(Filler)

In the case where an epoxy resin or a resol resin is used as an organic polymer in the present invention, various fillers can be added within the range not impairing the effects of the present invention. Examples of the filler include calcium carbonate powder, silica powder, wood powder, and pulp. The content of the filler is preferably in a range of 1% to 50% by mass and more preferably in a range of 5% to 30% by mass expressed in terms of solid contents. Here, these fillers need to be added under the condition in which the effects of the present invention are not impaired, the type or the amount of the filler to be added is adjusted in the case where the effects thereof are impaired.

(Additive)

For the purpose of imparting flexibility, adjusting slidability, and improving the shape of the coated surface, a plasticizer, a surfactant, and other additives can be added to the back coat layer 70 as necessary within the range not impairing the effects of the present invention.

<Plasticizer>

Examples of effective plasticizers include phthalic acid esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate, and diallyl phthalate; glycol esters such as dimethyl glycol phthalate, ethyl phthalyl ethyl glycolate, methyl phthalyl ethyl glycolate, butyl phthalyl butyl glycolate, and triethylene glycol dicaprylic acid ester; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate, and dibutyl maleate; polyglycidyl methacrylate, triethyl citrate, glycerin triacetyl ester, and butyl laurate.

The amount of the plasticizer to be added to the back coat layer 70 varies depending on the type of the organic polymer used for the back coat layer 70, but it is preferable that the plasticizer is added in a range that the glass transition temperature does not become 60° C. or lower.

<Surfactant>

Examples of the surfactant include anionic, cationic, non-ionic, and amphoteric surfactants. Specific examples thereof include non-ionic surfactants such as polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid fatty acid partial esters, polyoxyethylene sorbitol fatty acid partial esters, polyethylene glycol fatty acid esters, polyglycerin fatty acid partial esters, polyoxyethylenated castor oils, polyoxyethylene glycerin fatty acid partial esters, fatty acid diethanolamides, N,N-bis-2-hydroxyalkylamines, polyoxyethylene alkylamine, triethanolamine fatty acid ester, and trialkylamine oxide; anionic surfactants such as fatty acid salts, abietates, hydroxyalkane sulfonates, alkane sulfonates, dialkyl sulfosuccinates, linear alkyl benzene sulfonates, branched alkyl benzene sulfonates, alkyl naphthalene sulfonates, alkyl phenoxy polyoxyethylene propyl sulfonates, polyoxyethylene alkyl sulfophenyl ether salts, N-methyl-N-oleyl taurine sodium salts. N-alkyl sulfosuccinic acid monoamide disodium salts, petroleum sulfonates, sulfated beef tallow oil, sulfates of fatty acid alkyl ester, alkyl sulfates, polyoxyethylene alkyl ether sulfates, fatty acid monoglyceride sulfates, polyoxyethylene alkyl phenyl ether sulfates, polyoxyethylene styryl phenyl ether sulfates, alkyl phosphates, polyoxyethylene alkyl ether phosphates, polyoxyethylene alkyl phenyl ether phosphates, partially saponified products of a styrene/maleic anhydride copolymer, partially saponified products of an olefin/maleic anhydride copolymer, and naphthalene sulfonate formalin condensates; cationic surfactants such as alkylamine salts, quaternary ammonium salts, polyoxyethylene alkylamine salts, and polyethylene polyamine derivatives; and amphoteric surfactants such as carboxy betaines, aminocarboxylic acids, sulfobetaines, aminosulfates, and imidazolines.

The term "polyoxyethylene" in the surfactants exemplified above can be replaced with polyoxyalkylene such as polyoxymethylene, polyoxypropylene, or polyoxybutylene, and examples of the surfactants also include these surfactants.

A fluorine-based surfactant containing a perfluoroalkyl group in a molecule is more preferable as the surfactant. Examples of the fluorine-based surfactant include an anionic surfactant such as perfluoroalkyl carboxylate, perfluoroalkyl sulfonate, or perfluoroalkyl phosphoric acid ester; an amphoteric surfactant such as perfluoroalkyl betaine; a cationic surfactant such as perfluoroalkyl trimethyl ammonium salts; a non-ionic surfactant such as perfluoroalkylamine oxide, a perfluoroalkyl ethylene oxide adduct, a perfluoroalkyl group and a hydrophilic group-containing oligomer, a perfluoroalkyl group and a lipophilic group-containing oligomer, a perfluoroalkyl group, a hydrophilic group and a lipophilic group-containing oligomer, and a perfluoroalkyl group and lipophilic group-containing urethane.

The surfactants can be used alone or in combination of two or more kinds thereof, and the amount thereof to be added to the back coat layer 70 is preferably in a range of 0.001% to 10% by mass and more preferably in a range of 0.01% to 5% by mass.

<Other Additives>

A dye for coloration, a silane coupling agent, a diazo resin formed of a diazonium salt, organic phosphonic acid, organic phosphoric acid, and a cationic polymer for improving adhesion of the back coat layer 70 to the belt-like support 12, a wax which is typically used as a lubricant, higher fatty acid, higher fatty acid amide, a silicone compound formed of dimethylsiloxane, modified dimethylsiloxane, polyethylene powder, and the like can be appropriately added to the back coat layer 70. Further, carboxymethyl cellulose can be appropriately added thereto as a thickener.

As the solvent, a volatile component is preferable, and examples thereof include methyl ethyl ketone, ethylene glycol monomethyl ether, 1-methoxy-2-propanol, 2-methoxyethyl acetate, 1-methoxy-2-propyl acetate, and γ-butyllactone, but the present invention is not limited to these. These solvents can be used alone or in a mixture. The concentration of solid contents in the coating solution is preferably in a range of 1% to 50% by mass.

As illustrated in FIG. 9, the coating solution F for a stripe coated film flows through a pipe 36 by a pump 34 and is sent to the coater 18 for a stripe coated film, and the temperature thereof is adjusted to a set coating solution temperature by coating solution cooling means 22 provided in the middle of the pipe 36.

Further, the rear surface of the belt-like support 12 is coated with the coating solution F for a stripe coated film by the coater 18 for a stripe coated film such that the thickness difference between the thick film portion 62 and the thin film portion 60 which are adjacent to each other is in a range of 1 μm to 50 μm to form the stripe coated film 64 in a wet state having the surface roughness structure illustrated in FIG. 1.

In order to form the stripe coated film 64 such that the arithmetic average height Sa of the back coat layer of the planographic printing plate precursor is 0.5 μm or greater, it is preferable that the rear surface is coated with the coating solution such that the thickness difference between the thick film portion 62 and the thin film portion 60 which are adjacent to each other is in a range of 1 μm to 50 μm, in the stripe coated film 64 in a wet state before being dried.

In this coating, the surface is coated with the coating solution under coating conditions in which the viscosity of the coating solution F is in a range of 0.3 mPa·s to 100 mPa·s (hereinafter, referred to as a "viscosity condition"), the surface tension of the coating solution F is in a range of 20 mN/m to 40 mN/m (hereinafter, referred to as a "surface tension condition"), and the contact angle between the coating solution and the belt-like support 12 is in a range of 10° to 90° (hereinafter, referred to as a "contact angle condition").

Here, the three coating conditions of the "viscosity condition", the "surface tension condition", and the "contact angle condition" are prerequisites specified to achieve two purposes for "forming a stripe coated film" and "preventing formation of horn-like protrusions". The coating of the surface under the above-described three coating conditions are prerequisites for the method of producing the planographic printing plate precursor of the present invention.

In other words, in a case where the viscosity of the coating solution F is greater than 100 mPa·s, the problem of generation of horn-like protrusions 62A on the thick film portions 62 does not occur. Further, it is practically difficult to prepare a coating solution having a viscosity of less than 0.3 mPa·s. Therefore, the coating of the surface with a coating solution having a viscosity of 0.3 mPa·s to 100 mPa·s is a prerequisite for achieving the purpose of "preventing formation of horn-like protrusions".

In a case where the contact angle between the coating solution F and the belt-like support 12 is less than 10°, since the wettability becomes excellent, the stripe coated film 64 cannot be formed. Further, in a case where the contact angle therebetween is greater than 90°, the horn-like protrusions 62A are generated on the thick film portions 62 under any coating conditions or drying conditions. Therefore, the coating performed under the condition in which the contact angle between the coating solution F and the belt-like support 12 is in a range of 10° to 90° is a prerequisite for achieving two purposes of "formation of a stripe coated film" and "preventing formation of horn-like protrusions".

In a case where the surface tension is less than 20 mN/m, since the wettability becomes excellent, the stripe coated film 64 may not be formed. Further, in a case where the surface tension is greater than 40 mN/m and the viscosity and the contact angle are respectively in the above-described range, generation of the horn-like protrusions 62A on the thick film portions 62 is not constant because the horn-like protrusions 62A are generated in some cases, but are not generated in other cases under any coating conditions and drying conditions. Therefore, the coating of the surface with the coating solution F having a surface tension of 20 mN/m to 40 mN/m is a prerequisite for achieving two purposes of "formation of a stripe coated film" and "preventing formation of horn-like protrusions".

In the present embodiment, an example in which a bar coater 24 having a coating bar is used as the coater 18 for a stripe coated film for coating the stripe coated film 64 will be described. However, the method of forming the stripe coated film 64 on the belt-like support 12 is not limited to the bar coater 24, and the coated film can be applied and then formed using any system from among an ink jet printing system, a gravure printing system, a screen printing system, a spray coating system, and a slot die coating system.

Figure 10:
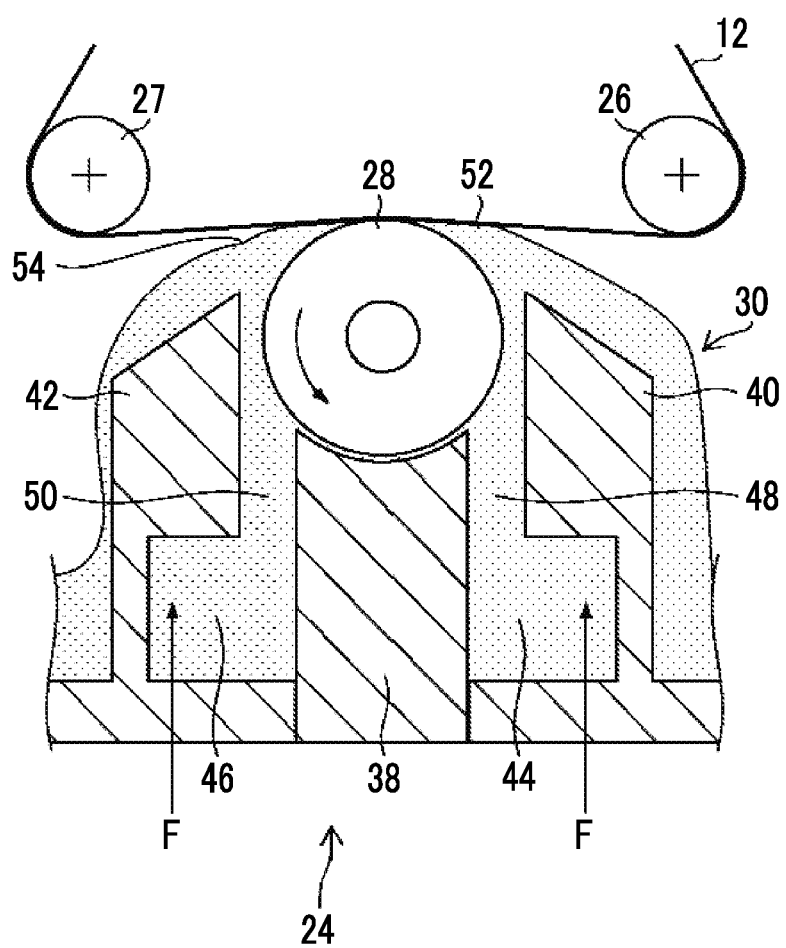
FIG. 10 is a cross-sectional view for describing a bar coating device for a stripe coated film.

As illustrated in the longitudinal cross-sectional view of FIG. 10, the bar coater 24 is a device that coats the belt-like support 12, which travels by being guided by an upstream side guide roller 26 and a downstream side guide roller 27 the coating solution F, using a coating head 30 including a coating bar 28. The upstream side guide roller 26 and the downstream side guide roller 27 are disposed such that the belt-like support 12 travels close to the coating bar 28. The upstream side guide roller 26 and the downstream side guide roller 27 are supported in a state parallel to the coating bar 28.

The coating bar 28 is rotationally driven as indicated by the arrow of FIG. 10. It is preferable that the rotation direction of the coating bar 28 is set to be a forward rotation direction with respect to the transport direction of the belt-like support 12 at a circumferential speed which is the same as the speed of the belt-like support 12. Further, coating performed by the coating bar driving in a direction opposite to the rotation direction illustrated in FIG. 10, that is, the reverse direction with respect to the transport direction and coating performed without rotational driving can be employed depending on the coating conditions.

The coating head 30 mainly includes the coating bar 28, a backup member 38, and coater blocks 40 and 42, and the coating bar 28 is rotatably supported by the backup member 38. Manifolds 44 and 46 and slots 48 and 50 are formed between the backup member 38 and each of the coater blocks 40 and 42, and the coating solution F for a stripe coated film is supplied to each of the manifolds 44 and 46.

The coating solution F supplied to each of the manifolds 44 and 46 is uniformly extruded in the width direction of the belt-like support 12 through the narrow slots 48 and 50. In this manner, an upstream side coating bead 52 is formed on the upstream side and a downstream side coating bead 54 is formed on the downstream side of the feeding direction of the belt-like support 12 with respect to the coating bar 28. The rear surface of the traveling belt-like support 12 is coated with the coating solution F through these coating beads 52 and 54.

The coating solution F excessively supplied from the manifolds 44 and 46 overflows into the space between the belt-like support 12 and each of the coater blocks 40 and 42 and is recovered through a side groove which is not illustrated in the figure. Further, the coating solution F may be supplied to the manifolds 44 and 46 from central portions or end portions of the manifolds 44 and 46.

Next, the coating bar 28 of the bar coater 24 will be described.

Figure 11:
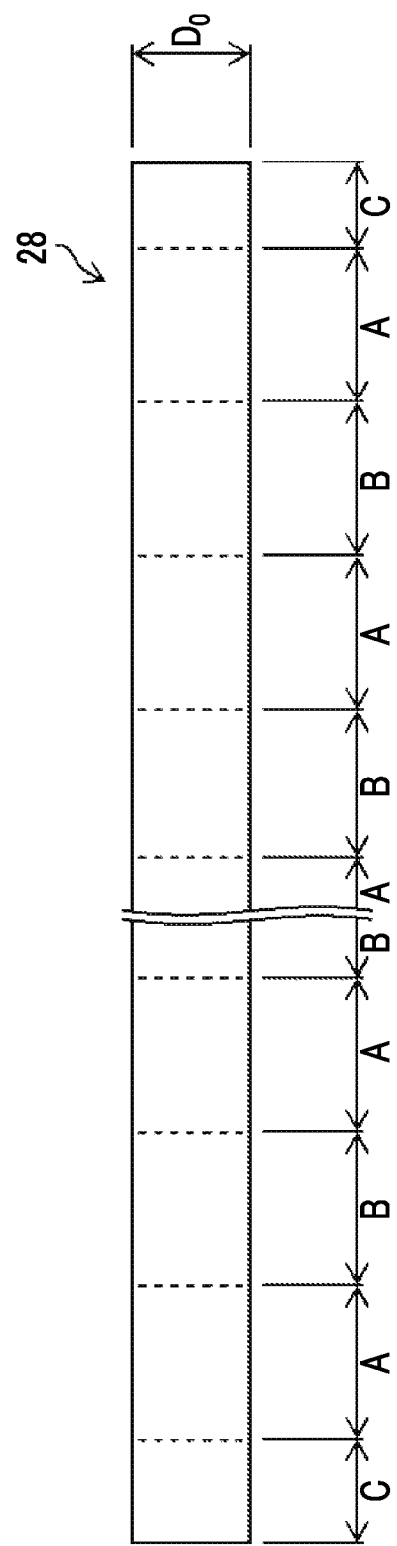
FIG. 11 is a view for describing a coating bar formed of grooved portions and groove-free portions.
Figure 12:
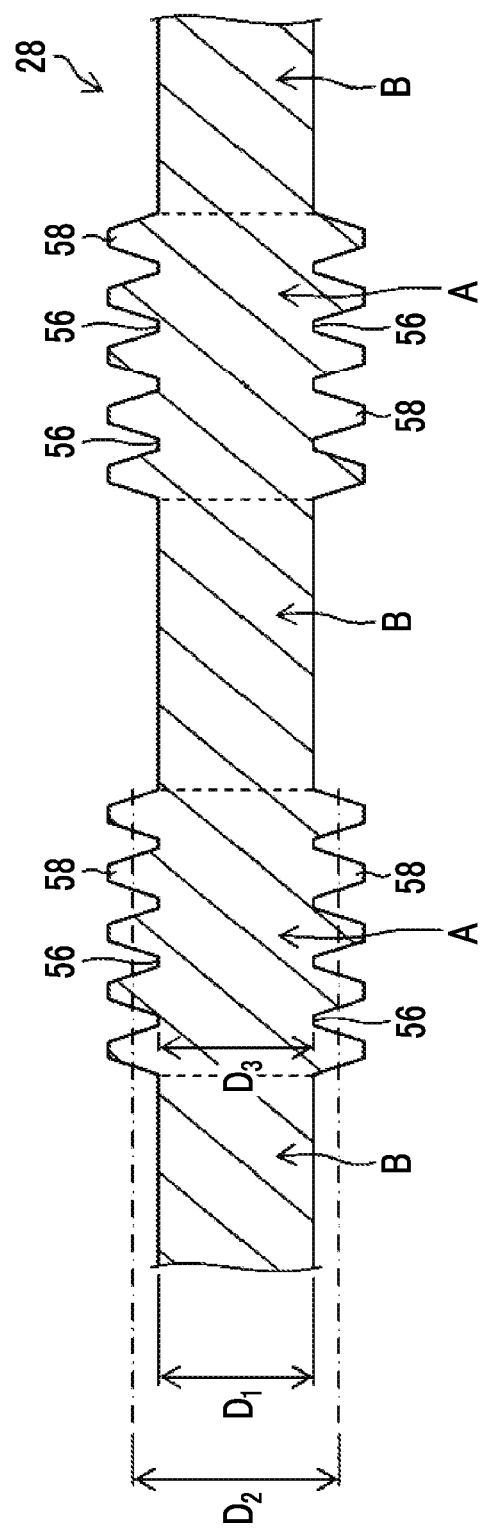
FIG. 12 is a partial cross-sectional view illustrating the coating bar of FIG. 11.
Figure 13:
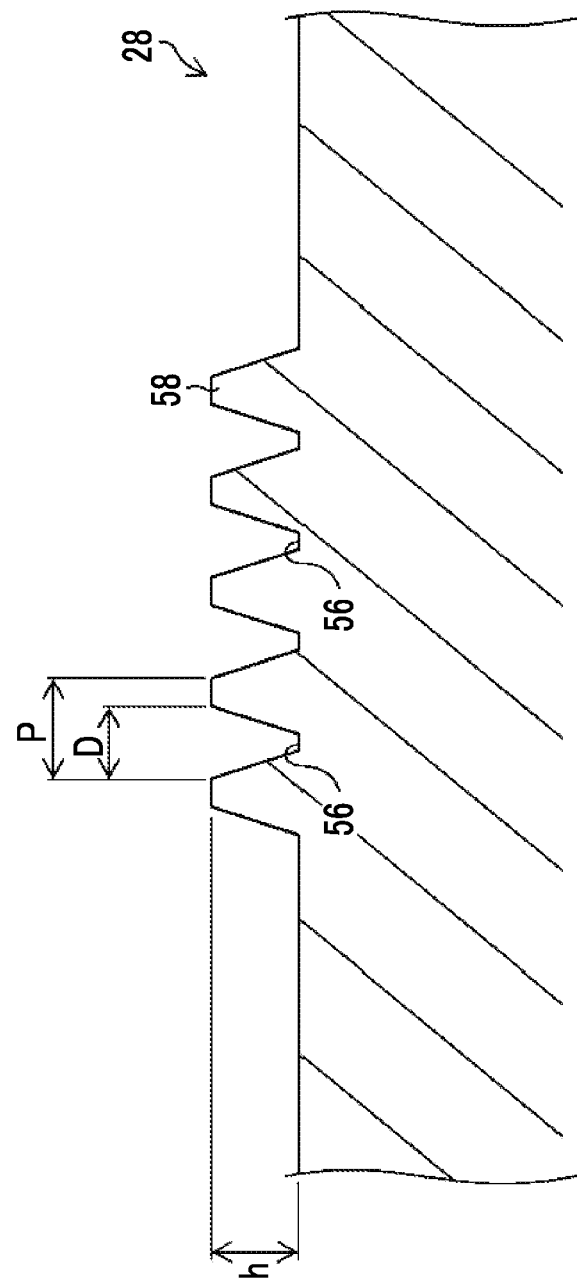
FIG. 13 is a partially enlarged cross-sectional view illustrating the coating bar of FIG. 12.

FIG. 11 is an overall view illustrating the coating bar 28. FIG. 12 is a partial cross-sectional view illustrating the coating bar 28. Further, FIG. 13 is a partially enlarged cross-sectional view illustrating the coating bar 28 of FIG. 12 by enlarging the vicinity of the surface of the bar.

As illustrated in FIG. 11, grooved portions A where grooves are formed in the circumferential direction of the bar and groove-free portions B where grooves are not formed are alternately arranged on the surface of the columnar coating bar 28 in the axial core direction (width direction of the belt-like support 12) of the coating bar 28. Further, grooves may or may not be formed in both end portions C of the coating bar 28, but a case where grooves are not formed will be described in the present embodiment.

As illustrated in FIG. 12, a groove in the grooved portion A is formed of a depression 56 and a projection 58, and the groove is formed in a trapezoidal shape. Further, the shape of the groove is not limited to the trapezoidal shape and may be a sine wave shape. It is preferable that a diameter $D_1$ of the groove-free portion B is set not to be smaller than a bar diameter (diameter of the coating bar) $D_3$ in the depression 56 of the grooved portion A. In a case where the diameter $D_1$ of the groove-free portion B is set to be smaller than the bar diameter $D_3$ of the depression 56 in the grooved portion A, the groove-free portion B is unlikely to be coated with the coating solution F at the time of coating the belt-like support 12 with the coating solution F for a stripe coated film using the coating bar 28.

Therefore, it is more preferable that the diameter $D_1$ of the groove-free portion B is set to be larger than the bar diameter $D_3$ of the depression 56 in the grooved portion A and to be smaller than an average value $D_2$ of bar diameters in depressions 56 and projections 58.

As illustrated in FIG. 13, in the depressions 56 and the projections 58 constituting the grooves of the grooved portions A, in a case where the pitch length between depressions 56 or projections 58 adjacent to each other is set as P, the depth of the depression 56 is set as h, and the opening width of the depression 56 is set as D, it is preferable that P satisfies 0.25 mm or greater, h/D is in a range of 0.01 to 0.55, and D/P is 0.49 or less. The upper limit value of the pitch length P is determined depending on the length of the thin film portion 60 or the thick film portion 62 of the stripe coated film 64 intended to be formed, but the upper limit value is preferably 10 mm or less.

In the depressions 56 and the projections 58 constituting the grooves of the grooved portions A, in a case where P satisfies 0.25 mm or greater, h/D is in a range of 0.01 to 0.55, and D/P is 0.49 or less, the stripe coated film 64 with less unevenness (coating unevenness) can be formed on the coated film surface.

As described above, by forming the coating bar 28 of the bar coater 24 to have a structure of the grooved portion A and the groove-free portion B having the above-described conditions, the stripe coated film 64 illustrated in FIG. 1 can be coated with the coating solution.

Figure 14:
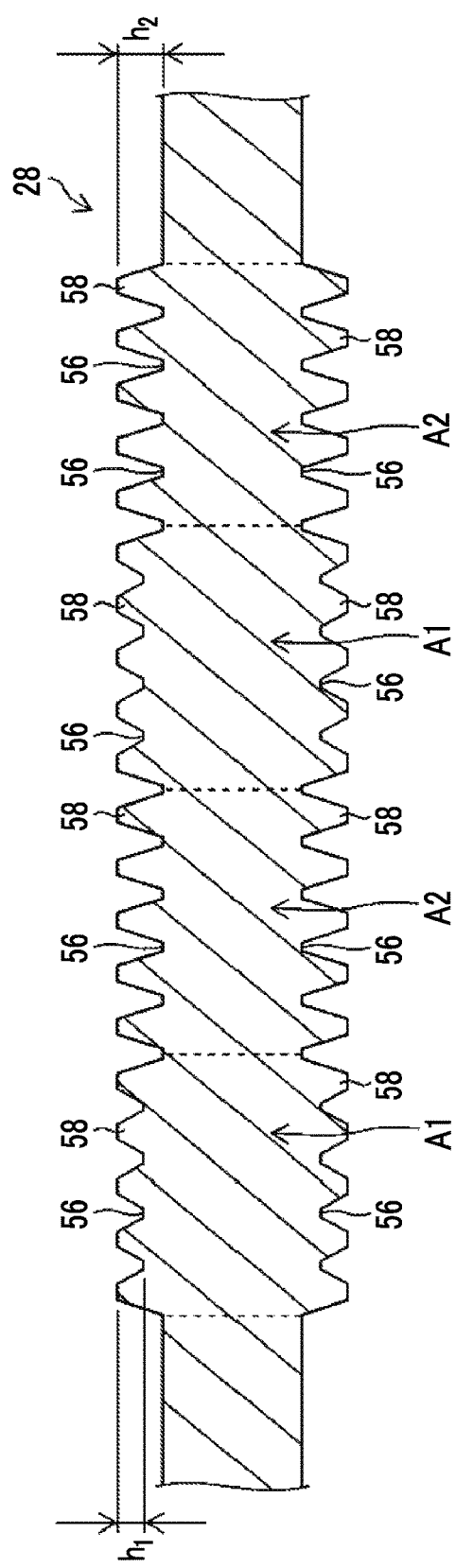
FIG. 14 is a view for describing a coating bar formed of two kinds of grooved portions with different depths of grooves.

As another aspect of the structure of the coating bar 28 for coating the stripe coated film 64, as illustrated in FIG. 14, two kinds of grooved portions A with different groove depths formed of grooved portions A1 with shallow grooves and grooved portions A2 with deep grooves can be employed. In other words, a depth $h_1$ of the depression 56 in the grooved portion A1 with shallow grooves is smaller than a depth $h_2$ of the depression 56 in the grooved portion A2 with deep grooves. Further, the projection 58 of the grooved portion A1 with shallow grooves is flush with the projection 58 of the grooved portion A2 with deep grooves. The depths of two kinds of grooves in the grooved portion A1 with shallow grooves and the grooved portion A2 with deep grooves can be set according to the film thicknesses of the thin film portion 60 and the thick film portion 62 to be formed.

The method of forming grooves in the surface of the coating bar 28 is not particularly limited, and various processing methods can be used. Preferred examples thereof include cutting processing, rolling processing, and laser processing.

Further, it is preferable that the stripe coated film is coated with the coating solution F for a stripe coated film using the coating bar 28 having a diameter $D_0$ (see FIG. 11) of 6 mm to 50 mm and the relationship between the rotation speed r of the coating bar 28 and the viscosity η of the above-described coating solution F satisfies Formula (3). The diameter $D_0$ of the coating bar 28 is more preferably in a range of 6 mm to 20 mm.

$$r < 65714 = \eta^{-1.122} \quad \text{Formula (3)}$$

In this manner, mixture of foams (bubbles) due to the ration of the coating bar 28 can be prevented at the time of coating the belt-like support 12 with the coating solution F for a stripe coated film using the coating bar 28, and thus the clean stripe coated film 64 can be applied and formed.

Figure 15:
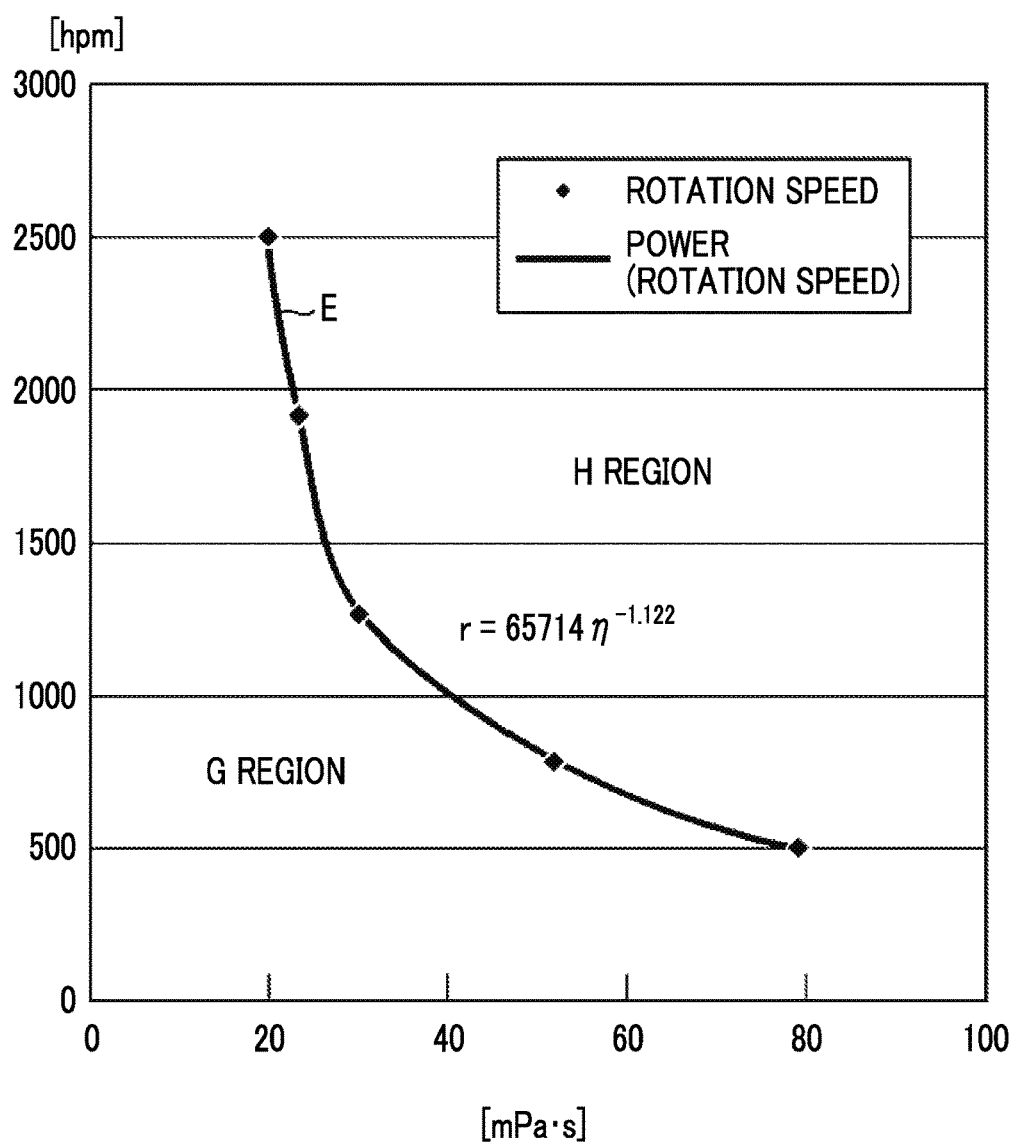
FIG. 15 is a graph showing the relationship among the rotation speed of a coating bar, the viscosity of a coating solution, and mixture of foams.

FIG. 15 shows test results obtained by investigating the influence of the relationship, between the rotation speed r of the coating bar 28 and the viscosity q of the above-described coating solution F, on the mixture of foams.

The curve of FIG. 15 is a foam mixture limit curve E showing that foams are not mixed into the coating solution F of the stripe coated film and can be represented by Formula (4).

$$r = 65714 \eta^{-1.122} \quad \text{Formula (4)}$$

A region on the lower side of the foam mixture limit curve E is a region (G region) where foams are not mixed, and a region on the upper side of the foam mixture limit curve is a region (H region) where foams are mixed. In other words, in a case where the viscosity η (horizontal axis) is small, foams are not mixed unless the rotation speed r (vertical axis) of the coating bar 28 is increased. Further, in a case where the viscosity η is large, foams are mixed even in a case where the rotation speed r of the coating bar 28 is set to be small.

Therefore, mixture of foams (bubbles) due to the rotation of the coating bar 28 can be prevented by satisfying the inequality of Formula 3 that shows the G region on the lower side of the foam mixture limit curve E.

(Step of Drying Stripe Coated Film)

Next, the stripe coated film 64 in a wet state which has been formed on the rear surface of the belt-like support 12 is dried using the dryer 20 for a stripe coated film to form the stripe coated film 64 (hereinafter, also referred to as a "dry film") in a dry state.

The dryer 20 for a stripe coated film can be operated according to various drying systems such as a hot air system of blowing hot air to the stripe coated film 64 in a wet state, a heater heating system of performing drying using a heater of infrared rays or the like, a heating roll system of bringing a heating roll into contact with the belt-like support 12, and a condensation drying system of performing drying using a condensation plate. Among these, a hot air system is particularly preferable.

Figure 16:
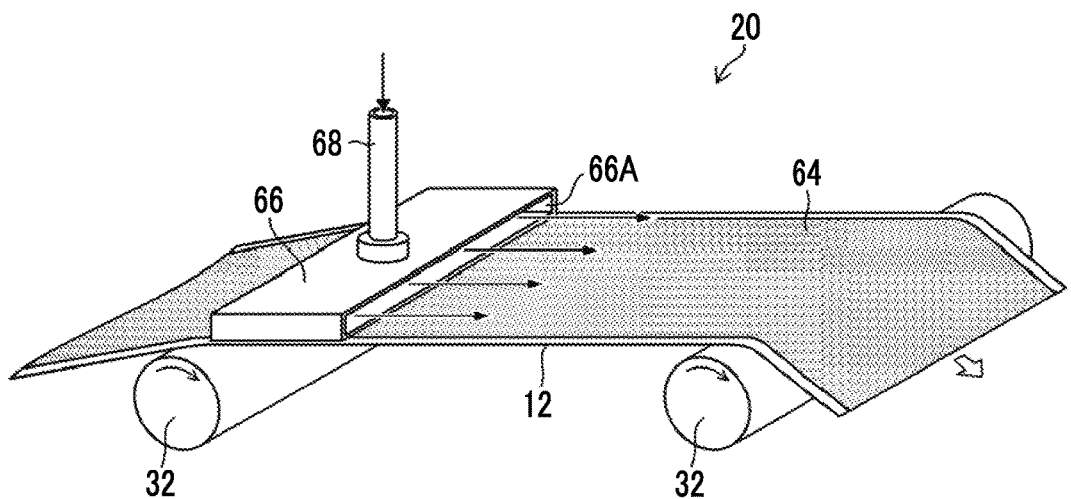
FIG. 16 is a view for describing a dryer for a stripe coated film.

FIG. 16 illustrates an example of the dryer 20 for a stripe coated film having a hot air system, and the casing of the dryer is not illustrated.

As illustrated in FIG. 16, a rectangular nozzle 66 is provided in the vicinity of the film surface of the stripe coated film 64 applied to the rear surface of the belt-like support 12. A pipe 68 connected to a dry wind supply device (not illustrated) that blows hot dry wind is connected to the nozzle 66, and dry wind is blown out from a slit-like outlet 66A in parallel with the film surface of the stripe coated film 64 and in the transport direction or in the direction opposite to the transport direction of the belt-like support 12.

As described above, since the dry wind flows in parallel with the thick film portions 62 and the thin film portions 60 of the stripe coated film 64 by sending the dry wind along the transport direction of the belt-like support 12, the coated film surface can be dried in a short time without generating unevenness (dry unevenness) thereon. In order to dry the stripe coated film 64 in a short time, it is preferable to control the humidity contained in the dry wind in addition to control of the temperature or the wind speed of the dry wind. For example, it is preferable that the film surface is dried in heated air, for example, at a temperature of 100° C. or higher and a dew point of 5° C. to 20° C.

In this case, it is preferable that a parallel wind component of the dry wind blown out from the nozzle 66 to the coated film surface is less than or equal to a relative wind speed of 30 m/s. In a case where the parallel wind component of the dry wind to the coated film surface is greater than a relative wind speed of 30 m/s, unevenness (dry unevenness) easily occurs on the coated film surface of the stripe coated film 64. Here, the relative wind speed is a wind speed obtained based on the relative relationship with the transport speed of the belt-like support 12.

Moreover, in the drying of the stripe coated film 64, it is necessary that a drying point (t) at the time of drying the stripe coated film 64 in a wet state to form the stripe coated film 64 in a dry state satisfies Formulae 1 and 2.

The drying point indicates the time point at which the stripe coated film 64 applied to the belt-like support 12 enters a dry state in which the surface gloss of the stripe coated film 64 is not changed any more, and the drying time from the start of drying to the drying point can be known. Specifically, the drying point is a critical point of transition from a constant rate drying period to a falling rate drying period and also indicates the time point at which the viscosity of the stripe coated film 64 becomes 1 Pa·s or greater and the shapes of the thin film portion 60 and the thick film portion 62 constituting the stripe coated film 64 are fixed.

$$t < \frac{0.033 \times \lambda^4 \times \eta}{\sigma \times X^3} \log \frac{Z_0}{Z_t} \quad \text{(Formula 1)}$$

Here, respective parameters in Formula 1 are as follows and some parameters will be described with reference to FIG. 4. Further, the "initial" in the description indicates the time point of starting drying, and the stripe coated film 64 enters a wet state. Further, the "dry film" indicates the stripe coated film 64 that has been dried and enters a dry state.

t . . . time (s) taken to drying point
X . . . initial average film thickness (m) (average film thickness of thick film portions 62 and thin film portions 60 of FIG. 2 at time point of starting drying)
$\eta$ . . . viscosity (Pa·s) of coating solution F for stripe coated film
$\lambda$ . . . pitch (m) of stripe coated film (distance between thick film portions 62 or thin film portions 60 of FIG. 2 at time point of starting drying)
$Z_0$ . . . difference (m) in initial film thickness (difference in film thickness between thick film portion 62 and thin film portion 60 of FIG. 2 at time point of starting drying)
$Z_t$ . . . difference (m) in dry film thickness (difference in film thickness between thick film portion 62 and thin film portion 60 of FIG. 2 in dry state)
$\sigma$ . . . surface tension (N/m) of coating solution F for stripe coated film Further, the above-described respective parameters can be measured according to the following method.

Initial average film thickness and difference in initial film thickness . . . film thickness measuring device (Si series) (manufactured by KEYENCE CORPORATION)
Viscosity . . . B type viscometer
Width of stripe . . . optical microscope
Difference in dry film thickness . . . electron microscope
Surface tension . . . Wilhelmy method performed using automatic surface tensiometer DY200 (manufactured by Kyowa Interface Science Co., Ltd.)
Contact angle . . . handy contact meter MSA (manufactured by KRUSS GmbH)

Formula 1 is a formula (hereinafter, referred to as a "condition for forming a stripe coated film") for obtaining the stripe coated film 64 which is intended to be formed and has a difference in film thickness in a dry state using a leveling formula of Orchard related to the leveling of a coating solution, by setting the time point to the drying point (t) before the thick film portions 62 and the thin film portions 60 are leveled to be flat in a case where the stripe coated film 64 in a wet state is applied and formed on the belt-like support 12.

In other words, the parameters (X, $\lambda$, $Z_0$) related to the shape of the stripe coated film 64 in a wet state, the physical properties ($\eta$, $\sigma$) of the coating solution, and the difference ($Z_t$) in film thickness of the stripe coated film 64 which is intended to be formed in a dry state are substituted on the right side of Formula 1. In this manner, the leveling between the thick film portions 62 and the thin film portions 60 progresses, and the drying time until the difference in thickness of a film intended to be formed is eliminated can be acquired. Therefore, in a case where the drying time taken to the drying point (t) at which the shapes of the thin film portion 60 and the thick film portion 62 constituting the stripe coated film 64 are fixed is shorter than the acquired drying time, the stripe coated film 64 with the difference in film thickness which is intended to be formed can be obtained from the inequality of Formula 1.

Further, 0.033 which is the constant used in Formula 1 is fitted from a test so as to satisfy the conditions for parameters and thus is different from the constant of the leveling formula of Orchard.

Next, Formula 2 will be described.

$$t < 3.3 \times 10^9 \frac{Z_0 \times \eta \times W}{\sigma} < \frac{X \times \eta}{Pe} \quad \text{(Formula 2)}$$

Here, among the parameters of Formula 2, the parameters which are not present in Formula 1 are as follows.
Pe (Peclet number) . . . $1.5 \times 10^{-6}$ from test
W . . . width (m) of stripe
Further, Pe (Peclet number) is a numerical value obtained by dividing a drying speed by a diffusion coefficient of a coating solution, and $1.5 \times 10^{-6}$ which is the constant of the Peclet number is based on the test results.

Further, $3.3 \times 10^9$ which is the constant of Formula 2 is obtained based on test data and will be described in detail in the example described below.

Formula 2 defines the condition in which the horn-like protrusion 62A is formed on both ends of the thick film portion 62 in the width direction and shows the relationship of three formulae, which are the left side formula, the central formula, and the right side formula, using an inequality (hereinafter, referred to as a "condition for preventing formation of horn-like protrusions").

Here, the mechanism for forming the horn-like protrusion 62A on both ends of the thick film portion 62 in the width direction will be described with reference to the schematic views of FIGS. 17A to 17E.

Figure 17A:
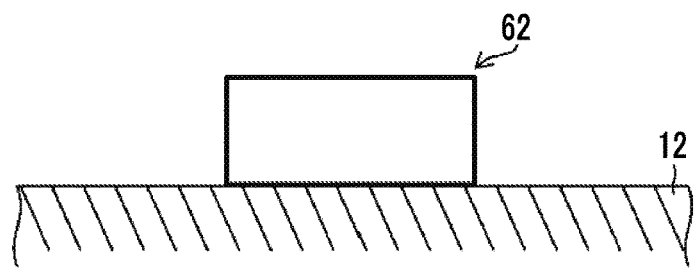
FIG. 17A is a view for describing a first step of a mechanism for generating horn-like protrusions.
Figure 17B:
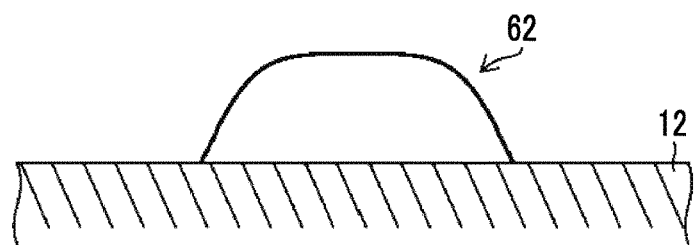
FIG. 17B is a view for describing a second step of the mechanism for generating horn-like protrusions.
Figure 17C:
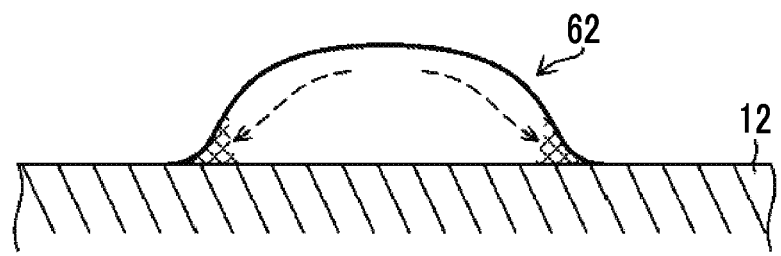
FIG. 17C is a view for describing a third step of the mechanism for generating horn-like protrusions.
Figure 17D:
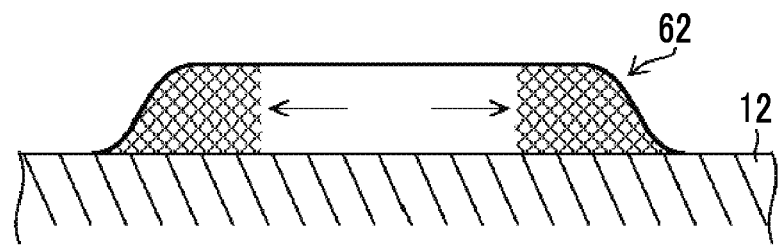
FIG. 17D is a view for describing a fourth step of the mechanism for generating horn-like protrusions.
Figure 17E:
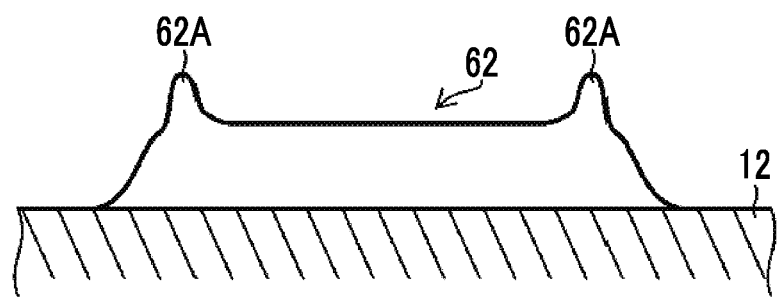
FIG. 17E is a view for describing a fifth step of the mechanism for generating horn-like protrusions.

FIG. 17A illustrates the thick film portion 62 of the stripe coated film 64 in a wet state immediately after being applied on the belt-like support 12. The thick film portion 62 immediately after being applied has a rectangular shape since the leveling has not occurred yet. The thick film portion 62 in this rectangular shape has a mountain shape whose skirt portions are expanded as illustrated in FIG. 17B due to the progression of leveling with time. Further, the concentration of the skirt portions at both ends of the thick film portion 62 in the width direction becomes higher than the concentration of the central portion thereof due to the surface tension gradient occurring inside the thick film portion 62 as illustrated in FIG. 17C. The portion with a high concentration is indicated by the net shape. In this manner, as illustrated in FIG. 17D, a phenomenon in which a liquid flows toward the both end portion from the central portion in the arrow direction occurs in the thick film portion 62. As the result, both end portions of the thick film portion 62 in the width direction are bulged to form the horn-like protrusions 62A as illustrated in FIG. 17E.

The relationship between the left side formula and the right side formula (left side formula<right side formula) in Formula 2 shows the condition in which the surface tension gradient is generated in the thick film portion 62 of the stripe coated film 64 and the driving force for collecting the liquid inside the thick film portion 62 in the end portions is generated.

In Formula 2, the relationship between the left side formula and the central formula (left side formula<central formula) shows that horn-like protrusions are not generated under conditions in which (a) the resistance at the time of movement of the liquid is large, (b) the driving force itself is weak, and (c) the time for movement is short even in a case where the driving force (right side formula) for collecting the liquid inside the thick film portion 62 in the end portions is activated.

In other words, it can be said that the horn-like protrusions 62A are not generated on both end portions of the belt-like thick film portion 62 in the width direction in a case where the stripe coated film 64 is dried up to the drying point (t) by at least one action of (a) to (c) described above before the horn-like protrusions 62A are generated due to the driving force in the right side formula.

For example, the horn-like protrusions 62A are not generated in a case where the stripe coated film is dried up to the drying point in a short time before the horn-like protrusions 62A are generated due to the driving force.

Therefore, it is preferable that the coater 18 for a stripe coated film and the dryer 20 for a stripe coated film illustrated in FIG. 9 are disposed as close to each other as possible and the coated film is dried at a high speed.

In this manner, by satisfying Formula 2, the stripe coated film 64 can be dried so that the horn-like protrusions 62A are not formed on both ends of the belt-like thick film portion 62 in the width direction.

The time for drying the stripe coated film 64 needs to satisfy Formulae 1 and 2 in consideration of the productivity and is preferably 20 seconds or shorter and more preferably 10 seconds or shorter.

As described above, in the method of producing the planographic printing plate precursor according to the present embodiment of the present invention, even in a case where the coating is performed in the coating step of forming the stripe coated film 64 under the coating conditions of the above-described "viscosity condition", the "surface tension condition", and the "contact angle condition" which are prerequisites for achieving the purpose of the present invention, the back coat layer 70 which has a surface roughness structure of the stripe coated film 64 in which the belt-like thin film portions 60 and the belt-like thick film portions 62 are alternately and continuously arranged on the belt-like support 12 and has an arithmetic average height Sa of 0.5 μm or greater in which horn-like protrusions 62A are not formed on both ends of the thick film portion 62 in the width direction can be formed in a case where the "condition for forming a stripe coated film" of Formula 1 and the "condition for preventing formation of horn-like protrusions" of Formula 2 are satisfied in the drying step.

In this manner, in the planographic printing plate precursor including the belt-like support 12 and a polymer layer on the surface of the belt-like support, it is possible to produce a planographic printing plate precursor that includes the back coat layer 70 having an arithmetic average height Sa of 0.5 μm or greater due to the surface roughness structure of the stripe coated film 64 in which the thin film portions 60 and the thick film portions 62 are continuously formed on a rear surface of the belt-like support 12.

Next, a method of forming the back coat layer 70 having a surface roughness structure of the dot coated film 72 and a method of forming the back coat layer 70 having a surface roughness structure of the dashed line coated film 74 will be described. Further, the description of the parts which are the same as in the formation of the back coat layer 70 having the surface roughness structure of the stripe coated film 64 will not be provided.

(Method of Forming Dot Coated Film)

The film will be formed in the following manner in a case of forming the back coat layer 70 having a surface roughness structure of the dot coated film 72 in which the thin film portions 60 and the thick film portions 62 are continuously formed on the rear surface of the belt-like support 12.

In the coating step for the dot coated film 72, first, a first coating step of solid-coating the entire rear surface of the belt-like support 12 with the coating solution F to form flat thin film portions 60 is performed. Here, the ear portions 12A of the belt-like support 12 may remain uncoated.

As the coating device that solid-coats the surface with the coating solution F, various coating devices having a slot coating system, an extrusion coating system, a slide bead coating system, a roll coating system, and the like can be used.

Next, a second coating step of coating the thin film portions 60, which has been coated with the coating solution F to be flat, with the coating solution F which is the same solution applied to the thin film portions 60 described above to have a dot shape as illustrated in FIG. 3 to form the thick film portions 62. In this case, the dot coated film 72 in a wet state is formed by performing the coating such that a difference in thickness between the thin film portion 60 and the thick film portion 62 is set to be in a range of 1 µm to 50 µm.

As the coating device that coats the surface in a dot shape, coating devices having an ink jet printing system and a screen printing system can be suitably used. A coating device having a screen printing system is particularly preferable.

Further, the coating conditions for forming the dot coated film 72 are the same as the "viscosity condition", the "surface tension condition", and the "contact angle condition" which are the conditions for forming the stripe coated film 64.

Further, the drying conditions for drying the dot coated film 72 are the same as the conditions for satisfying Formula 1, Formula 2, and the relative wind speed of the dry wind which are the conditions for drying the stripe coated film 64.

In this manner, in the planographic printing plate precursor including the belt-like support 12 and a polymer layer on the surface of the belt-like support, it is possible to produce a planographic printing plate precursor that includes the back coat layer 70 having an arithmetic average height Sa of 0.5 µm or greater due to the surface roughness structure of the dot coated film 72 in which the thin film portions 60 and the thick film portions 62 are continuously formed on a rear surface of the belt-like support 12.

(Method of Forming Dashed Line Coated Film)

The film will be formed in the following manner in a case of forming the back coat layer 70 having a surface roughness structure of the dashed line coated film 74 in which the thin film portions 60 and the thick film portions 62 are continuously formed on the rear surface of the belt-like support 12.

In the coating step for the dashed line coated film 74, first, a first coating step of solid-coating the entire rear surface of the belt-like support 12 with the coating solution F to form flat thin film portions 60 is performed. Here, the ear portions 12A of the belt-like support 12 may remain uncoated.

As the coating device that solid-coats the surface with the coating solution F, various coating devices having a slot coating system, an extrusion coating system, a slide bead coating system, a roll coating system, and the like can be used.

Next, a second coating step of coating the thin film portions 60, which has been coated with the coating solution F to be flat, with the coating solution F which is the same solution applied to the thin film portions 60 described above to have a dashed line shape as illustrated in FIG. 5 to form the thick film portions 62. In this case, the dashed line coated film 74 in a wet state is formed by performing the coating such that a difference in thickness between the thin film portion 60 and the thick film portion 62 is set to be in a range of 1 µm to 50 µm.

As the coating device that coats the surface in a dashed line shape, coating devices having an ink jet printing system and a screen printing system, similar to the dot coated film 72, can be suitably used. A coating device having a screen printing system is particularly preferable.

Further, the coating conditions for forming the dashed line coated film 74 are the same as the "viscosity condition", the "surface tension condition", and the "contact angle condition" which are the conditions for forming the stripe coated film 64.

Further, the drying conditions for drying the dashed line coated film 74 are the same as the conditions for satisfying Formula 1, Formula 2, and the relative wind speed of the dry wind which are the conditions for drying the stripe coated film 64.

In this manner, in the planographic printing plate precursor including the belt-like support 12 and a polymer layer on the surface of the belt-like support, it is possible to produce a planographic printing plate precursor that includes the back coat layer 70 having an arithmetic average height Sa of 0.5 µm or greater due to the surface roughness structure of the dashed line coated film 74 in which the thin film portions 60 and the thick film portions 62 are continuously formed on a rear surface of the belt-like support 12.

[Laminate]

A laminate according to the embodiment of the present invention is formed by cutting the belt-like planographic printing plate precursor produced in the above-described manner into a predetermined size and laminating a plurality of sheets (for example, approximately 10) sheets).

In other words, the laminate according to the embodiment of the present invention is formed by laminating a plurality of planographic printing plate precursors respectively including a polymer layer on the surface of the support, having a surface roughness structure in which the belt-like thin film portions 60 and the belt-like thick film portions 62 are continuously and alternately formed on a rear surface of the support, and including the back coat layer 70 having an arithmetic average height Sa of 0.5 µm or greater. The laminate is packaged in this state and delivered to users.

Further, the planographic printing plate precursors according to the embodiment of the present invention to be laminated respectively satisfy two constituent elements, which are the surface roughness structure (constituent element A) in which the thin film portions 60 and the thick film portions 62 are continuously formed on a rear surface of the belt-like support 12 and the back coat layer having an arithmetic average height Sa of 0.5 µm or greater (constituent element B) due to the surface roughness structure.

In this manner, in a case where the planographic printing plate precursors according to the embodiment of the present invention are laminated to form the laminate, all purposes of 1) preventing scraping and peeling between planographic printing plate precursors, 2) preventing adhesion between planographic printing plate precursors, 3) imparting a plate-separating property for preventing multiple-plate feeding in a plate-making step of taking out planographic printing plate precursors from the laminate one by one, and 4) preventing scratches on a surface of a planographic printing plate precursor on a recording layer side, which are required for elimination of interleaving paper, can be satisfied. This will be described in detail in the fourth example in the section of examples.

Therefore, elimination of interleaving paper can be realized through a planographic printing plate precursor produced by the planographic printing plate precursor according to the embodiment of the present invention.

Further, the above-described method of producing the planographic printing plate precursor according to the embodiment of the present invention is not limited to the production of the planographic printing plate precursor and can be applied in a case of producing a coated film structure which includes a functional layer on the surface of a support and a back coat layer on the rear surface of the support. Here, the coated film structure indicates a structure obtained by combining a support and a coated film formed on the support.

Therefore, at the time of lamination of coated film structures, the surface or the rear surface of each coated film structure is not damaged, and deterioration of the appearance caused by thickening of a part of a roll at the time of winding does not occur. Such effects are provided by the present invention.

EXAMPLES

Hereinafter, the present invention will be described in more detail based on the following examples.

First, a confirmation test for confirming basic confirmation items of the following a) to e) in the method of producing the planographic printing plate precursor according to the present invention was performed by actually producing a planographic printing plate precursor including a back coat layer of a stripe coated film.

a) The stripe coated film 64 free of horn-like protrusions 62A can be formed by satisfying Formula 1 and Formula 2.

b) The relationship between the relative wind speed of dry wind and the dry unevenness of the stripe coated film.

c) The relationship between the thick film portion contact area ratio, the thick film portion width, and the distance (pitch) between thick film portions of the stripe coated film and the adsorptivity or stain of the planographic printing plate precursor.

d) The relationship between the rotation speed of the coating bar used for applying and forming the stripe coated film and the mixture of foams into the coating solution.

e) The relationship between continuous formation and discontinuous formation (uncoated portions are present) of the stripe coated film and damage to the planographic printing plate precursor at the time of formation of the laminate.

In addition, after the above-described basic confirmation items were confirmed, the relationship between the arithmetic average height Sa of the back coat layer and the following purposes 1) to 4) required for elimination of interleaving paper was investigated by changing the type of the polymer layer on the surface of the support or the kind of the resin or the surface roughness structure of the back coat layer on the rear surface of the support.

1) Prevention of scraping and peeling between planographic printing plate precursors (hereinafter, referred to as "scraping and peeling").

2) Prevention of adhesion between planographic printing plate precursors (hereinafter, referred to as "adhesiveness").

3) Imparting of a plate-separating property for preventing multiple-plate feeding in a plate-making step of taking out planographic printing plate precursors from the laminate one by one (hereinafter, referred to as "imparting a plate-separating property").

4) Prevention of scratches on a surface of a planographic printing plate precursor on a recording layer side (hereinafter, referred to as "scratches").

First Example

In the first example, a planographic printing plate precursor was produced by coating the rear surface of the belt-like support 12, having a polymer layer for an untreated plate on the surface thereof, with a coating solution for a stripe coated film under the following conditions and drying the surface.

<<Formation of Polymer Layer for Untreated Plate>>

The polymer layer for an untreated plate was formed as a three-layer structure of an undercoat layer, an image recording layer, and a protective layer in the following manner.

<Formation of Undercoat Layer>

The surface of the belt-like support 12 was coated with an undercoat layer coating solution having the following composition such that the drying coating amount was set to 20 mg/m², thereby forming an undercoat layer.

| | |
|---|---|
| Compound (UC-1) for undercoat layer (Chemical Formula 1 shown below) | 0.18 g |
| Hydroxyethyl imino diacetic acid | 0.05 g |
| Surfactant (EMALEX 710, manufactured by Nihon Emulsion Co., Ltd.) | 0.03 g |
| Water | 28.0 g |

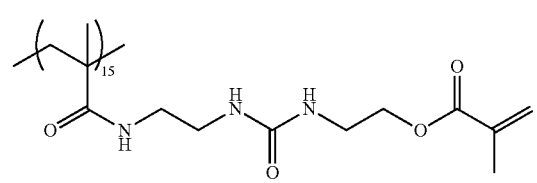

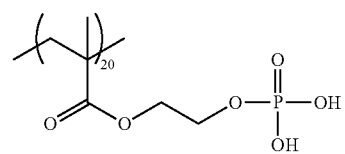

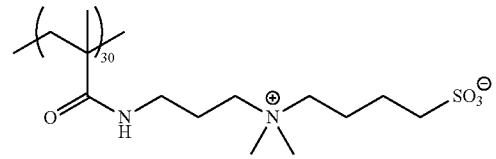

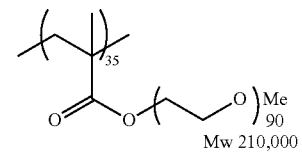

Mw 210,000

Compound (UC-1) for undercoat layer (Formation of Image Recording Layer)

The undercoat layer was bar-coated with an image recording layer coating solution with the following composition and dried in an oven at 100° for 60 seconds, thereby forming an image recording layer having a drying coating amount of 1.0 g/m².

The image recording layer coating solution was obtained by mixing a photosensitive solution and a microgel solution described below immediately before the coating and then stirring the solution.

<<Image Recording Layer Coating Solution>>

| <Composition of photosensitive solution> | |
|---|---|
| Binder polymer (Chemical Formula 2 shown below) (weight-average molecular weight Mw: 55,000 and n (number of EO units): 2) | 0.240 g |
| Infrared absorbing agent (Chemical Formula 3 shown below) | 0.020 g |
| Borate compound (Sodium tetraphenyl borate) | 0.010 g |
| Polymerization initiator (Chemical Formula 3 shown below) | 0.162 g |

-continued

| | |
|---|---|
| Polymerizable compound Tris(acryloyloxyethyl) isocyanurate (NK ESTER A-9300, manufactured by Shin-Nakamura Chemical Co., Ltd.) | 0.192 g |
| Anionic surfactant (Chemical Formula 3 shown below) | 0.050 g |
| Fluorine-based surfactant (Chemical Formula 3 shown below) | 0.008 g |
| 2-Butanone | 1.091 g |
| 1-Methoxy-2-propanol | 8.609 g |
| <Composition of microgel solution> | |
| Microgel | 2.640 g |
| Distilled water | 2.425 g |

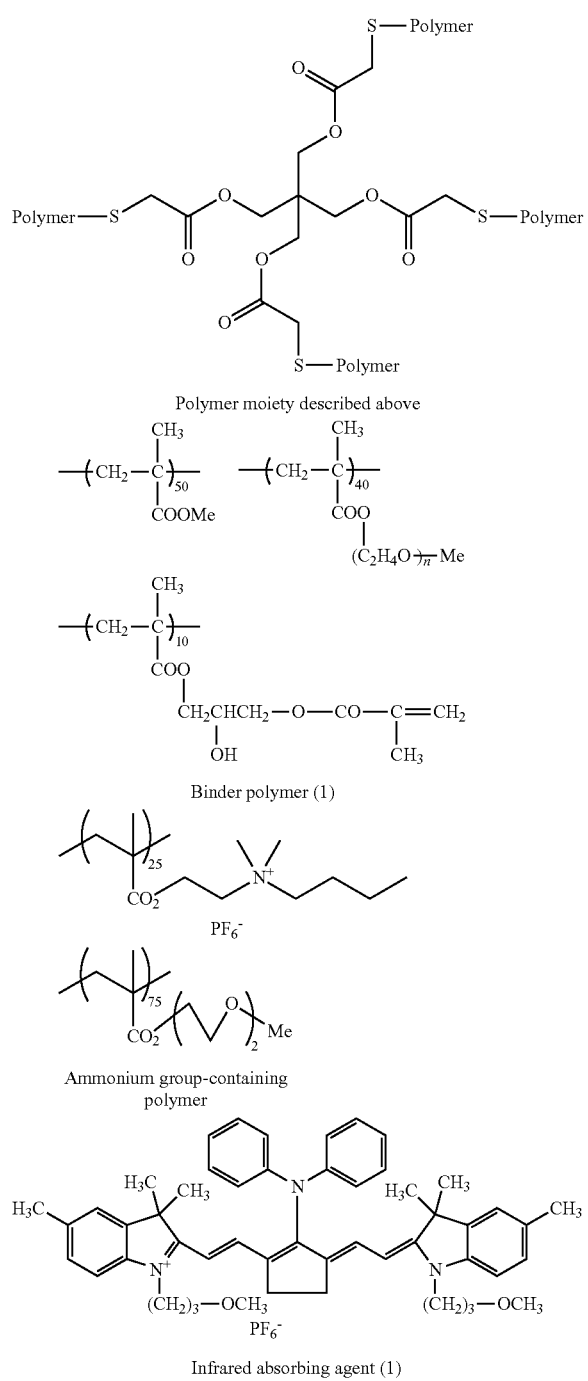

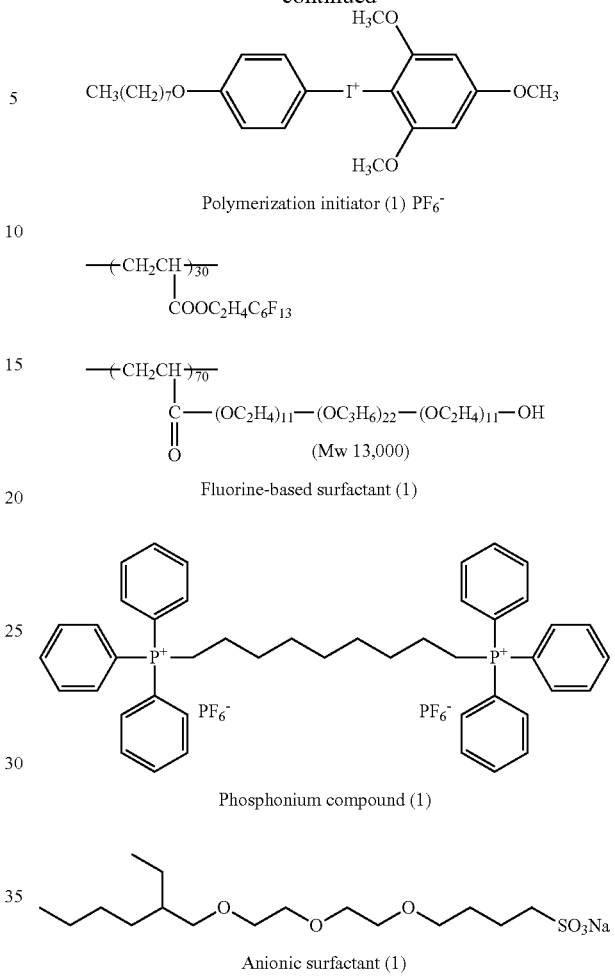

<<Preparation of Microgel>>

As oil phase components, 10 g of an adduct (50% by mass of ethyl acetate solution, manufactured by Mitsui Chemical, Inc.) formed by adding 4.46 g of polyfunctional isocyanate (75 mass % ethyl acetate solution, manufactured by Mitsui Chemical, Inc.) shown in Chemical Formula 4, trimethylolpropane (6 mol), and xylene diisocyanate (18 mol), and adding methyl one-terminal polyoxyethylene (1 mol, repetition number of oxyethylene units: 90), 3.15 g of pentaerythritol triacrylate (SR444, manufactured by Nippon Kayaku Co., Ltd.), and 0.1 g of PIONINE A-41C (manufactured by TAKEMOTO OIL & FAT Co., Ltd.) were dissolved in 17 g of ethyl acetate. As water phase components, 40 g of a 4 mass % aqueous solution of polyvinyl alcohol (PVA-205, manufactured by KURARAY CO., LTD.) was prepared. The oil phase components and the water phase components were mixed with each other and emulsified at 12,000 rpm for 10 minutes using a homogenizer, 25 g of distilled water was added to the obtained emulsion, and the resultant was stirred at room temperature for 30 minutes and stirred at 50° C. for 3 hours. The microgel solution obtained in this manner was diluted with distilled water such that the concentration of solid contents was set to 15% by mass, thereby preparing a microgel. The average particle diameter of the microgel measured by a light scattering method was 0.2 μm.

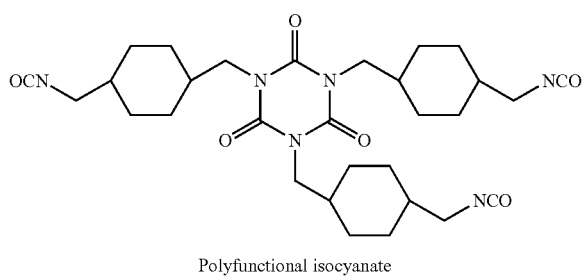

Polyfunctional isocyanate (Formation of Protective Layer)

The image recording layer was bar-coated with a protective layer coating solution with the following composition and dried in an oven at 120° for 60 seconds to form a protective layer having a drying coating amount of 0.15 g/m², thereby preparing a planographic printing plate precursor.

| <<Composition of coating solution of protective layer>> | |
|---|---|
| Inorganic layered compound dispersion liquid (described in detail below) | 1.5 g |
| Hydrophilic polymer (Chemical Formula 5 shown below, Mw: 30,000) (solid content) | 0.03 g |
| Polyvinyl alcohol 6 mass % aqueous solution of (CKS50, manufactured by Nippon Synthetic Chemical Industry Co., Ltd., sulfonic acid-modified, saponification degree: 99% by mole or greater, degree of polymerization: 300) | 0.10 g |
| Polyvinyl alcohol 6 mass % aqueous solution of (PVA-405, manufactured by KURARAY CO., LTD., saponification degree: 81.5% by mole, degree of polymerization: 500) | 0.03 g |
| Surfactant (EMALEX 710, manufactured by Nihon Emulsion Co., Ltd.) (Chemical Formula 5: 1 mass % aqueous solution) | 0.86 g |
| Ion exchange water | 6.0 g |

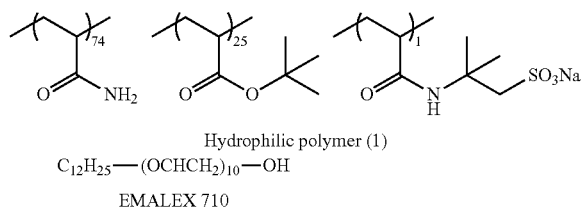

Hydrophilic polymer (1)

$C_{12}H_{25}$—$(OCHCH_2)_{10}$—OH

EMALEX 710

<Preparation of Inorganic Layered Compound Dispersion Liquid>

6.4 g of synthetic mica Somasif ME-100 (manufactured by CO-OP CHEMICAL CO., LTD.) was added to 193.6 g of ion exchange water and dispersed such that the volume average particle diameter (laser scattering method) was set to 3 μm using a homogenizer. The aspect ratio of the obtained dispersed particles was 100 or greater.

<<Formation of Back Coat Layer>>

The back coat layer 70 was formed as follows.

| (Composition of coating solution for stripe coated film) | |
|---|---|
| Epoxy resin (JER1009: manufactured by Japan Epoxy Resin Co., Ltd.) | 0.80 g |
| Rosin ester (Ester Gum HP: manufactured by Arakawa Chemical Industries, Ltd.) | 0.20 g |
| Fluorine-based surfactant (MEGAFACE F-780-F, manufactured by DIC Corporation) | 0.005 g |
| Methyl ethyl ketone (MEK) | 22.5 g |
| 1-methoxy-propanol | 2.5 g |

(Remarks) A 30 mass % solution of methyl isobutyl ketone (MIBK) was used as a fluorine-based surfactant.

By changing the concentration of solid contents in the coating solution F for a stripe coated film within a range of 4% by mass to 36% by mass, the coating solutions having the viscosity of 5 levels of 0.5 mPa·s, 1 mPa·s, 6 mPa·s, 30 mPa·s, and 80 mPa·s are prepared. Further, the surface tension of the coating solution F was adjusted to 4 levels of 25 mN/m, 27 mN/m, 30 mN/m, and 35 mN/m.

(Belt-Like Support)

As the belt-like support 12, an aluminum plate having a thickness of 0.30 mm and a width of 1030 mm in conformity with JIS A 1050 (Japan Industrial Standards) was used. This belt-like support 12 was used at 2 levels of contact angles of 30° and 90° with respect to the coating solution F.

(Coater for Stripe Coated Film)

The belt-like support 12 was coated while being continuously transported at a transport speed of 80 m/min using the bar coater 24 illustrated in FIG. 10.

Further, the coating bar 28 having grooved portions A and groove-free portions B described in FIGS. 11 to 13 were alternately arranged in the axial core direction of the coating bar 28 and having a diameter of 10 mm was used.

Further, the coating was performed by assigning the numerical values within the range of the condition for the viscosity (ii) (0.3 mPa·s to 100 mPa·s), the range of the condition for the surface tension (σ) (20 mN/m to 40 mN/m), and the range of the condition for the contact angle (10° to 90°), which are the prerequisites for achieving the purposes described above.

The difference ($Z_0$) in initial film thickness was in three levels of 10 μm, 20 μm, and 40 μm.

The rotation speed of the coating bar 28 was adjusted to 3 levels of 300 rpm, 1270 rpm, and 1500 rpm. Further, investigation was performed by assigning the numerical values within the ranges of P of 0.25 mm or greater. D/P of 0.49 or less, and h/D of 0.01 to 0.55 which are preferable conditions for grooves of the coating bar 28.

(Dryer for Stripe Coated Film)

The stripe coated film was dried at a drying temperature of 125° C. using the dryer 20 of FIG. 16 which was provided with the rectangular nozzle 66 close to the film surface of the stripe coated film 64 to be continuously transported in a casing. The drying was performed by changing the relative wind speed of the parallel wind component of dry wind to the coated film surface in 9 levels of 0.1 m/s, 0.2 m/s, 3 m/s, 4 m/s, 5 m/s, 10 m/s, 20 m/s, 30 m/s, and 35 m/s.

Further, in a case where the coating is performed under the coating conditions of the above-described "viscosity condition", the "surface tension condition", and the "contact angle condition" which are prerequisites for achieving the purpose of the present invention, a case where the "condition for forming a stripe coated film" of Formula 1 and the "condition for preventing formation of horn-like protrusions" of Formula 2 are satisfied in the drying step and a case where the conditions are not satisfied in the drying step are tested.

Figure 18A:
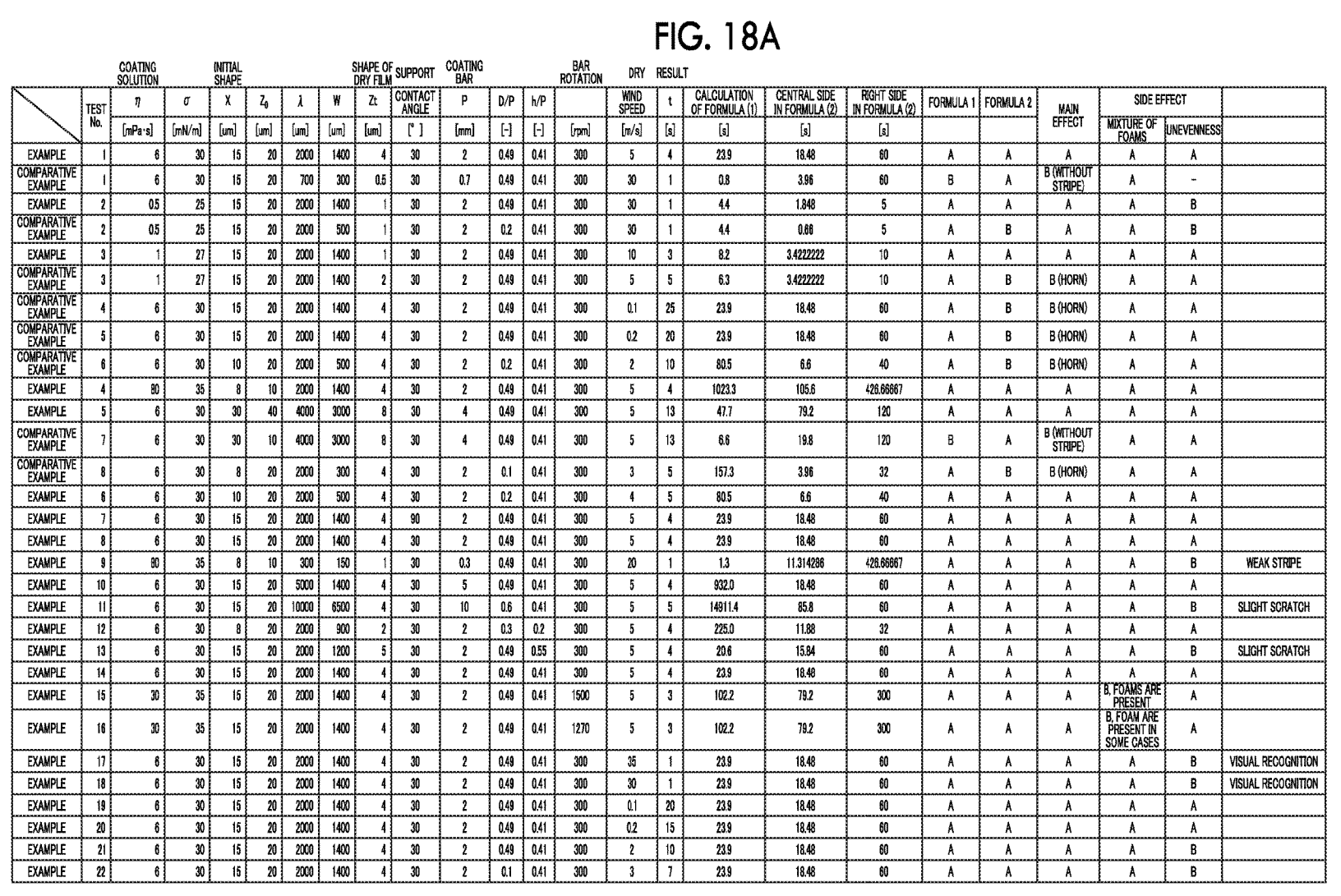

The numerical values of the parameters (the viscosity, the surface tension, and the like) and the test results of Examples 1 to 22 and Comparative Examples 1 to 8 are listed in Table of FIG. 18A.

Further, since the range of the condition for the viscosity condition (0.3 mPa·s to 100 mPa·s), the range of the condition for the surface tension (σ) (20 mN/m to 40 mN/m), and the range of the condition for the contact angle (10° to 90°) are the prerequisites for achieving the purposes of the present invention as described above, the numerical values of the upper limit values and the lower limit values are not particularly concerned at the time of assigning the numerical values of the parameters.

A case where Formula 1 was satisfied was evaluated as A and a case where Formula 1 was not satisfied was evaluated as B in the table of FIG. 18A. Further, a case where Formula 2 was satisfied was evaluated as A and a case where Formula 2 was not satisfied was evaluated as B.

In the present example, the bar coater 24 having the coating bar 28 formed of the grooved portion A and the groove-free portion B described in FIGS. 11 to 13 was used as the coater 18 for a stripe coated film that applies the stripe coated film. Accordingly, the influence on P of 0.25 mm or greater, D/P of 0.49 or less, and h/D or 0.01 to 0.55 that define the groove shape of the coating bar 28 was investigated. Further, the relationship between the rotation speed of the coating bar 28 and the mixture of foams into the coating solution F was investigated.

In addition, the relationship between the relative wind speed of dry wind and the dry unevenness of the stripe coated film 64 at the time of performing drying using the dryer 20 for a stripe coated film.

<Test Results 1>

The test results 1 were obtained by performing evaluation of whether the stripe coated film 64 was formed and formation of the horn-like protrusions 62A was able to be prevented.

A case where the stripe coated film 64 was formed and the horn-like protrusions 62A were not formed was evaluated as A. Further, a case where the stripe coated film 64 was not formed or the horn-like protrusions 62A were present was evaluated as B.

In the evaluation of whether the stripe coated film 64 was formed, it was determined that the stripe coated film 64 was formed in a case where the difference $Z_t$ in dry film thickness between the thick film portion 62 and the thin film portion 60 adjacent to each other was measured using a contact type film thickness meter and the value was 1 μm or greater. In the evaluation of whether the formation of the horn-like protrusions 62A was able to be prevented, it was determined that the horn-like protrusions 62A were present in a case where the profile of the stripe coated film was measured using an electron microscope and the film thickness of the thick film portion 62 in an end portion was greater than the film thickness thereof in the central portion by 0.5 μm or greater.

Further, the influence of the "mixture of foams" and the "unevenness of the stripe coated film" due to the conditions of the coating bar 28 and the relative wind speed of dry wind was evaluated as side effects.

The "mixture of foams" was evaluated by visually observing the produced planographic printing plate precursors. In a case where foams were not mixed was evaluated as A, a case where mixture of foams was found in a portion of the thick film portion 62 was evaluated as B, and a case where mixture of foams was found in the entire surface was evaluated as C.

The "unevenness of the stripe coated film" was evaluated by visually observing the produced planographic printing plate precursors. In a case where a color difference was not almost found was evaluated as A, a case where a color difference was slightly found was evaluated as B, and a color difference was clearly found was evaluated as C.

As understood in the table of FIG. 18A, Examples 1 to 22 satisfy all five conditions of the "viscosity condition", the "surface tension condition", the "contact angle condition", the "condition for forming a stripe coated film" of Formula 1, and the "condition for preventing formation of horn-like protrusions" of Formula 2.

Comparative Example 1 to 8 did not satisfy at least one of the "condition for forming a stripe coated film" of Formula 1 and the "condition for preventing formation of horn-like protrusions" of Formula 2 from among the above-described five conditions.

As the result, Examples 1 to 22 were evaluated as A since the stripe coated film 64 was able to be formed and horn-like protrusions were not formed on both ends of the thick film portion in the width direction, in all examples.

Meanwhile, in Comparative Examples 1 to 8, Comparative Examples 1 and 7 were evaluated as B since the stripe coated film was not able to be formed. In other words, in Comparative Examples 1 and 7, a difference in film thickness between the thick film portion 62 and the thin film portion 60 was eliminated due to the leveling of the coated film in the drying step so that the coated film became flat.

Comparative Examples 2 to 6 and 8 were evaluated as B since the stripe coated film 64 was formed, but the horn-like protrusions 62A were formed on both ends of the thick film portion 62 in the width direction.

Figure 19:
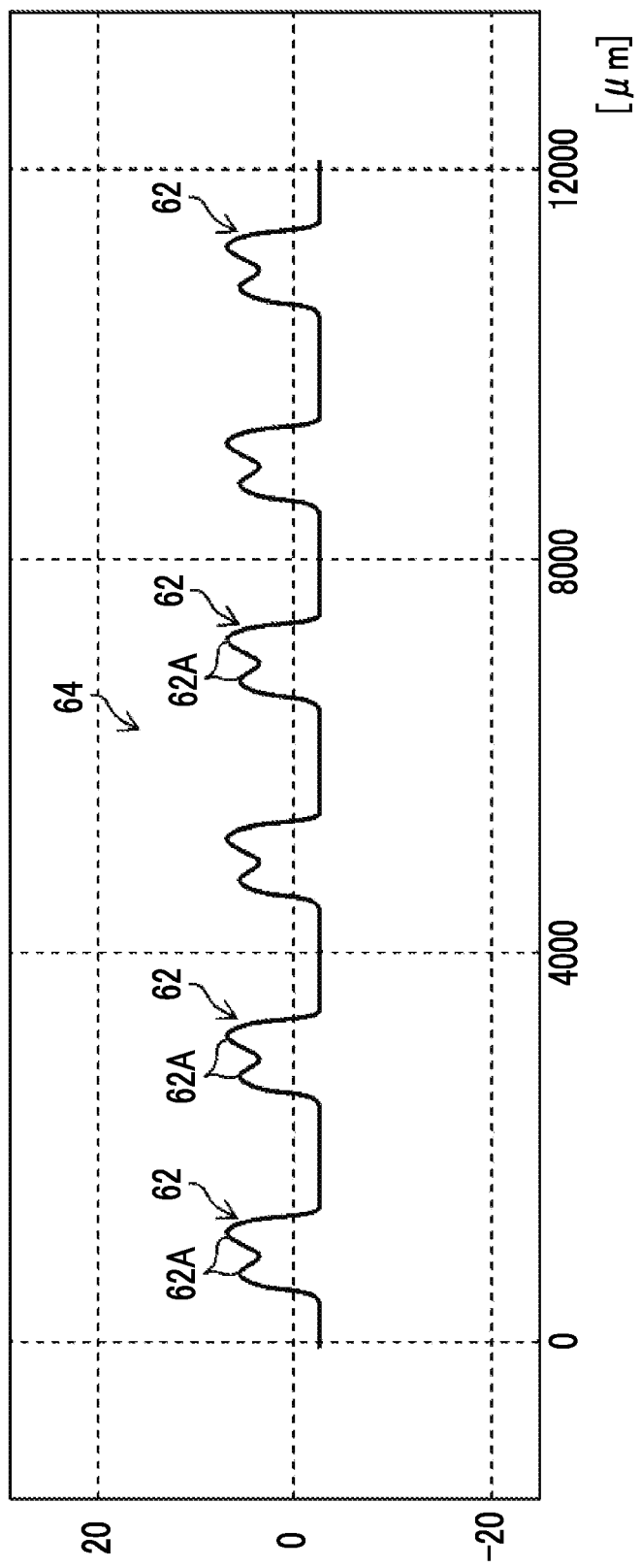
FIG. 19 is a schematic graph schematically showing a stripe coated film provided with protrusions having a horn shape in the first example by performing measurement using a contact type film thickness meter.
Figure 20:
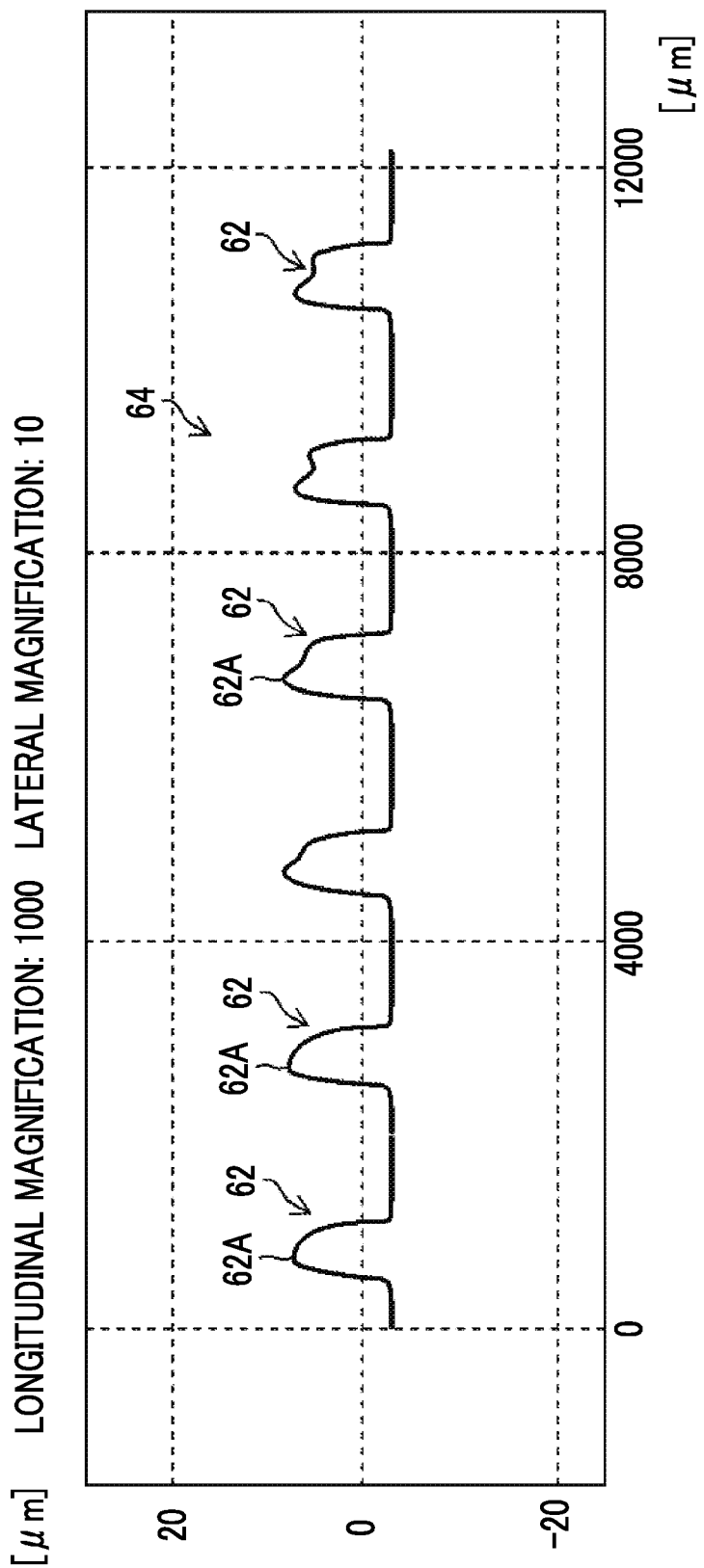
FIG. 20 is a schematic graph schematically showing a stripe coated film provided with protrusions having a different horn shape in the first example by performing measurement using a contact type film thickness meter.

FIG. 19 is a schematic graph schematically showing the results obtained by measuring Comparative Example 2 in which the horn-like protrusions 62A were generated on both ends of the thick film portion 62 in the width direction using a contact type film thickness meter. Further, FIG. 20 is a schematic graph schematically showing the results obtained by measuring Comparative Example 5 in which the horn-like protrusions 62A were generated on both ends of the thick film portion 62 in the width direction using a contact type film thickness meter. In FIGS. 19 and 20, the longitudinal magnification was 1000 times and the lateral magnification was 10 times.

As understood from FIG. 19, the horn-like protrusions 62A are formed on both ends of all thick film portions 62 in the width direction. Further, in FIG. 20, horn-like protrusions 62A are formed on both ends of the thick film portions 62 in the right half of the drawing in the width direction.

Figure 21:
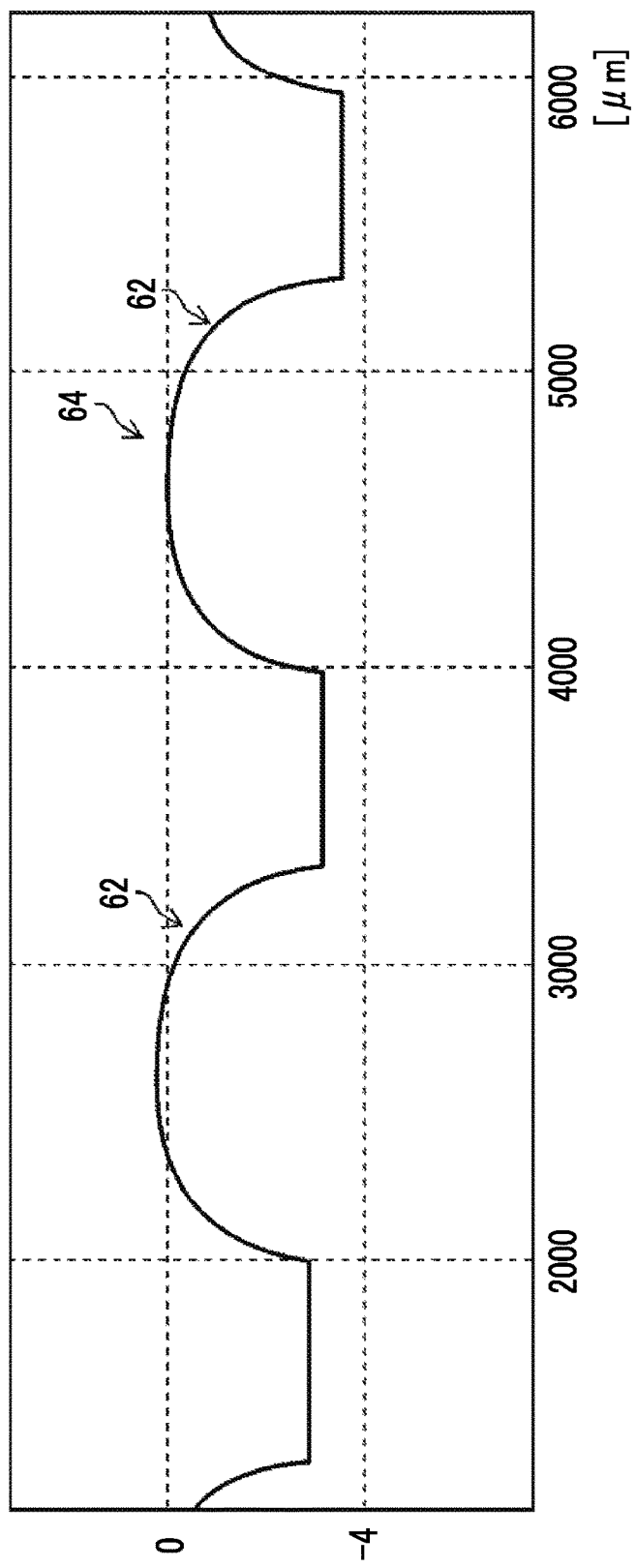
FIG. 21 is a schematic graph schematically showing a stripe coated film free of horn-like protrusions in the first example by performing measurement using a contact type film thickness meter.
Figure 22:
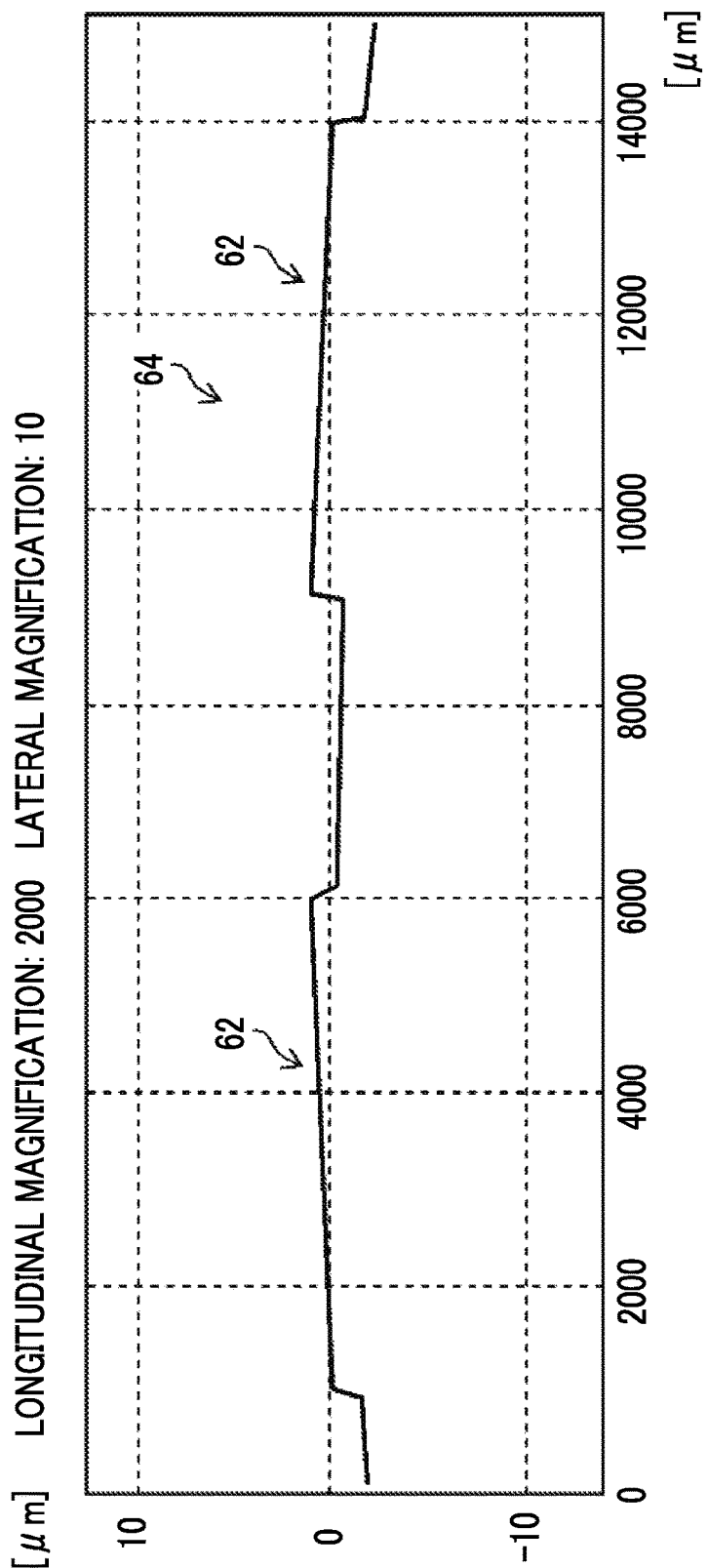
FIG. 22 is a schematic graph schematically showing a stripe coated film free of horn-like protrusions in the first example by performing measurement using a contact type film thickness meter.

FIG. 21 is a schematic graph schematically showing the results obtained by measuring Example 1 in which the horn-like protrusions 62A were not generated on both ends of the thick film portion 62 in the width direction using a contact type film thickness meter. Further, FIG. 22 is a schematic graph schematically showing the results obtained by measuring Example 2 in which the horn-like protrusions 62A were not generated on both ends of the thick film portion 62 in the width direction using a contact type film thickness meter. In FIG. 21, the longitudinal magnification was 5000 times and the lateral magnification was 30 times. In FIG. 22, the longitudinal magnification was 2000 times and the lateral magnification was 10 times.

As understood from FIGS. 21 and 22, the horn-like protrusions 62A were not generated on both ends of the thick film portion 62 in the width direction.

In this manner, since plates were not damaged and printing stain was also suppressed at the time of laminating a plurality of planographic printing plate precursors produced according to the method of producing the planographic printing plate precursor of the present invention to form a laminate, elimination of interleaving paper can be realized.

Here, the grounds for $3.3 \times 10^9$ which is the constant of Formula 2 will be described.

The examples and the comparative examples of the table in FIG. 18A were plotted in FIG. 18B by taking the time to the drying point on the vertical axis and taking $Z_0 \times \eta \times W/\sigma$ on the horizontal axis. The plots of the examples were indicated by O (circle) and the plots of the comparative examples were indicated by X (X mark). As understood from FIG. 18B, the dotted line S which is the boundary line between the X region and the O region can be expressed by the following equation.

$$t = 3.3 \times 10^9 (Z_0 \times \eta \times W/\sigma)$$

<Test Results 2>

The test results 2 were obtained by testing the shape and the rotation speed of the coating bar 28, and the relative wind speed of the parallel wind component of dry wind blown to the coated film surface at the time of drying.

In consideration of the examples and the comparative examples in which P is 0.25 mm or greater, D/P is 0.49 or less, and h/D is 0.01 to 0.55 that define the shape of the groove in the coating bar 28 based on the table of FIG. 18A, Examples 2, 9, 11, 13, 17, 18, and Comparative Example 2 were evaluated as B since unevenness occurred in some cases. Particularly, in Example 17 in which the parallel wind component of dry wind blown to the coated film surface had a relative wind speed of 35 m/s, unevenness (dry unevenness) was observed from the stripe coated film 64. In Example 13, weak scratches were observed.

As described below, the examples and the comparative examples in which the above-described relative wind speed was set to the same numerical value were compared to each other. Further, in a test region having a small relative wind speed in Examples 19 to 22, the relative wind speed was reduced and the drying temperature was increased to higher than 125° C. to adjust the time to the drying point (t).

Relative wind speed of 0.1 m/s . . . Example 19 and Comparative Example 4
Relative wind speed of 0.2 m/s . . . Example 20 and Comparative Example 5
Relative wind speed of 2 m/s . . . Example 21 and Comparative Example 6
Relative wind speed of 3 m/s . . . Example 22 and Comparative Example 8
Relative wind speed of 5 m/s . . . Example 1 and Comparative Example 3
Relative wind speed of 30 m/s . . . Example 2 and Comparative Example 1

As understood from the above-described results, in the examples and the comparative examples in which the numerical values of the wind speed were set to be the same as each other, the examples satisfy Formula 1 and Formula 2, but the comparative examples do not satisfy Formula 1 or Formula 2. Therefore, it is considered that the dry unevenness was affected in a case where the relative wind speed was greater than 35 m/s, but not only the dry unevenness but also the formation of the stripe coated film 64 and the prevention of generation of the horn-like protrusions 62A were not particularly affected in a region where the relative wind speed was less than 35 m/s.

In consideration of the rotation speed of the coating bar 28, Example 17 in which the viscosity of the coating solution F was 30 mPa·s and the rotation speed was 1500 rpm and Example 18 in which the viscosity of the coating solution F was 30 mPa·s and the rotation speed was 1270 rpm were evaluated as B since mixture of foams was found. This evaluation coincides with the foam mixture limit curve in FIG. 9.

However, any test in the test results 2 did not have problems of formation of the stripe coated film 64 and prevention of formation of horn-like protrusions which were the main effects.

Second Example

In the second example, the relationship between a formed stripe coated film and occurrence of damage to a planographic printing plate precursor at the time of lamination of planographic printing plate precursors to obtain a laminate was investigated. A test of whether the planographic printing plate precursor was damaged was performed as follows.

In other words, using the samples of the planographic printing plates of the examples and the comparative examples listed in the table of FIG. 18A, a first laminate was formed by laminating 20 sheets of produced planographic printing plates without interposing interleaving paper therebetween. Further, a second laminate formed by allowing the surface of a polymer layer to face upward was set in advance in a cassette used for setting a laminate. Further, the first laminate was stacked on the second laminate which had been set in the cassette in advance by being deviated from an edge by 5 cm, pushed in the horizontal direction, and pushed into the cassette while rubbing the surface of the uppermost planographic printing plate on the polymer layer side of the second laminate.

Further, the planographic printing plate whose surface on the polymer layer side was rubbed was visually observed whether the plate was damaged. A case where the plate was not damaged was evaluated as A and a case where the plate was damaged was evaluated as B.

Example 23 in the table of FIG. 23 was the same as Example 1 in the table of FIG. 18A. In other words, the stripe coated film 64 of the example in FIG. 3 was formed such that the belt-like thick film portions 62 and the belt-like thin film portions 60 are continuously arranged on the rear surface of the belt-like support 12 so that the entire surface was coated.

Further, in Comparative Example 9 assuming WO2014/202519A1 of the related art, stripe-like discontinuous partial coating was performed so that the rear surface of the belt-like support 12 had uncoated portions. In Comparative Example 10 assuming WO2014/202519A1 of the related art, dot-like discontinuous partial coating was performed so that the rear surface of the belt-like support 12 had uncoated portions.

In Comparative Example 11, partially uncoated portions were intentionally formed by applying the coating solution F for a stripe coated film to form the stripe coated film 64 in the same manner as in Example 1 and by sucking and removing only the thin film portions 60 from among the thick film portions 62 and the thin film portions 60 of the stripe coated film 64.

As the result, as understood from the table of FIG. 23, Example 23 was evaluated as A since the plate was not damaged and all comparative examples were evaluated as B. Based on this, it was proved that the entire rear surface of the belt-like support 12 is required to be coated in order to prevent damage to the planographic printing plate and this means that the belt-like thick film portions 62 and the belt-like thin film portions 60 need to be continuously arranged on the rear surface of the belt-like support 12.

Third Example

In the third example, in a case where the thick film portion contact area ratio, the thick film portion width, and the distance (pitch) between thick film portions of the stripe coated film 64 formed in the above-described manner were changed as in Examples 24 to 34, the influence on the "adsorptivity of the plate" and the "stain on the plate surface" of planographic printing plate precursors was investigated.

The "adsorptivity of the plate" was evaluated by adjusting the humidity of 3 sheets of produced planographic printing plate precursors in an environment of a temperature of 25° C. at a relative humidity of 75% for 2 hours, and sequentially stacking the precursors in a state in which the 3 sheets of planographic printing plate precursors were directed to the same direction and interleaving paper was not interposed between precursors to form a laminate. This laminate was tightly wrapped with kraft paper having an aluminum laminate layer and then allowed to stand still in an environment of 30° C. for 5 days in a state in which a 4 Kg load was applied thereto. In the laminate which had been allowed to stand still for 5 days, the adsorptivity between the surface of the planographic printing plate on the polymer layer side and the rear surface of the planographic printing plate precursor adjacent to the upper side of the polymer layer and provided with the stripe coated film 64 was investigated.

In the evaluation of the adsorptivity, a case where there was no adsorptivity between the laminated planographic printing plate precursors was evaluated as A, a case where there was little adsorptivity in a practical level with no problem was evaluated as B, and a case where the adsorptivity was large in a practically unacceptable level was evaluated as C.

Further, the "stain on the plate surface" was visually observed, and a case where there was no stain on the surface of the laminated planographic printing plates was evaluated as A, a case where there was little stain in a practical level with no problem was evaluated as B, and a case where stain was conspicuous in a practically unacceptable level was evaluated as C.

<Test Results 3>

As understood from the table of FIG. 24, in a case where the thick film portion contact area ratio is 95%, which is greater than the upper limit value of 90%, the "adsorptivity of the plate" is slightly found and evaluated as B. In a case where the thick film portion contact area ratio is 3%, which is less than the lower limit value of 5%, the "stain on the plate surface" is slightly found and evaluated as B.

In a case where the thick film portion width is 15 mm, which is greater than the upper limit value of 10 mm, the plate becomes easily adsorbed and the evaluation is made as B. The upper plate laminated due to the adsorptivity is deviated from the lower plate in some cases. In a case where the thick film portion width is 0.2 mm, which is lower than the lower limit value of 0.25 mm, the "stain on the plate surface" is slightly generated and evaluated as B.

Further, in a case where the distance between the thick film portions is 50 mm, which is greater than the upper limit value of 30 mm, the "stain on the plate surface" is slightly generated and evaluated as B. In a case where the distance between the thick film portions is 0.4 mm, which is lower than the lower limit value of 0.5 mm, the air release property is deteriorated and the "adsorptivity of the plate" occurs and the evaluation is made as B.

Therefore, it is preferable that the stripe coated film 64 to be formed in a dry state has a thick film portion contact area ratio of 5% to 90%, a thick film portion width of 0.25 mm to 10 mm, and a distance between thick film portions of 0.5 mm to 30 mm.

However, any test in the test results 3 did not have problems of formation of the stripe coated film and prevention of formation of horn-like protrusions which were the main effects.

Fourth Example

In the fourth example, the relationship between the arithmetic average height Sa of the back coat layer 70 and the purposes 1) to 4) required for elimination of interleaving paper was investigated by changing the kind of the resin of the polymer layer on the surface of the support or the resin of the back coat layer 70 on the rear surface of the support or changing the surface roughness structure.

The test was performed by changing five parameters of the type of polymer layer on the surface of the support, the kind of the resin of the back coat layer on the rear surface of the support, the continuity or discontinuity of the back coat layer, the shape of the surface roughness structure, and presence or absence of addition of a matting agent as listed in the table of FIG. 25, and then the planographic printing plate precursors of Examples 35 to 55 which satisfy the present invention and the planographic printing plate precursors of Comparative Examples 12 to 19 which do not satisfy the present invention were produced.

As the belt-like support 12, the aluminum plate which is the same as that described in Example 1 was used.

In the table of FIG. 25, the "aluminum" indicates an aluminum plate, the "untreated" indicates a polymer layer for an untreated plate, the "negative" indicates a polymer layer for a negative type image recording layer, the "positive" indicates a polymer layer for a positive type image recording layer, the "treated key plate" indicates a treated polymer layer for a key plate, and the "untreated key plate" indicates an untreated polymer layer for a key plate.

Figure 26:
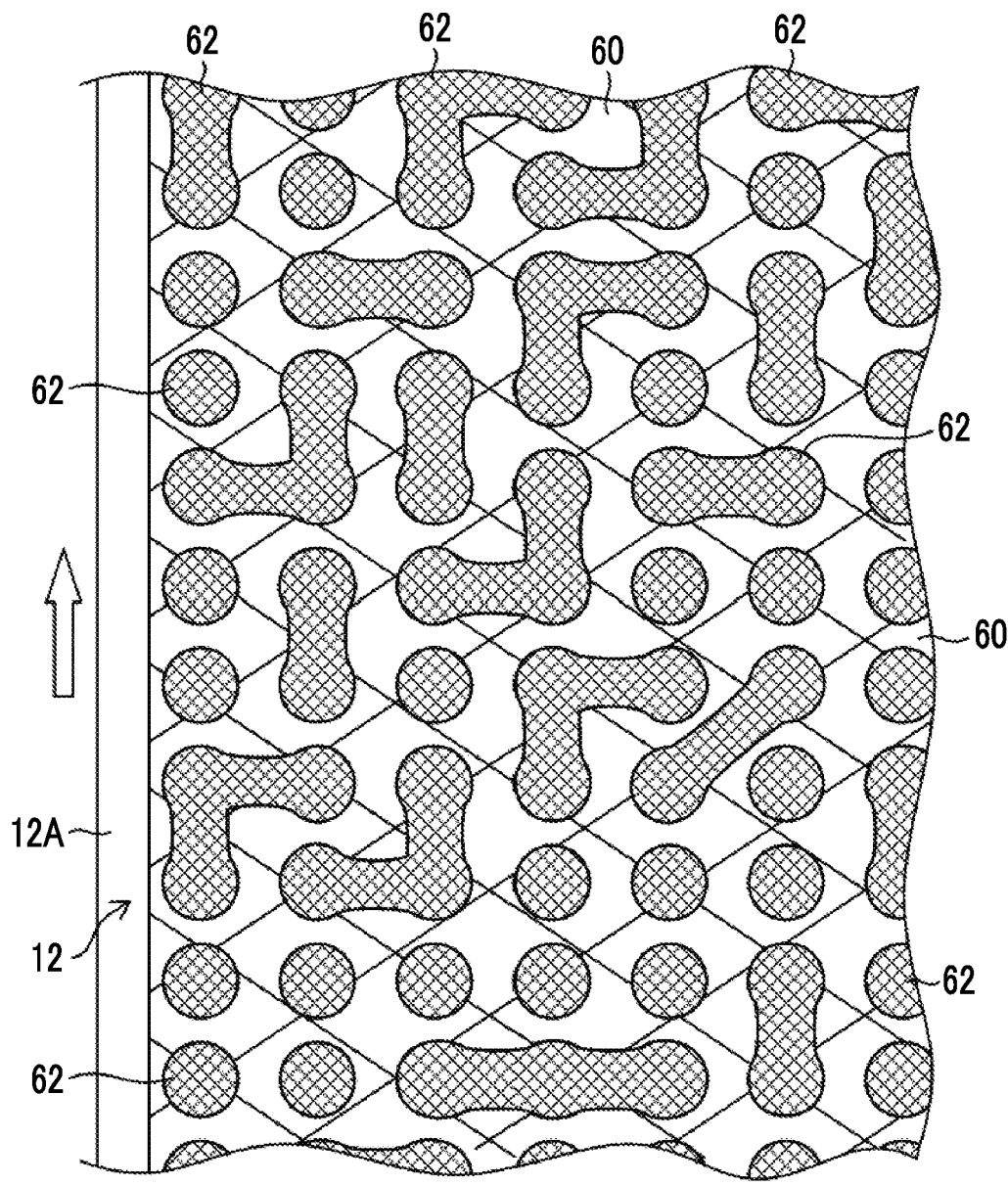
FIG. 26 is a view for describing a back coat layer on which a coated film having an irregular surface roughness structure is formed.

Further, the "irregular unevenness" in the surface roughness structure indicates the back coat layer 70 formed in random disposition of the thick film portion 62 having an irregular shape on the thin film portions 60 used for solid-coating of the rear surface of the belt-like support 12 as illustrated in FIG. 26.

(Type of Polymer Layer)

The composition of the polymer layer for an untreated plate is the same as in the first example described above.

Further, the compositions of the polymer layer for a negative type image recording layer, the polymer layer for a positive type image recording layer, the polymer layer for a treated key plate, and the polymer layer for an untreated key plate are as follows.

<<Polymer Layer for Negative Type Image Recording Layer>>

<Formation of Undercoat Layer>

The surface of the belt-like support 12 was coated with an undercoat layer coating solution having the following composition using a wire bar and dried at 90° C. for 30 seconds. The coating amount thereof was 10 mg/m$^2$.

| | |
|---|---|
| Polymer compound A (Chemical Formula 6 shown below) (weight-average molecular weight: 30000) | 0.05 g |
| Methanol | 27 g |
| Ion exchange water | 3 g |

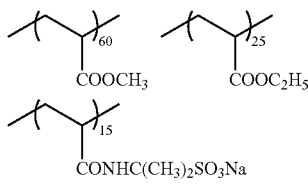

Polymer compound A

<Formation of Image Recording Layer>

The undercoat layer was coated with the image recording layer coating solution having the following composition using a wire bar and dried at 115° C. for 34 seconds using a hot air dryer. The coating amount after the drying was 1.4 g/m².

| | |
|---|---|
| Infrared absorbing agent (IR-1) (Chemical Formula 8 shown below) | 0.074 g |
| Polymerization initiator (OS-12) (Chemical Formula 7 shown below) | 0.280 g |
| Additive (PM-1) (Chemical Formula 8 shown below) | 0.151 g |
| Polymerizable compound (AM-1) (Chemical Formula 8 shown below) | 1.00 g |
| Binder polymer (BT-1) (Chemical Formula 8 shown below) | 1.00 g |
| Ethyl violet (C-1) (Chemical Formula 8 shown below) | 0.04 g |
| Fluorine-based surfactant (MEGAFACE F-780-F, manufactured by DIC Corporation, 30 mass % solution in methyl isobutyl ketone (MIBK)) | 0.015 g |
| Methyl ethyl ketone | 10.4 g |
| Methanol | 4.83 g |
| 1-Methoxy-2-propanol | 10.4 g |

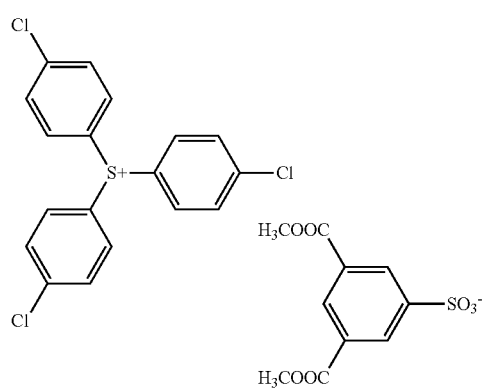
(OS-12)

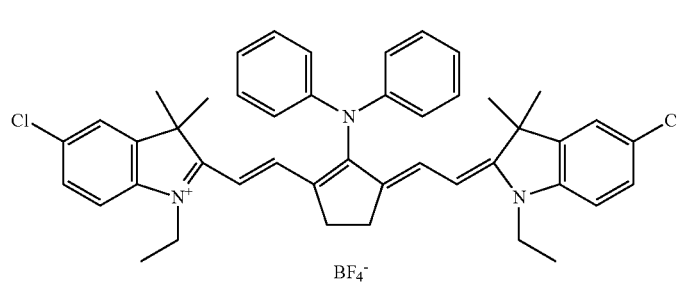
(IR-1)

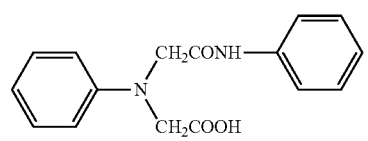
(PM-1)

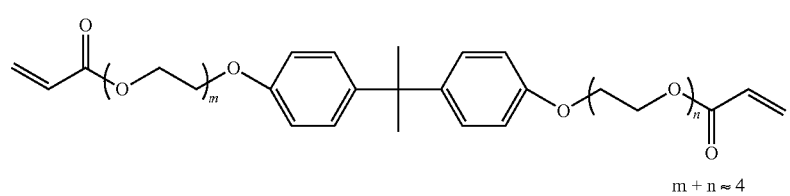
(AM-1)

$m + n \approx 4$

-continued

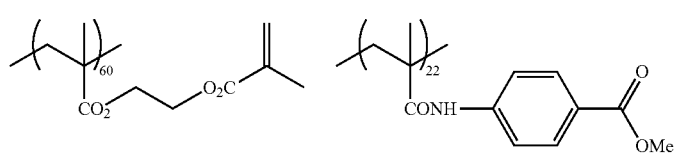

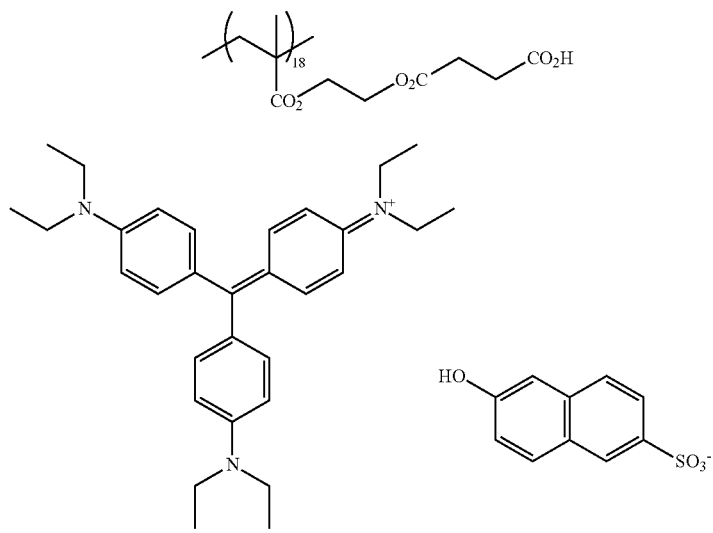

<Formation of Protective Layer>

The image recording layer was coated with the protective layer coating solution having the following composition using a wire bar and dried at 125° C. for 75 seconds using a hot air dryer, thereby forming a protective layer. The coating amount after the drying was 1.6 g/m².

| | |
|---|---|
| Synthetic mica (SOMASIF ME-100, manufactured by CO-OP CHEMICAL CO., LTD., 8% aqueous dispersion liquid) | 94 g |
| Polyvinyl alcohol (CKS-50, manufactured by Nippon Synthetic Chemical Industry Co, Ltd., degree of saponification of 99% by mole, degree of polymerization of 300) | 58 g |
| Carboxy methyl cellulose (CELOGEN PR, manufactured by DKS Co., Ltd.) | 24 g |
| Surfactant-1 (PLURONIC P-84, manufactured by BASF SE) | 2.5 g |
| Surfactant-2 (EMALEX 710, manufactured by Nihon Emulsion Co., Ltd.) | 5 g |
| Pure water | 1364 g |

<<Polymer Layer for Positive Type Image Recording Layer>>

<Formation of Undercoat Layer>

The surface of the belt-like support 12 was coated with an undercoat layer coating solution having the following composition using a bar coater and dried at 80° C. for 15 seconds to form an undercoat layer in which the coating amount after the drying was 18 mg/m².

| | |
|---|---|
| Polymer compound (Chemical Formula 9 shown below) | 0.3 g |
| Methanol | 100 g |

(BT-1)

(C-1)

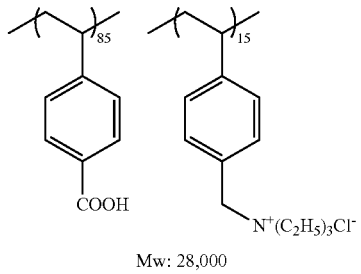

Mw: 28,000

<Formation of Image Recording Layer>

An image recording layer formed of an underlayer and an upper layer was formed on the undercoat layer. In other words, the undercoat layer was coated with an underlayer coating solution having the following composition using a bar coater such that the coating amount after the drying was set to 0.85 g/m², dried at 160° C. for 44 seconds, and immediately cooled with cold air in a temperature range of 17° C. to 20° C. until the temperature of the belt-like support 12 was set to 35° C., thereby forming an underlayer. Thereafter, the underlayer was coated with an upper layer coating solution having the following composition using a bar coater such that the coating amount after the drying was set to 0.22 g/m², dried at 148° C. for 25 seconds, and gradually cooled with wind in a temperature range of 20° C. to 26° C., thereby forming an upper layer.

The composition of the underlayer coating solution is as follows.

| | |
|---|---|
| N-(4-aminosulfonylphenyl)methacrylamide/acrylonitrile/methyl methacrylate (36/34/30% by mass: weight-average molecular weight of 50000, acid value of 2.65) | 2.1 g |

-continued

| | |
|---|---|
| m,p-Cresol novolak (m/p ratio = 6/4, weight-average molecular weight of 4500, containing 0.8% by mass of unreacted cresol, Tg: 75° C.) | 0.1 g |
| Cyanine dye A (Chemical Formula 10 shown below) | 0.13 g |
| 4,4'-Bishydroxyphenylsulfone | 0.13 g |
| Tetrahydrophthalic anhydride | 0.19 g |
| p-Toluenesulfonic acid | 0.008 g |
| 3-Methoxy-4-diazodiphenylamine hexafluorophosphate | 0.032 g |
| Dye obtained by changing counter ion of ethyl violet into 6-hydroxy-2-naphthalenesulfonic acid | 0.078 g |
| Fluorine-based surfactant B (Chemical Formula 11 shown below) | 0.007 g |
| Methyl ethyl ketone | 25.0 g |
| 1-Methoxy-2-propanol | 13.0 g |
| γ-Butyrolactone | 13.0 g |

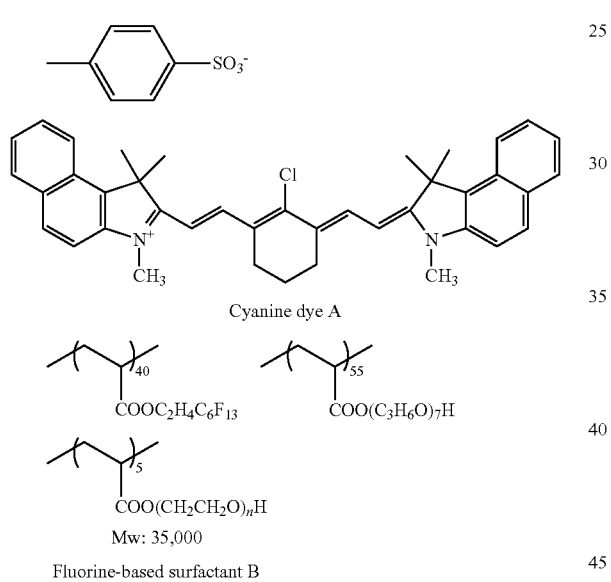

Cyanine dye A

Fluorine-based surfactant B

The composition of the upper layer coating solution is as follows.

| | |
|---|---|
| Phenol/m-cresol/p-cresol novolak (molar ratio = 5/3/2, weight-average molecular weight: 5000, containing 1.2% by mass of unreacted cresol, Tg: 70° C.) | 0.35 g |
| Acrylic resin C (Chemical Formula 12 shown below) | 0.042 g |
| Cyanine dye A (Chemical Formula 10 shown above) | 0.019 g |
| Ammonium compound D (Chemical Formula 12 shown below) | 0.004 g |
| Sulfonium compound G (Chemical Formula 12 shown below) | 0.032 g |
| Fluorine-based surfactant B (Chemical Formula 11 shown above) | 0.0045 g |
| Fluorine-based surfactant E (Chemical Formula 12 shown below) | 0.0033 g |
| Fluorine-based polymer F (Chemical Formula 12 shown below) | 0.018 g |
| Methyl ethyl ketone | 10.0 g |
| 1-Methoxy-2-propanol | 20.0 g |

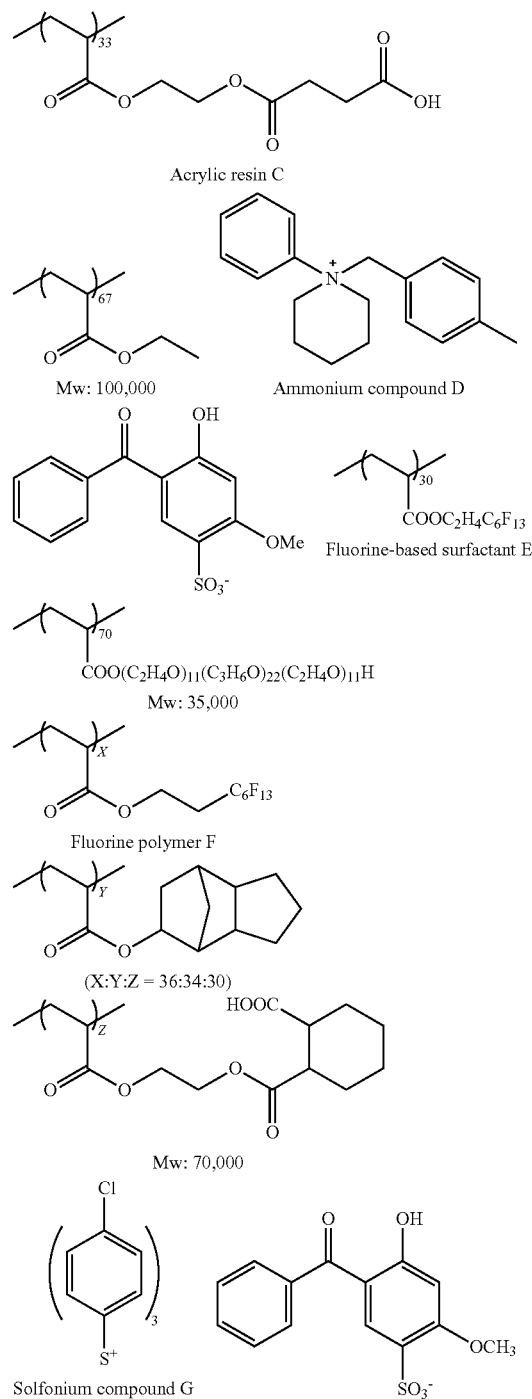

<<Polymer Layer for Treated Key Plate>>

The surface of the belt-like support 12 was coated with a coating solution for an undercoat layer having the following composition such that the coating amount after drying was 1.5 mg/m$^2$ and then dried. Further, the support was coated with a coating solution for forming a non-photosensitive layer using a wire bar such that the weight after drying was 0.7 g/m$^2$. The support was dried at 90° C. for 27 seconds using a hot air dryer. Further, the surface of the non-photosensitive layer was coated with a coating solution O-11 for forming a hydrophilic layer using a wire bar and dried at 125° C. for 75 seconds using a hot air dryer to form a hydrophilic layer. The total coating amount (the coating amount after drying) of this hydrophilic layer was 1.8 g/m².

The composition of the undercoat layer coating solution is as follows.

| Polymer (Chemical Formula 13 shown below) | 0.3 g |
|---|---|
| Pure water | 60.0 g |
| Methanol | 939.7 g |

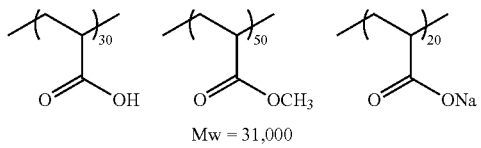

Mw = 31,000

The composition of the coating solution for forming a non-photosensitive layer is as follows.

| Binder polymer A | 2.465 g |
|---|---|
| Phosphoric acid (85 wt % aqueous solution) | 0.08 g |
| Sulfophthalic acid (50 wt % aqueous solution) | 0.017 g |
| Tricarballylic acid | 0.017 g |
| Colorant (VPB-Naps) (naphthalene sulfonate of Victoria Pure Blue, manufactured by Hodagaya Chemical Co., Ltd.) | 0.0014 g |
| Fluorine-based surfactant (MEGAFACE F-780-F) (manufactured by DIC Corporation, 30 wt % solution of MEK) | 0.009 g |
| Methyl ethyl ketone (MEK) | 7.93 g |
| Methanol | 6.28 g |
| 1-Methoxy-2-propanol (MFG) | 2.01 g |

The binder polymer A is a 16 wt % solution having MFG and MEK at a mixing ratio of 1:1 for a condensation reaction product having a weight-average molecular weight of 85000 and an acid content of 1.64 meq/g of four types of monomers (1) to (4) described below.

| (1) 4,4-Diphenylmethane diisocyanate | 37.5% by mole |
|---|---|
| (2) Hexamethylene diisocyanate | 12.5% by mole |
| (3) 2,2-Bis(hydroxymethyl)propionic acid | 32.5% by mole |
| (4) Tetraethylene glycol | 17.5% by mole |

<<Polymer Layer for Untreated Key Plate>>

The surface of the belt-like support 12 was coated with a coating solution for a configuration layer 1 having the following composition such that the coating amount after drying was 1.5 mg/m² and dried. In this manner, the configuration layer 1 was formed.

| Polymer compound F-1 (Chemical Formula 14 shown below) | 3.6 g |
|---|---|
| Low-molecular-weight hydrophilic compound G-3 (non-ionic surfactant, $C_{12}H_{25}$—$(OCH_2CH_2)_{10}$—OH, EMALEX 710, manufactured by Nihon Emulsion Co., Ltd.) | 0.1 g |
| Water | 100.0 g |

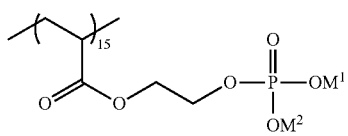

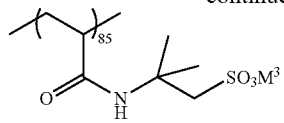

Polymer compound F-1

In the above-described polymer compound F-1, M1, M2, and M3 each independently represent a hydrogen atom or a sodium atom. Further, each number on the right side of parentheses represents the content (% by mole) of each monomer unit with respect to all monomer units of the polymer compound.

Further, the configuration layer 1 formed in the above-described manner was bar-coated with the coating solution for the configuration layer 2 having the following composition such that the coating amount after drying was 1.8 mg/m² and dried at 125° C. for 75 seconds using an incubator ph-201 (manufactured by ESPEC CORP.) to form a configuration layer 2. In this manner, a polymer layer for an untreated key plate was formed.

| Synthetic mica (SOMASIF ME-100, manufactured by CO-OP CHEMICAL CO., LTD., 8% aqueous dispersion liquid) | 0.82 g |
|---|---|
| Polymer I-1 (see the following) | 0.52 g |
| Carboxy methyl cellulose (CELOGEN PR, manufactured by DKS Co., Ltd.) | 0.22 g |
| Low-molecular-weight hydrophilic compound G-7 (see the following) | 0.02 g |
| Low-molecular-weight hydrophilic compound G-3 (see the following) | 0.04 g |
| Low-molecular-weight hydrophilic compound G-1 (see the following) | 0.18 g |
| Ion exchange water | 36.40 g |

The polymer I-1 is polyvinyl alcohol (CKS-50, manufactured by Nippon Synthetic Chemical Industry Co, Ltd., degree of saponification of 99% by mole, degree of polymerization of 300).

The low-molecular-weight hydrophilic compound G-7 is a non-ionic surfactant (PLURONIC P-84, manufactured by BASF SE).

The low-molecular-weight hydrophilic compound G-3 is a non-ionic surfactant ($C_{12}H_{25}$—$(OCH_2CH_2)_{10}$—OH, EMALEX 710, manufactured by Nihon Emulsion Co., Ltd.).

The low-molecular-weight hydrophilic compound G-1 is an anionic surfactant sodium (4-(2-(2-(2-ethylhexyloxy)ethoxy)ethoxy)butane-1-sulfonate, manufactured by Wako Pure Chemical Industries, Ltd.).

(Kind of Resin of Back Coat Layer)

As listed in the table of FIG. 25, examples of the type of resin of the back coat layer used for the test include an epoxy resin, a polyvinyl acetal resin, a polyester resin, an acrylic copolymer, a UV curable acrylic resin, a polystyrene resin, and a novolak resin.

As the polyvinyl acetal resin, KS-10 (manufactured by Sekisui Chemical Co., Ltd.) was used, and 25 g of the resin was allowed to be dissolved in 100 g of methyl ethyl ketone.

As the acrylic copolymer, a methyl methacrylate/ethyl acrylate/acrylic acid (a charged weight ratio of 65:20:15) copolymer was used.

The composition of the components of the UV curable acrylic resin is as follows, and a chemical agent (manufactured by CIBA-GEIGY AG) or a chemical agent (manufactured by BASF SE) was used.

| | |
|---|---|
| 4-t-Butyl cyclohexyl acrylate | 22.9 g |
| 1,6-Hexanediol diacrylate | 13.9 g |
| Mixture (4% by mass of methoxyphenol + 10% by mass of 2,6-di-tert-butyl-p-cresol + N-nitroso-N-phenylhydroxylamine ammonium) | 9.2 g |
| 2-Phenoxyethyl methacrylate | 13.9 g |
| Cyclic trimethylolpropane formal | 13.2 g |
| Monofunctional acrylate ester | 2.3 g |
| UV-photopolymerization initiator (IRGACURE 819) | 11.5 g |
| UV-photopolymerization initiator (LUCIRIN TPOL) | 0.7 g |
| Level dyeing agent (EFKA 3600N) | 6.0 g |
| Trimethylolpropane EO addition triacrylate | 6.0 g |
| 2-Phenoxyethyl acrylate | 0.4 g |

(Method of Forming Surface Roughness Structure of Back Coat Layer)

<Continuous Stripe Coated Film>

Continuous stripe coated films of Examples 35 to 52 and Comparative Example 14 were formed in conformity with the method of forming the stripe coated film according to the embodiment of the present invention. In other words, the depth of the depression 56 in the grooved portion A of the coating bar 28 of the bar coater 24 was adjusted such that the arithmetic average height Sa of the back coat layer was set to be in a range of 0.5 μm to 24.0 μm. Further, in Comparative Example 14, the depth of the depression 56 in the grooved portion A of the coating bar 28 of the bar coater 24 was adjusted such that the arithmetic average height Sa of the back coat layer was set to 0.4 μm.

<Continuous Dashed Line Coated Film>

The continuous dashed line coated film of Example 53 was formed in conformity with the method of forming the dashed line coated film according to the embodiment of the present invention.

<Continuous Dot Coated Film>

The continuous dot coated film of Example 54 was formed in conformity with the method of forming the dot coated film according to the embodiment of the present invention.

<Continuous Irregular Unevenness Coated Film>

The back coat layer 70 of the continuous irregular unevenness coated film illustrated in FIG. 26 was formed by solid-coating the entire rear surface of the belt-like support 12 with the coating solution to form flat thin film portions 60, coating the thin film portions 60 with the thick film portions 62 using a coating device having a spray coating system, and then drying the surface.

<Continuous Flat Coated Film>

The continuous flat coated films of Comparative Examples 12, 13, 16, and 18 were respectively formed by solid-coating the entire rear surface of the belt-like support 12 with the coating solution to form a flat coated film.

<Discontinuous Stripe Coated Film>

The discontinuous stripe coated films of Comparative Examples 15 and 17 were formed in conformity with the method described in WO2014/202519A1 of the related art.

<Continuous Mat Coated Film>

The continuous mat coated film of Comparative Example 19 was formed by allowing the coating solution, which was the same as the coating solution used for the above-described continuous flat coated film, to contain a techpolymer ARX-30 (manufactured by SEKISUI PLASTICS CO., LTD.) to prepare a particle-containing coating solution and solid-coating the entire rear surface of the belt-like support 12 with this coating solution. The arithmetic average height Sa of the formed mat coated film was 18 μm.

<Test Result 4>

The test results 4 are listed in FIG. 25.

As illustrated in FIG. 25, the "arithmetic average height Sa" and the Bekk second" of the back coat layer of each of the produced planographic printing plate precursors of Examples 35 to 55 and Comparative Example 12 to 19 were measured.

Further, four items of the "scraping and peeling", the "adhesiveness", the "scratches", and the "imparting of the plate-separating property" of Examples 35 to 55 and Comparative Examples 12 to 19 were evaluated according to a five-point full mark method. In a case where all four items were evaluated as 3 or greater, this was set as the passing mark satisfying conditions for eliminating interleaving paper as the comprehensive evaluation.

In addition, the relationship between the "arithmetic average height Sa" and the passing mark of the comprehensive evaluation was investigated and the relationship between "Bekk second" and the passing mark was also investigated.

The methods of measuring the "arithmetic average height Sa" and the "Bekk second" are as follows.

<Arithmetic Average Height Sa>

The arithmetic average height Sa was measured in conformity with the method described in ISO 25178. In other words, the magnification was adjusted so that the field of view included at least thick film portions and thin film portions using a micromap MM3200-M100 (manufactured by Mitsubishi Chemical Systems. Inc.). At this time, ten sites were selected from the same sample and measured, and the average value of the obtained values was set as the arithmetic average height Sa.

<Bekk Smoothness (Bekk Second)>

The Bekk smoothness was measured in conformity with JIS P8119 (1998). The measurement was performed at one tenth the amount of standard air, that is, an air amount of 1 mL using a Bekk smoothness tester (manufactured by KUMAGAI RIKI KOGYO Co., Ltd.). In the table of FIG. 25, in a case where the Bekk second was short, this indicates that the air release property of the contact surfaces of the planographic printing plate precursors vertically adjacent to each other was excellent at the time of forming a laminate by laminating the planographic printing plate precursors and the planographic printing plate precursor were unlikely to be bonded to one another.

Further, the methods of evaluating the "scraping and peeling", the "adhesiveness", the "scratches", and the "imparting of the plate-separating property" are as follows.

<Scraping and Peeling>

After the humidity of the planographic printing plate precursors was adjusted in an environment of 25° at a relative humidity of 60% for 2 hours, the planographic printing plate precursors were punched into a size of 2.5 cm×2.5 cm and attached to a continuous load type scratch resistance strength tester TYPE: 18 (manufactured by SHINTO Scientific Co., Ltd.), the rear surface of the planographic printing plate precursor which had been punched was set to be brought into contact with the surface of the planographic printing plate precursor which has not been punched, and several sites of the planographic printing plate precursor were scratched by applying a load of 0 to 1500 gf. The scratched rear surface was observed visually and using a scanning electron microscope (SEM), and the peeling level of the back coat layer was evaluated based on the following standard. The evaluation was made by performing sensory evaluation with a score of 1 to 5, and a value of 3 or greater was set as a practical level and a value of 2 or less was set as a practically unacceptable level.

5 . . . The peeling of the back coat layer was not found by visual observation or observation using an SEM.

4 . . . Although the peeling was not found by visual observation, but the peeling was confirmed to be slight by observation using an SEM.

3 . . . Although the peeling was not found by visual observation, but the peeling was confirmed by observation using an SEM.

2 . . . Partial peeling was confirmed by visual observation, and the peeling was confirmed by observation using an SEM.

1 . . . The peeling was confirmed to be conspicuous only by visual observation.

<Adhesiveness>

The humidity of 3 sheets of planographic printing plate precursors (10 cm×10 cm) was adjusted in an environment of 25° C. at a relative humidity of 75% for 2 hours, and the planographic printing plate precursors were sequentially stacked in the same direction in a state in which interleaving paper was not interposed between precursors, thereby obtaining a laminate. This laminate was tightly wrapped with kraft paper having an aluminum laminate layer and then allowed to stand still in an environment of 30° C. for 5 days in a state in which a 4 kg load was applied thereto. Thereafter, the planographic printing plate precursors were peeled off, and the state of adhesion between the surface of the planographic printing plate precursor on the polymer layer side and the surface of the back coat layer of the planographic printing plate precursor vertically adjacent to each other at the time of lamination was visually observed. The evaluation was made by performing sensory evaluation with a score of 1 to 5, and a value of 3 or greater was set as a practical level and a value of 2 or less was set as a practically unacceptable level.

5 . . . The precursors were not bonded to each other.

4 . . . The precursors were slightly bonded to each other.

3 . . . The precursors were partially bonded to each other.

2 . . . The precursors were strongly bonded to each other to the extent that the precursors were peeled off from each other by hand in a case where strength was applied thereto.

1 . . . The precursors were extremely and strongly bonded to each other so that the precursors were unlikely to be peeled off from each other by hand.

<Scratches>

After the humidity of the planographic printing plate precursors was adjusted in an environment of 25° at a relative humidity of 60% for 2 hours, the planographic printing plate precursor was punched into a size of 2.5 cm×2.5 cm and attached to a continuous load type scratch resistance strength tester TYPE: 18 (manufactured by SHINTO Scientific Co., Ltd.), the rear surface of the planographic printing plate precursor which had been punched was set to be brought into contact with the surface of the planographic printing plate precursor which has not been punched, and several sites of the planographic printing plate precursor were scratched by applying a load of 0 to 1500 gf. The scratched planographic printing plate precursor was set by Trendsetter 3244 (manufactured by Creo Co., Ltd.) and then image-exposed under conditions of resolution of 2400 dpi, an output of 7 W, an external surface drum rotation speed of 150 rpm, and a plate surface energy of 110 mJ/cm$^2$. The planographic printing plate precursor after image exposure was mounted on an offset rotary printing press (manufactured by TOKYO KIKAI SEISAKUSHO, LTD.), and printing was performed on newsprint paper at a speed of 100,000 sheets/hour using SOIBI KKST-S (red) (manufactured by InkTec Corporation) as printing ink for newspaper and ECO SEVEN N-1 (manufactured by TOYO INK CO., LTD.) as dampening water. In the above-described printing process, 1,000-th printed matter was sampled, the degree of flaws and dirt caused by scratches was visually observed.

Further, steps of image exposure to the planographic printing plate precursor, development, and printing are required for evaluating scratches, and the method of evaluating scratches described above was applied to a case of an untreated plate on which a development step had not been performed. Therefore, in a case of the treated plate on which the development step had been performed, the following development treatment step was performed.

In a case where the polymer layer was a negative type image recording layer, the image-exposed planographic printing plate precursor was subjected to a development treatment under conditions of a development temperature of 30° C. at a transport speed (line speed) of 2 m/min using an automatic developing device LP-1310HII (manufactured by Fujifilm Corporation). A 1:4 water-diluted solution of DH-N (manufactured by Fujifilm Corporation) was used as a developer, a 1:1.4 water-diluted solution of FCT-421 (manufactured by Fujifilm Corporation) was used as a development replenisher, and a 1:1 water-diluted solution of HN-GV (manufactured by Fujifilm Corporation) was used as a finisher.

Further, in a case where the polymer layer was a positive type image recording layer, a developer DT-2 (Fujifilm Corporation) was prepared by being diluted with water at a dilution ratio of 1:8 using an automatic developing device LP-940HII (manufactured by Fujifilm Corporation) and the image-exposed planographic printing plate precursor was subjected to a development treatment at a development temperature of 32° C. for a development time of 12 seconds.

The scratches were evaluated by performing sensory evaluation with a score of 1 to 5, and a value of 3 or greater was set as a practical level and a value of 2 or less was set as a practically unacceptable level.

5: Flaws and dirt were not found.

4: Although flaws and dirt were not confirmed by visual recognition, but flaws and dirt which were able to be confirmed using a 6 magnification loupe were found at one site.

3: Although flaws and dirt were not confirmed by visual recognition, but flaws and dirt which were able to be confirmed using a 6 magnification loupe were found at several sites.

2: Flaws and dirt which were able to be confirmed by visual recognition were found at several sites.

1: Flaws and dirt were found from the entire surface.

<Imparting Plate-Separating Property>

A laminate obtained by stacking 100 sheets of planographic printing plate precursors was set in a CTP plate setter "AMZI setter" (manufactured by NEC Engineering, Ltd.), and an operation of taking out one plate at a time from the uppermost portion of the laminate was continuously performed 100 times. The imparting of the plate-separating property at this time was evaluated based on the following standard. The evaluation was made by performing sensory evaluation with a score of 1 to 5, and a value of 3 or greater was set as a practical level and a value of 2 or less was set as a practically unacceptable level.

5 . . . The percentage of a phenomenon in which the next plate was not raised at the time of lifting up a plate was 100%.

4 . . . The percentage of a phenomenon in which the next plate was raised at the time of lifting up a plate and did not fall quickly was 1% or less with respect to the whole operations.

3 . . . The percentage of a phenomenon in which the next plate was raised at the time of lifting up a plate and was not peeled off by the first operation of separating the plate was 1% or less with respect to the whole operations.

2 . . . The percentage of a phenomenon in which the next plate was raised at the time of lifting up a plate and was not peeled off by the first operation of separating the plate was greater than 1% and 5% or less with respect to the whole operations.

1 . . . The percentage of a phenomenon in which the next plate was raised at the time of lifting up a plate and was not peeled off by the first operation of separating the plate was greater than 5% and 20% or less with respect to the whole operations.

As listed in the table of FIG. 25, Examples 35 to 42 are respectively a test region in which the arithmetic average height Sa of the back coat layer was largely set to be in a range of 0.5 μm to 24.0 μm in each planographic printing plate precursor which includes a polymer layer for an untreated plate on the surface of the support and includes a back coat layer of an epoxy resin with a surface roughness structure of a stripe coated film in which thin film portions and thick film portions are continuously formed on the rear surface of the support.

As understood from the results in Examples 35 to 42, the "scraping and peeling", the "adhesiveness", the "scratches", and the "imparting of the plate-separating property" were evaluated as 5 in most cases. In a case where the arithmetic average height Sa was 0.5 μm, the "adhesiveness" was evaluated as 4 and the "imparting of the plate-separating property" was evaluated as 3. Further, in a case where the arithmetic average height Sa was 8.0 μm, the "scratches" was evaluated as 4. In a case where the arithmetic average height Sa was 24.0 μm, the "scraping and peeling" and the "scratches" were evaluated as 3.

Examples 43 to 45 are respectively a test region in which the arithmetic average height Sa of the back coat layer was largely set to be in a range of 1.5 μm to 6.0 μm in each planographic printing plate precursor which includes a polymer layer for an untreated plate on the surface of the support and includes a back coat layer of a polyvinyl acetal resin with a surface roughness structure of a stripe coated film in which thin film portions and thick film portions are continuously formed on the rear surface of the support.

As understood from the results in Examples 43 to 45, the "scraping and peeling", the "adhesiveness", the "scratches", and the "imparting of the plate-separating property" were evaluated as 5 in most cases. In a case where the arithmetic average height Sa was 1.5 μm, the "adhesiveness" and the "imparting of the plate-separating property" were evaluated as 4. In a case where the arithmetic average height Sa was 6.0 μm, the "scratches" was evaluated as 4.

Examples 46 to 48 are respectively a test region in which the arithmetic average height Sa of the back coat layer was largely set to be in a range of 1.5 μm to 6.0 μm in each planographic printing plate precursor which includes a polymer layer for an untreated plate on the surface of the support and includes a back coat layer of a polyester resin with a surface roughness structure of a stripe coated film in which thin film portions and thick film portions are continuously formed on the rear surface of the support.

As understood from the results in Examples 46 to 48, the "scraping and peeling" was always evaluated as 5, the "adhesiveness" was always evaluated as 3, the "scratches" was always evaluated as 4, and the "imparting of the plate-separating property" was evaluated as 4 in a case where the arithmetic average height Sa was 1.5 μm and evaluated as 5 in a case where the arithmetic average height Sa was 4.5 μm or 6.0 μm.

Example 49 is an example in which the arithmetic average height Sa of the back coat layer was set to 4.5 μm in the planographic printing plate precursor which includes a polymer layer for a negative type image recording layer on the surface of the support and includes a back coat layer of an epoxy resin with a surface roughness structure of a stripe coated film in which thin film portions and thick film portions are continuously formed on the rear surface of the support.

Example 50 is an example in which the arithmetic average height Sa of the back coat layer was set to 4.5 μm in the planographic printing plate precursor which includes a polymer layer for a positive type image recording layer on the surface of the support and includes a back coat layer of an epoxy resin with a surface roughness structure of a stripe coated film in which thin film portions and thick film portions are continuously formed on the rear surface of the support.

Example 51 is an example in which the arithmetic average height Sa of the back coat layer was set to 4.5 μm in the planographic printing plate precursor which includes a polymer layer for a treated key plate on the surface of the support and includes a back coat layer of an epoxy resin with a surface roughness structure of a stripe coated film in which thin film portions and thick film portions are continuously formed on the rear surface of the support.

Example 52 is an example in which the arithmetic average height Sa of the back coat layer was set to 4.5 μm in the planographic printing plate precursor which includes a polymer layer for an untreated key plate on the surface of the support and includes a back coat layer of an epoxy resin with a surface roughness structure of a stripe coated film in which thin film portions and thick film portions are continuously formed on the rear surface of the support.

As understood from the results in Examples 49 to 52, the "scraping and peeling", the "adhesiveness", the "scratches", and the "imparting of the plate-separating property" were always evaluated as 5.

Example 53 is an example in which the arithmetic average height Sa of the back coat layer was set to 5.0 μm in the planographic printing plate precursor which includes a polymer layer for an untreated plate on the surface of the support and includes a back coat layer of an epoxy resin with a surface roughness structure of a dashed line coated film in which thin film portions and thick film portions are continuously formed on the rear surface of the support. As understood from the results in Example 53, the "scraping and peeling", the "adhesiveness", and the "imparting of the plate-separating property" were evaluated as 5 except that the "scratches" was evaluated as 4.

Example 54 is an example in which the arithmetic average height Sa of the back coat layer was set to 5.0 μm in the planographic printing plate precursor which includes a polymer layer for an untreated plate on the surface of the support and includes a back coat layer of an epoxy resin with a surface roughness structure of a dot coated film in which thin film portions and thick film portions are continuously formed on the rear surface of the support. As understood from the results in Example 54, the "scraping and peeling"

and the "scratches" were evaluated as 4, and the "adhesiveness" and the "imparting of the plate-separating property" were evaluated as 5.

Example 55 is an example in which the arithmetic average height Sa of the back coat layer was set to 3.0 μm in the planographic printing plate precursor which includes a polymer layer for an untreated plate on the surface of the support and includes a back coat layer of an acrylic copolymer with a surface roughness structure of an irregular coated film in which thin film portions and thick film portions are continuously formed on the rear surface of the support. As understood from the results in Example 55, the "scraping and peeling", the "scratches", and the "adhesiveness" were evaluated as 4, and the "imparting of the plate-separating property" was evaluated as 5.

As described above, in Examples 35 to 55, the "scraping and peeling", the "adhesiveness", the "scratches", and the "imparting of the plate-separating property" were all evaluated as 3 or greater, and thus elimination of interleaving paper can be achieved.

Meanwhile, in Comparative Example 12, a polymer layer for an untreated plate was provided on the surface of the support and a back coat layer was not formed on the rear surface of the support. The arithmetic average height Sa at this time was 0.2 μm, and this is the surface roughness of the surface of the support. As understood from the results in Comparative Example 12, the "scraping and peeling" was evaluated as 5, the "adhesiveness" was evaluated as 2, and the "scratches" and the "imparting of the plate-separating property" were evaluated as 1, and thus elimination of interleaving paper cannot be achieved as the comprehensive evaluation.

In Comparative Example 13, a polymer layer for an untreated plate was provided on the surface of the support and a flat back coat layer was formed by solid-coating the rear surface of the support with an epoxy resin. The arithmetic average height Sa of the back coat layer at this time was 0.1 μm. As understood from the results in Comparative Example 13, the "scraping and peeling" was evaluated as 5, the "adhesiveness" was evaluated as 1, the "scratches" was evaluated as 4, and the "imparting of the plate-separating property" was evaluated as 1, and thus elimination of interleaving paper cannot be achieved as the comprehensive evaluation.

Comparative Example 14 is an example in which the arithmetic average height Sa of the back coat layer was set to 0.4 μm, which was less than 0.5 μm of the present invention, in the planographic printing plate precursor which includes a polymer layer for an untreated plate on the surface of the support and includes a back coat layer of an epoxy resin with a surface roughness structure of a stripe coated film continuously formed on the rear surface of the support. As understood from the results in Comparative Example 14, the "scraping and peeling" was evaluated as 5, the "adhesiveness" was evaluated as 3, the "scratches" was evaluated as 4, and the "imparting of the plate-separating property" was evaluated as 2. Based on the results, since the arithmetic average height Sa did not satisfy 0.5 μm even in a case of forming the back coat layer of an epoxy resin having a surface roughness structure of a stripe coated film continuously formed on the rear surface of the support, the comprehensive evaluation was evaluated as a failure in terms of elimination of interleaving paper.

Comparative Example 15 is an example in which the arithmetic average height Sa of the back coat layer was set to 4.5 μm in the planographic printing plate precursor which includes a polymer layer for an untreated plate on the surface of the support and includes a back coat layer of a UV curable acrylic resin with a surface roughness structure of a stripe coated film discontinuously formed on the rear surface of the support. In other words, in Comparative Example 15, the rear surface of the support has uncoated portions. As understood from the results in Comparative Example 15, the "scraping and peeling" was evaluated as 2, the "adhesiveness" was evaluated as 5, the "scratches" was evaluated as 1, and the "imparting of the plate-separating property" was evaluated as 5, and thus elimination of interleaving paper cannot be achieved as the comprehensive evaluation.

In Comparative Example 16, a polymer layer for a positive type image recording layer was provided on the surface of the support and a flat back coat layer was formed by solid-coating the rear surface of the support with a polystyrene resin. The arithmetic average height Sa of the back coat layer at this time was 0.3 μm. As understood from the results in Comparative Example 16, the "scraping and peeling" was evaluated as 4, the "adhesiveness" was evaluated as 3, the "scratches" was evaluated as 4, and the "imparting of the plate-separating property" was evaluated as 1, and thus elimination of interleaving paper cannot be achieved as the comprehensive evaluation.

Comparative Example 17 is an example in which the arithmetic average height Sa of the back coat layer was set to 5.0 μm in the planographic printing plate precursor which includes a polymer layer for a positive type image recording layer on the surface of the support and includes a back coat layer of a polystyrene resin with a surface roughness structure of a stripe coated film discontinuously formed on the rear surface of the support. In other words, in Comparative Example 17, the rear surface of the support has uncoated portions. As understood from the results in Comparative Example 17, the "scraping and peeling" was evaluated as 2, the "adhesiveness" was evaluated as 5, the "scratches" was evaluated as 1, and the "imparting of the plate-separating property" was evaluated as 4, and thus elimination of interleaving paper cannot be achieved as the comprehensive evaluation.

As understood from the results in Comparative Examples 13 and 17, in a case where a stripe coated film was discontinuously formed on the rear surface of the support, the "scraping and peeling" and the "scratches" were evaluated to be poor, and thus elimination of interleaving paper cannot be achieved.

In Comparative Example 18, a polymer layer for a negative type image recording layer was provided on the surface of the support and a flat back coat layer was formed by solid-coating the rear surface of the support with a novolak resin. The arithmetic average height Sa of the back coat layer at this time was 0.2 μm. As understood from the results in Comparative Example 18, the "scraping and peeling" was evaluated as 5, the "adhesiveness" was evaluated as 2, the "scratches" was evaluated as 4, and the "imparting of the plate-separating property" was evaluated as 1, and thus elimination of interleaving paper cannot be achieved as the comprehensive evaluation.

In Comparative Example 19, a polymer layer for an untreated plate was provided on the surface of the support and a back coat layer was formed by solid-coating the rear surface of the support with an epoxy resin containing a matting agent. The arithmetic average height Sa of the back coat layer at this time was 18.0 μm. As understood from the results in Comparative Example 19, the "scraping and peeling" was evaluated as 2, the "adhesiveness" was evaluated as 5, the "scratches" was evaluated as 3, and the "imparting of the plate-separating property" was evaluated as 4, and thus elimination of interleaving paper cannot be achieved as the comprehensive evaluation.

As understood from the comparison of Examples 35 to 55 with Comparative Examples 12 to 19, in a case where the arithmetic average height Sa of a back coat layer with a surface roughness structure in which thin film portions and thick film portions were continuously formed was 0.5 μm or greater, the elimination of interleaving paper was able to be achieved as the comprehensive evaluation regardless of the type of the polymer layer, the kind of the resin of the back coat layer, and the shape of the surface roughness structure.

Particularly, the arithmetic average height Sa of a back coat layer with a surface roughness structure in which thin film portions and thick film portions are continuously formed is preferably in a range of 0.5 μm to 24 μm and more preferably in a range of 1.5 μm to 8.0 μm.

Meanwhile, in Comparative Examples 12, 13, 16, and 18 in which the arithmetic average height Sa was less than 0.5 μm due to the flat surface roughness structure of the back coat layer, Comparative Examples 15 and 17 in which the arithmetic average height Sa was 0.5 μm or greater and the surface roughness structure was discontinuous, and Comparative Example 19 in which a matting agent was added, at least one item from among the "scraping and peeling", the "adhesiveness", the "scratches", and the "imparting of the plate-separating property" was evaluated as 3 or less regardless of the type of the polymer layer and the kind of the resin of the back coat layer, and thus elimination of interleaving paper cannot be achieved as the comprehensive evaluation.

As understood from the test results, it is important for the planographic printing plate precursor of the present invention to satisfy two constituent elements, which are the surface roughness structure (constituent element A) in which thin film portions and thick film portions are continuously formed on the rear surface of the belt-like support and the back coat layer having an arithmetic average height Sa of 0.5 μm or greater (constituent element B) due to the surface roughness structure, and it is proved that all items 1) to 4) which are the purposes for elimination of interleaving paper are satisfied by these two constituent elements.

As understood from the table of FIG. 25, the Bekk second became shorter as the arithmetic average height Sa was increased, but it was understood that there was a tendency described below.

In other words, as understood from the comparison of Examples 36, 43, and 46 and the comparison of Examples 44, 47, and 49 to 52, the Bekk second varies in a case where the type of the polymer layer on the surface of the support or the kind of the resin of the back coat layer on the rear surface of the support is changed even though the arithmetic average height Sa is 1.5 μm or 4.5 μm.

The reason for this is assumed that the surface hardness of the polymer layer or the back coat layer varies depending on the type of the polymer layer on the surface of the support or the kind of the resin of the back coat layer on the rear surface of the support and a difference in air release property between contact surfaces is generated at the time of lamination of planographic printing plate precursors so that the surface of the polymer layer and the surface of the back coat layer are brought into contact with each other. In a case where the Bekk second varies, this affects particularly the "adhesiveness" and the "imparting of the plate-separating property".

Based on the comparison of the stripe coated film of Example 39, the dashed line coated film of Example 53, and the dot coated film of Example 54, it was understood that a difference in surface roughness structure does not almost affect the Bekk second in a case where the arithmetic average heights Sa were 5.0 μm and the types of the polymer layer and the kinds of the resin of the back coat layer are the same as one another.

However, the comprehensive evaluation was a pass with no problems in terms of elimination of interleaving paper in a case where the Bekk second is 200 seconds or shorter regardless of the type of the polymer layer, the kind of the resin of the back coat layer, and the surface roughness structure.

Therefore, it is more preferable to add a constituent element in which the Bekk second of the back coat layer is 200 seconds or shorter (constituent element C) to the two constituent elements, which are the surface roughness structure (constituent element A) in which thin film portions and thick film portions are continuously formed on the rear surface of the belt-like support and the back coat layer having an arithmetic average height Sa of 0.5 μm or greater (constituent element B) due to the surface roughness structure in terms of elimination of interleaving paper.

As described above, in a case where the back coat layer 70 whose Bekk second is short is intended to be formed, it is possible to produce a planographic printing plate precursor with an excellent air release property at the time of laminating planographic printing plate precursors by considering the type of the polymer layer and the kind of the resin of the back coat layer.

EXPLANATION OF REFERENCES

10: producing device of planographic printing plate precursor
12: belt-like support
12A: ear portion
14: coater for polymer layer
14A: pocket portion
14B: slit
14C: slide surface
16: dryer for polymer layer
18: coater for stripe coated film
20: dryer for stripe coated film
22: coating solution cooling means
24: bar coater
25: support cooling means
26: upstream side guide roller
27: downstream side guide roller
28: coating bar
29: first cooling means
30: coating head
31: second cooling means
32: pass roller
34: pump
36: pipe
38: backup member
40, 42: coater block
44, 46: manifold
48, 50: slot
52: upstream side coating bead
54: downstream side coating bead
56: depression of groove of coating bar
58: projection of groove of coating bar
60: thin film portion of stripe coated film
62: thick film portion of stripe coated film
62A: horn-like protrusion
64: stripe coated film
66: nozzle
66A: outlet 68: pipe
70: back coat layer
72: dot coated film
74: dashed line coated film

What is claimed is:

1. A planographic printing plate precursor which includes a polymer layer on a surface of a support, comprising:
   a back coat layer having an arithmetic average height Sa of 0.5 μm or greater due to a surface roughness structure in which thin film portions and thick film portions are continuously formed on a rear surface of the support.

2. The planographic printing plate precursor according to claim 1,
   wherein the arithmetic average height Sa of the back coat layer is in a range of 0.5 μm to 24 μm.

3. The planographic printing plate precursor according to claim 1,
   wherein the arithmetic average height Sa of the rear surface of the support is 0.3 μm or less.

4. The planographic printing plate precursor according to claim 1,
   wherein a Bekk smoothness of the back coat layer is 200 seconds or shorter.

5. The planographic printing plate precursor according to claim 1,
   wherein the back coat layer contains at least one non-alkali-soluble resin.

6. The planographic printing plate precursor according to claim 1,
   wherein the surface roughness structure is a stripe coated film in which belt-like thick film portions are arranged on planar thin film portions.

7. The planographic printing plate precursor according to claim 1,
   wherein the surface roughness structure is a dot coated film in which dot-like thick film portions are scattered on planar thin film portions.

8. The planographic printing plate precursor according to claim 1,
   wherein the surface roughness structure is a dashed line coated film in which dashed line thick film portions are arranged on planar thin film portions.

9. The planographic printing plate precursor according to claim 1,
   wherein a width W of the thick film portion is in a range of 0.5 mm to 50 mm.

10. The planographic printing plate precursor according to claim 1,
    wherein a pitch λ between the thick film portions is in a range of 0.5 mm to 50 mm.

11. The planographic printing plate precursor according to claim 10,
    wherein a ratio $Z_t/\lambda$ of a difference $Z_t$ in thickness between the thin film portion and the thick film portion which are adjacent to each other to the pitch λ is 0.10 or less.

12. The planographic printing plate precursor according to claim 11,
    wherein a ratio $Z_t/W$ of the difference $Z_t$ in thickness to the width W of the thick film portion is 0.10 or less.

13. The planographic printing plate precursor according to claim 1,
    wherein the back coat layer contains at least one non-photocurable resin having an average molecular weight of 3000 or less.

14. The planographic printing plate precursor according to claim 1,
    wherein the back coat layer contains at least one selected from the group consisting of a novolak resin such as a phenol formaldehyde resin, an m-cresol formaldehyde resin, a p-cresol formaldehyde resin, an m-/p-mixed cresol formaldehyde resin, or a phenol/cresol (any of m-, p-, and m-/p-mixed)-mixed formaldehyde resin, a resol resin, pyrogallol, an acetone resin, an epoxy resin, a saturated copolymer polyester resin, a phenoxy resin, a polyvinyl acetal resin, a vinylidene chloride copolymer resin, polybutene, polybutadiene, polyamide, an unsaturated copolymer polyester resin, polyurethane, polyurea, polyimide, polysiloxane, polycarbonate, chlorinated polyethylene, an aldehyde condensation resin of alkyl phenol, polyvinyl chloride, polyvinylidene chloride, polystyrene, an acrylic resin copolymer resin, hydroxy cellulose, polyvinyl alcohol, cellulose acetate, and carboxymethyl cellulose.

15. The planographic printing plate precursor according to claim 1,
    wherein the polymer layer is a positive type image recording layer containing an infrared absorbing agent.

16. The planographic printing plate precursor according to claim 1,
    wherein the polymer layer is a negative type image recording layer containing an infrared absorbing agent, a polymerization initiator, or a polymerizable compound.

17. The planographic printing plate precursor according to claim 1,
    wherein the polymer layer is used for a treated key plate formed of a non-photosensitive layer.

18. The planographic printing plate precursor according to claim 1,
    wherein the polymer layer is used for an untreated plate formed of any of a water-soluble layer or a water-dispersible layer.

19. The planographic printing plate precursor according to claim 1,
    wherein the polymer layer is used for an untreated key plate formed of any of a water-soluble layer or a water-dispersible layer.

20. The planographic printing plate precursor according to claim 18,
    wherein the water-dispersible layer contains polymer fine particles.

21. A laminate which is formed by laminating a plurality of planographic printing plate precursors respectively including a polymer layer on a surface of a support and a back coat layer with an arithmetic average height Sa of 0.5 μm or greater due to a surface roughness structure in which thin film portions and thick film portions are continuously formed on a rear surface of the support.

22. A method of producing a planographic printing plate precursor which includes a polymer layer on a surface of a support, the method comprising:
    a coating step of performing coating of a rear surface of the support to form a coated film having a surface roughness structure in which thin film portions and thick film portions are continuously formed; and
    a drying step of drying the coated film to form a back coat layer having an arithmetic average height Sa of 0.5 μm or greater due to the surface roughness structure.

23. The method of producing a planographic printing plate precursor according to claim 22, wherein a difference in thickness between the thin film portion and the thick film portion, which are adjacent to each other in the coating step, is in a range of 1 μm to 50 μm.

24. The method of producing a planographic printing plate precursor according to claim 23,
wherein the coated film is formed by coating the support using any of a bar coating system, an ink jet printing system, a gravure printing system, a screen printing system, and a spray coating system in the coating step.

* * * * *